US012610719B2

(12) United States Patent
Kim et al.

(10) Patent No.: US 12,610,719 B2
(45) Date of Patent: Apr. 21, 2026

(54) DISPLAY DEVICE HAVING ENCAPSULATION LAYER OVERLAYING COLOR FILTER AND MULTIPLE DAMS

(71) Applicant: Samsung Display Co., LTD., Yongin-si (KR)

(72) Inventors: Yu Jin Kim, Hwaseong-si (KR); Kun Hee Jo, Yongin-si (KR); Shin Tack Kang, Yongin-si (KR); Hyun Seok Kim, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 575 days.

(21) Appl. No.: 18/015,710

(22) PCT Filed: Nov. 2, 2020

(86) PCT No.: PCT/KR2020/015148
§ 371 (c)(1),
(2) Date: Jan. 11, 2023

(87) PCT Pub. No.: WO2022/004958
PCT Pub. Date: Jan. 6, 2022

(65) Prior Publication Data
US 2023/0263034 A1 Aug. 17, 2023

(30) Foreign Application Priority Data
Jul. 3, 2020 (KR) ........................ 10-2020-0082244

(51) Int. Cl.
*H10K 59/80* (2023.01)
*H10K 59/122* (2023.01)
*H10K 59/38* (2023.01)

(52) U.S. Cl.
CPC ....... *H10K 59/8731* (2023.02); *H10K 59/122* (2023.02); *H10K 59/38* (2023.02); *H10K 59/871* (2023.02)

(58) Field of Classification Search
CPC ....... H01L 23/5226; G02B 5/20; G02B 5/201; G02F 1/1335; H01J 1/62; H05B 33/00;
(Continued)

(56) References Cited

U.S. PATENT DOCUMENTS

| | | | |
|---|---|---|---|
| 8,558,453 B2 | 10/2013 | Sakakura et al. | |
| 8,981,638 B2 | 3/2015 | Isa | |

(Continued)

FOREIGN PATENT DOCUMENTS

| | | |
|---|---|---|
| CN | 105742322 A | 7/2016 |
| CN | 109904190 A | 6/2019 |

(Continued)

OTHER PUBLICATIONS

International Search Report mailed Mar. 30, 2021 for PCT/KR2020/015148.

*Primary Examiner* — Wael M Fahny
*Assistant Examiner* — Alice W Tang
(74) *Attorney, Agent, or Firm* — CANTOR COLBURN LLP

(57) ABSTRACT

A display device includes: a first dam member, a first support member, a second dam member, and a second support member, which are in a non-display area; a light-emitting element in a display area; a first encapsulation layer on the light-emitting element; a wavelength conversion pattern on the first encapsulation layer to overlap the light-emitting element; a color filter on the wavelength conversion pattern and overlapping the wavelength conversion pattern; and a second encapsulation layer on the color filter. The display area, the first dam member, the first support member, the (Continued)

second dam member, the second support member are disposed in this order; an end of an inorganic layer included in the first encapsulation layer is between the first support member and the first dam member; and an end of an inorganic layer included in the second encapsulation layer is between the second support member and the second dam member.

20 Claims, 31 Drawing Sheets

(58) Field of Classification Search
CPC ............. H10K 59/8731; H10K 59/131; H10K 59/871; H10K 59/122; H10K 59/38
See application file for complete search history.

(56) References Cited

U.S. PATENT DOCUMENTS

| | | | | |
|---|---|---|---|---|
| 10,347,866 | B1 * | 7/2019 | Kim | ..................... H01L 51/5246 |
| 10,454,063 | B2 | 10/2019 | Chang et al. | |
| 10,705,271 | B2 | 7/2020 | Kim et al. | |
| 10,862,071 | B2 | 12/2020 | Chang et al. | |
| 10,903,294 | B2 | 1/2021 | Bang et al. | |
| 11,016,328 | B2 | 5/2021 | Kim et al. | |
| 11,038,142 | B2 | 6/2021 | Park et al. | |
| 11,393,880 | B2 | 7/2022 | Jang et al. | |
| 11,411,202 | B2 | 8/2022 | Chang et al. | |
| 11,600,676 | B2 | 3/2023 | Bang et al. | |
| 2016/0307971 | A1 * | 10/2016 | Jeon | ..................... H01L 27/3225 |
| 2018/0108867 | A1 * | 4/2018 | Lee et al. | |
| 2018/0156951 | A1 * | 6/2018 | Baek et al. | ............ G02B 5/201 |
| 2019/0273179 | A1 * | 9/2019 | Iguchi et al. | ........... H01L 33/10 |
| 2020/0152705 | A1 * | 5/2020 | Son et al. | ............ H01L 27/322 |
| 2020/0194714 | A1 * | 6/2020 | Won et al. | .......... H01L 51/5237 |

FOREIGN PATENT DOCUMENTS

| | | | | |
|---|---|---|---|---|
| CN | 110021633 A | 7/2019 | | |
| CN | 111180605 A | 5/2020 | | |
| CN | 111198455 A | 5/2020 | | |
| CN | 111224012 A | 6/2020 | | |
| KR | 1020180018969 A | 2/2018 | | |
| KR | 1020200036130 A | 4/2020 | | |
| KR | 10-2020-0048685 | * 5/2020 | ......... H01L 51/5237 | |
| KR | 1020200047947 A | 5/2020 | | |
| KR | 1020200059369 A | 5/2020 | | |
| KR | 1020200062445 A | 6/2020 | | |
| KR | 1020200071168 A | 6/2020 | | |
| WO | WO 2018/229991 | * 12/2018 | .............. G09F 9/30 | |
| WO | 2020085606 A1 | 4/2020 | | |

* cited by examiner

DISPLAY DEVICE HAVING ENCAPSULATION LAYER OVERLAYING COLOR FILTER AND MULTIPLE DAMS

TECHNICAL FIELD

The present disclosure relates to a display device.

BACKGROUND ART

The importance of display devices has gradually increased with the development of multimedia. Accordingly, various display devices such as a liquid crystal display device ("LCD") and an organic light emitting diode display device ("OLED") have been developed.

Among these display devices, a self-light emitting display device includes self-light emitting elements, for example, organic light emitting elements. The self-light emitting element may include two electrodes opposing each other and an emission layer interposed between the two electrodes. When the self-light emitting element is an organic light emitting element, electrons and holes provided from the two electrodes are recombined with each other in the emission layer to generate excitons, and light may be emitted while the generated excitons change from an excited state to a ground state.

Since the self-light emitting display device does not require a light source such as a backlight unit, it has low power consumption, may be configured to be lightweight and thin, and has high quality characteristics such as a wide viewing angle, high luminance and contrast, and a fast response speed. Therefore, the self-light emitting display device has attracted attention as the next-generation display device.

DISCLOSURE

Technical Problem

As one method for allowing each pixel of a display device to uniquely display one primary color, there may be a method of disposing a color conversion pattern or a wavelength conversion pattern for each pixel on an optical path from a light source to a viewer.

Technical Solution

Aspects of the present disclosure provide a display device whose display quality may be improved.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, there is provided a display device including: a base part in which a display area and a non-display area around the display area are defined; a first dam member, a first support member, a second dam member, and a second support member positioned on the base part and positioned in the non-display area; a light emitting element positioned on the base part and positioned in the display area; a first encapsulation layer positioned on the light emitting element; a wavelength conversion pattern positioned on the first encapsulation layer and overlapping the light emitting element; a color filter positioned on the wavelength conversion pattern and overlapping the wavelength conversion pattern; and a second encapsulation layer positioned on the color filter, where the first dam member is positioned between the first support member and the display area, the first support member is positioned between the second dam member and the first dam member, the second dam member is positioned between the second support member and the first support member, a first end of an inorganic layer included in the first encapsulation layer is positioned between the first support member and the first dam member, and a second end of an inorganic layer included in the second encapsulation layer is positioned between the second support member and the second dam member.

In some embodiments, the first dam member may be disposed to surround the display area, the first support member may be disposed to surround the first dam member, the second dam member may be disposed to surround the first support member, and the second support member may be disposed to surround the second dam member.

In some embodiments, the second encapsulation layer may include a lower inorganic layer positioned on the color filter, an organic layer positioned on the lower inorganic layer, and an upper inorganic layer positioned on the organic layer, and the second end may include an end of the lower inorganic layer and an end of the upper inorganic layer, which are positioned between the second support member and the second dam member.

In some embodiments, a portion of the organic layer may be positioned between the second dam member and the first dam member.

In some embodiments, the display device may further include a bank pattern positioned on the first encapsulation layer and surrounding the wavelength conversion pattern, where at least one of the second support member and the second dam member may include the same material as the bank pattern.

In some embodiments, the display device may further include an overcoat layer positioned between the color filter and the wavelength conversion pattern, where the second support member may include the same material as the color filter or the overcoat layer.

In some embodiments, the display device may further include a bank pattern positioned on the first encapsulation layer and surrounding the wavelength conversion pattern, where the second dam member may include the same material as at least one of the color filter, the overcoat layer, and the bank pattern.

In some embodiments, the first encapsulation layer may include a lower inorganic layer positioned on the light emitting element, an organic layer positioned on the lower inorganic layer, and an upper inorganic layer positioned on the organic layer, the lower inorganic layer and the upper inorganic layer may cover the first dam member, and the first end may include an end of the lower inorganic layer, which is positioned between the first dam member and the first support member.

In some embodiments, the first dam member may include a first dam and a second dam spaced apart from each other, and a portion of the organic layer may be positioned between the first dam and the second dam.

In some embodiments, the first end may further include an end of the upper inorganic layer, which is positioned between the first dam member and the first support member.

In some embodiments, an end of the upper inorganic layer may be positioned outside the second support member, and the second support member may be positioned between the end of the upper inorganic layer and the display area.

In some embodiments, the display device may further include a connection pad positioned on the base part and positioned in the non-display area, where the second support member may be positioned between the connection pad and the display area, and the connection pad may not overlap the second encapsulation layer in a plan view.

In some embodiments, the display device may further include: a first capping layer positioned between the first encapsulation layer and the wavelength conversion pattern; and a second capping layer positioned between the wavelength conversion pattern and the color filter, where the first capping layer and the second capping layer may be in contact with each other in the non-display area, and the first capping layer and the second capping layer may overlap the connection pad.

In some embodiments, the display device may further include a capping layer positioned between the wavelength conversion pattern and the color filter, where the first encapsulation layer may include an inorganic layer, the inorganic layer and the capping layer may be in contact with each other in the non-display area, and the inorganic layer and the capping layer may overlap the connection pad.

According to another aspect of the present disclosure, there is provided a display device including: a base part in which a display area and a non-display area around the display area are defined; a dam member and a support member positioned on the base part and positioned in the non-display area; a connection pad positioned on the base part and positioned in the non-display area; a light emitting element positioned on the base part and positioned in the display area; an inorganic layer positioned on the light emitting element; a wavelength conversion pattern positioned on the inorganic layer and overlapping the light emitting element; a capping layer positioned on the wavelength conversion pattern; and a color filter positioned on the capping layer and overlapping the wavelength conversion pattern, where the dam member is positioned between the support member and the display area, the support member is positioned between the connection pad and the dam member, the inorganic layer and the capping layer are in contact with each other in the non-display area, and the inorganic layer and the capping layer overlap the connection pad.

In some other embodiments, an opening exposing the connection pad may be defined in the inorganic layer and the capping layer.

In some other embodiments, the display device may further include a bank pattern positioned between the inorganic layer and the capping layer and in contact with the wavelength conversion pattern, where the dam member and the bank pattern may include the same material.

In some other embodiments, the display device may further include an overcoat layer positioned between the color filter and the wavelength conversion pattern, where the support member may include the same material as at least one of the bank pattern, the color filter, and the overcoat layer.

In some other embodiments, a refractive index of the overcoat layer may be lower than a refractive index of the wavelength conversion pattern.

In some other embodiments, the display device may further include an encapsulation layer positioned on the color filter and including a lower inorganic layer, an upper inorganic layer, and an organic layer positioned between the lower inorganic layer and the upper inorganic layer, where the dam member may overlap the lower inorganic layer and the upper inorganic layer, and the connection pad and the support member may not overlap the lower inorganic layer and the upper inorganic layer in a plan view.

Detailed contents of other embodiments are described in a detailed description and are illustrated in the drawings.

Advantageous Effects

According to embodiments of the present disclosure, a display device whose display quality is improved and reliability is improved may be provided.

The effects of the present disclosure are not limited to the aforementioned effects, and various other effects are included in the present specification.

DESCRIPTION OF DRAWINGS

FIG. 3 is a plan view illustrating a modified example of FIG. 2;

FIGS. 12 to 14 are views for describing a process of manufacturing a first encapsulation layer illustrated in FIG. 11, respectively;

FIGS. 15 to 17 are views for describing a process of manufacturing a second encapsulation layer illustrated in FIG. 11, respectively;

MODE FOR INVENTION

Figure 1:
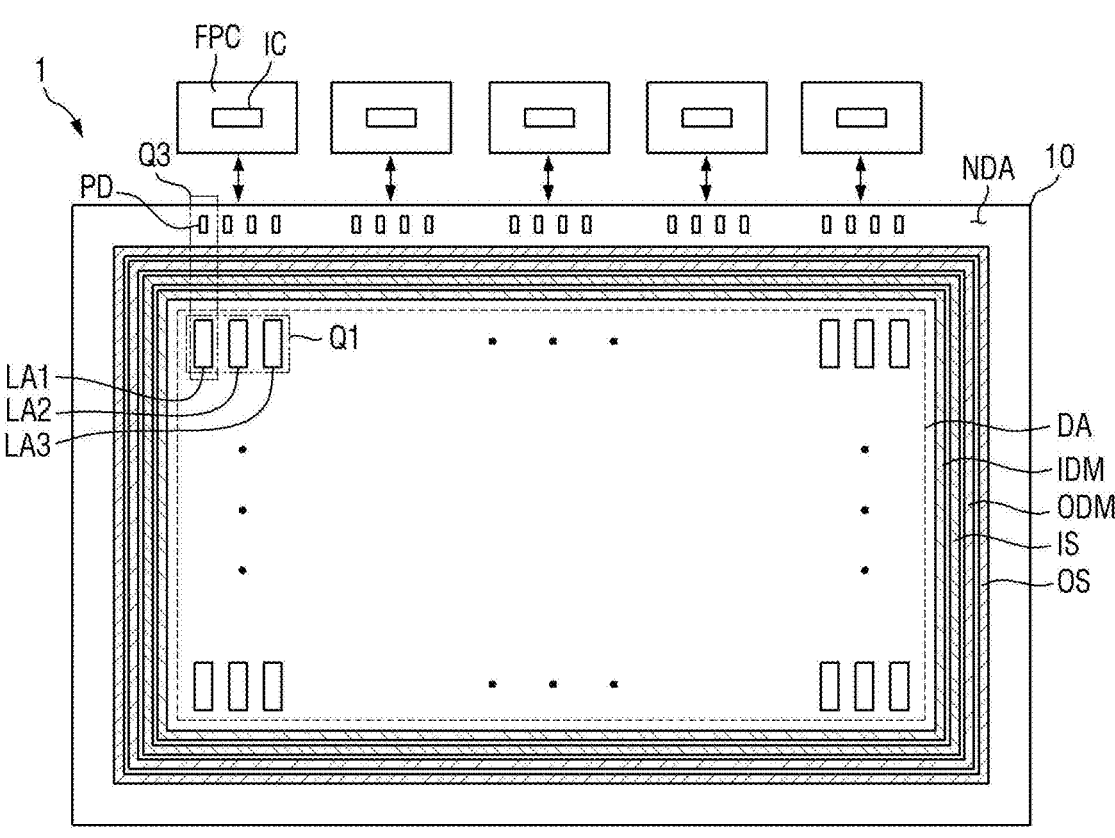
FIG. 1 is a schematic plan view of a display device according to an embodiment.
Figure 1:
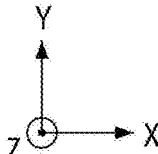

Advantages and features of the present disclosure and methods for accomplishing these advantages and features will become apparent from embodiments to be described later in detail with reference to the accompanying drawings. However, the present disclosure is not limited to embodiments disclosed below, and may be implemented in various different forms, these embodiments will be provided only in order to make the present disclosure complete and allow one of ordinary skill in the art to which the present disclosure pertains to completely recognize the scope of the present disclosure, and the present disclosure will be defined by the scope of the claims.

A phrase "one element or layer 'on' another element or layer" includes both of a case where one element or layer is directly on another element or layer and a case where one element or layer is on another element or layer with the other layer or element interposed therebetween. On the other hand, a phrase "one element or layer is 'directly on' another element or layer" indicates that the other element or layer is not interposed between one element or layer and another element or layer. Throughout the specification, the same components will be denoted by the same reference numerals.

The spatially relative terms 'below', 'beneath', 'lower', 'above', 'upper', and the like, may b be used in order to easily describe correlations between one element or component and other elements or components as illustrated in the drawings. The spatially relative terms are to be understood as terms including different directions of elements at the time of being used in addition to directions illustrated in the drawings. For example, when elements illustrated in the drawings are overturned, an element described as 'below or beneath' another element may be put 'above' another element. Accordingly, a term 'below'" may include both of directions of below and above.

The terms 'first', 'second', 'third', 'fourth', and the like, are used to describe various components, but these components are not limited by these terms. These terms are used only in order to distinguish one component from other components. Accordingly, a first component to be mentioned below may be any one of a second element, a third component, and a fourth component within the technical spirit of the present disclosure.

Embodiments described herein will be described with reference to plan views and cross-sectional views, which are ideal schematic views of the present disclosure. Accordingly, forms of the illustrative drawings may be changed due to manufacturing technology, tolerance, and the like. Accordingly, embodiments of the present disclosure are not limited to specific forms illustrated in the drawings, and also include changes in forms generated according to manufacturing processes. Accordingly, areas illustrated in the drawings have schematic attributes, and shapes of the areas illustrated in the drawings are intended to illustrate specific forms of areas of elements and are not intended to limit the scope of the disclosure.

Hereinafter, embodiments of the present disclosure will be described with reference to the accompanying drawings.

Figure 2:
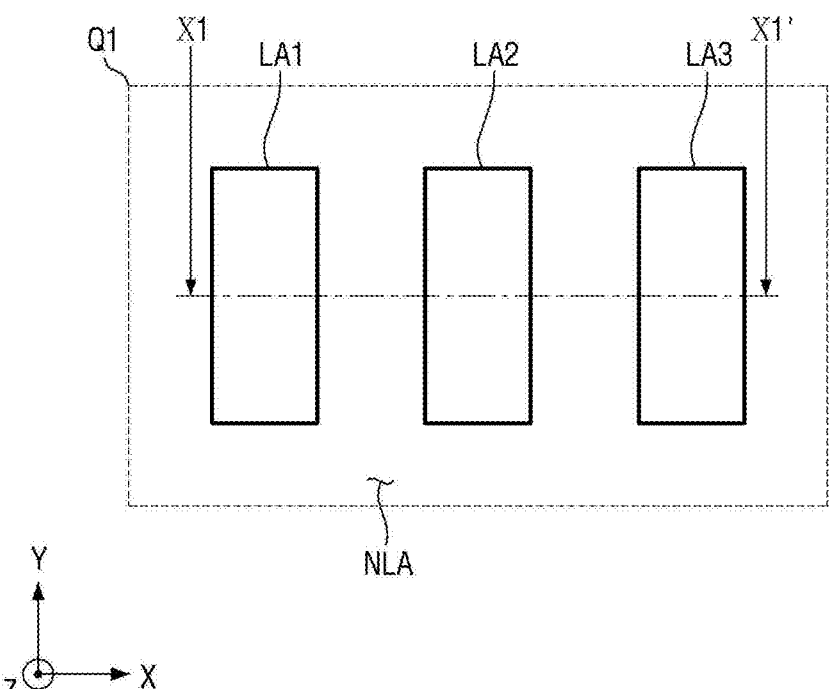
FIG. 2 is an enlarged plan view of portion Q1 of FIG. 1.
Figure 3:
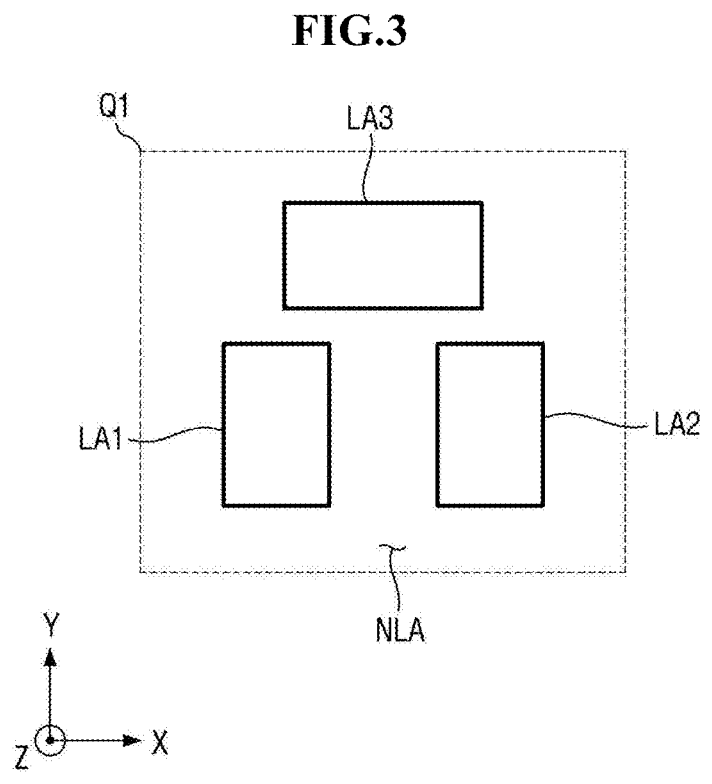

FIG. 1 is a schematic plan view of a display device according to an embodiment, FIG. 2 is an enlarged plan view of portion Q1 of FIG. 1, and FIG. 3 is a plan view illustrating a modified example of FIG. 2.

Referring to FIGS. 1 to 3, a display device 1 may be applied to various electronic devices, for example, small and medium electronic devices such as tablet personal computers ("PCs"), smartphones, vehicle navigation units, cameras, center information displays ("CIDs") provided in vehicles, wrist watch-type electronic devices, personal digital assistants ("PDAs"), portable multimedia players ("PMPs"), and game machines, and medium and large electronic devices such as televisions, external billboards, monitors, personal computers, and laptop computers. These electronic devices are provided only as an example, and the display device 1 may also be adopted in other electronic devices without departing from the concept of the present disclosure.

The display device 1 may include a display panel 10. In some embodiments, the display device 1 may further include flexible circuit boards FPC and driving chips IC.

The display panel 10 may have a rectangular shape in a plan view. The display panel 10 may include two first sides extending in a first direction X and two second sides extending in a second direction Y crossing the first direction X. A corner where the first side and the second side of the display device 1 meet may be right-angled, but is not limited thereto, and may also be curved in another embodiment. In some embodiments, a length of the first side and a length of the second side may be different from each other, but the present disclosure is not limited thereto. The shape of the display panel 10 in a plan view is not limited to the illustrated shape, and may also be a circular shape or other shape in another embodiment.

Unless otherwise defined, the terms "on", "upper side", "upper portion", "top, and "upper surface" as used herein refer to a direction toward which an arrow of a third direction Z crossing the first direction X and the second direction Y is directed in the drawings, and the terms "below", "lower side", "lower portion", "bottom, and "lower surface" used as herein refer to an opposite direction to the direction toward which the arrow of the third direction Z is directed in the drawings.

The display panel 10 may include a display area DA that displays an image and a non-display area NDA that does not display an image.

A plurality of emission areas and a non-emission area NLA may be defined in the display area DA of the display panel 10. In some embodiments, a first emission area LA1, a second emission area LA2, and a third emission area LA3 may be defined in the display area DA of the display panel 10. The first emission area LA1, the second emission area LA2, and the third emission area LA3 may be areas in which light generated by light emitting elements of the display panel 10 is emitted to the outside of the display panel 10, and the non-emission area NLA may be an area in which the light is not emitted to the outside of the display panel 10.

In some embodiments, light emitted to the outside from the first emission area LA1, the second emission area LA2, and the third emission area LA3 may have different colors. For example, light emitted from the first emission area LA1 to the outside may be light of a first color, light emitted from the second emission area LA2 may be light of a second color, light emitted from the third emission area LA3 may be light of a third color, and the light of the first color, the light of the second color, and the light of the third color may have different colors.

In some embodiments, the light of the third color may be blue light having a peak wavelength in the range of 440 nm to about 480 nm, and the light of the first color may be red light having a peak wavelength in the range of 610 nm to 650 nm. In addition, the light of the second color may be green light having a peak wavelength in the range of 530 nm to 570 nm. However, the present disclosure is not limited thereto, and the light of the first color may be green light and the light of the second color may be red light in another embodiment.

In some embodiments, the first emission area LA1, the second emission area LA2, and the third emission area LA3 may form a group, and a plurality of groups may be defined in the display area DA.

In some embodiments, elements and circuits for display-ing an image, for example, pixel circuits such as switching elements, may be disposed in the display area DA of the display panel 10, and a pixel defining layer defining the first emission area LA1, the second emission area LA2, the third emission area LA3, and the non-emission area NLA described above and self-light emitting elements may be included in the display area DA. In an embodiment, the self-light emitting element may include at least one of an organic light emitting diode, a quantum dot light emitting diode, an inorganic material-based micro light emitting diode (e.g., a micro LED), and an inorganic material-based nano light emitting diode (e.g., a nano LED). Hereinafter, for convenience of explanation, a case where the self-light emitting element is an organic light emitting diode will be described by way of example.

In some embodiments, as illustrated in FIG. 2, the first emission area LA1, the second emission area LA2, and the third emission area LA3 may be sequentially positioned along the first direction X. In some embodiments, in the display area DA, the first emission areas LA1, the second emission areas LA2, and the third emission areas LA3 may form a group and may be repeatedly arranged along the first direction X and the second direction Y.

However, the present disclosure is not limited thereto, and an arrangement of the first emission area LA1, the second emission area LA2, and the third emission area LA3 may be variously changed. For example, as illustrated in FIG. 3, the first emission area LA1 and the second emission area LA2 may neighbor to each other along the first direction X, and the third emission area LA3 may be positioned on one side of the first emission area LA1 and the second emission area LA2 along the second direction Y.

Hereinafter, a case where the first emission area LA1, the second emission area LA2, and the third emission area LA3 are arranged as illustrated in FIG. 2 will be described as an example.

In some embodiments, the non-display area NDA of the display panel 10 may be positioned around the display area DA, and may surround the display area DA.

A dam member and a support member may be disposed in the non-display area NDA of the display panel 10.

The dam member may block an organic material (or a monomer) from overflowing in a process of forming an encapsulation layer disposed in the display area DA, and accordingly, may prevent the organic material of the encap-sulation layer from extending toward an edge of the display panel 10.

In some embodiments, the dam member may include a first dam member IDM and a second dam member ODM.

Both the first dam member IDM and the second dam member ODM may be positioned in the non-display area NDA of the display panel 10, and the first dam member IDM may be positioned relatively more adjacent to the display area DA than the second dam member ODM is.

In some embodiments, the first dam member IDM may be disposed to completely surround the display area DA in a plan view, and the second dam member ODM may be disposed to completely surround the display area DA and the first dam member IDM in a plan view.

The support member may serve to support structures of the display panel 10, for example, a mask in the process of forming the encapsulation layer.

In some embodiments, the support member may include a first support member IS and a second support member OS.

Both the first support member IS and the second support member OS may be positioned in the non-display area NDA of the display panel 10, and the first support member IS may be positioned relatively more adjacent to the display area DA than the second support member OS is.

In some embodiments, the first support member IS may be positioned between the first dam member IDM and the second dam member ODM in a plan view, and may be disposed to completely surround the display area DA and the first dam member IDM.

In some embodiments, the first support member IS may be positioned on an opposite side to the first dam member IDM with the second dam member ODM interposed therebetween in a plan view, and may be disposed to completely surround the second dam member ODM, the first support member IS, the first dam member IDM, and the display area DA.

A plurality of connection pads PD may be positioned in the non-display area NDA of the display panel 10. The connection pads PD may be electrically connected to pixel circuits positioned in the display area DA via connection lines or the like.

In some embodiments, the connection pads PD may be positioned outside the second support member OS. That is, the connection pads PD may be positioned relatively farther from the display area DA than the second support member OS is, and the second support member OS may be posi-tioned between the connection pads PD and the display area DA.

The flexible circuit boards FPC may be connected to the connection pads PD of the display panel 10. The flexible circuit boards FPC may electrically connect a circuit board or the like providing signals and power for driving the display device 1 and the display panel 10 to each other.

The driving chips IC may be electrically connected to the circuit board or the like to receive data, signals, or the like. In some embodiments, the driving chip IC may be a data driving chip, and may receive a data control signal, image data, or the like, from the circuit board or the like and generate and output a data voltage corresponding to the image data.

In some embodiments, the driving chip IC may be mounted on the flexible circuit board FPC. For example, the driving chip IC may be mounted on the flexible circuit board FPC in the form of a chip on film ("COF").

The data voltage provided from the driving chip IC, the power provided from the circuit board, or the like, may be transferred to the pixel circuit or the like of the display panel 10 via the flexible circuit board FPC and the connection pad PD.

Figure 4:
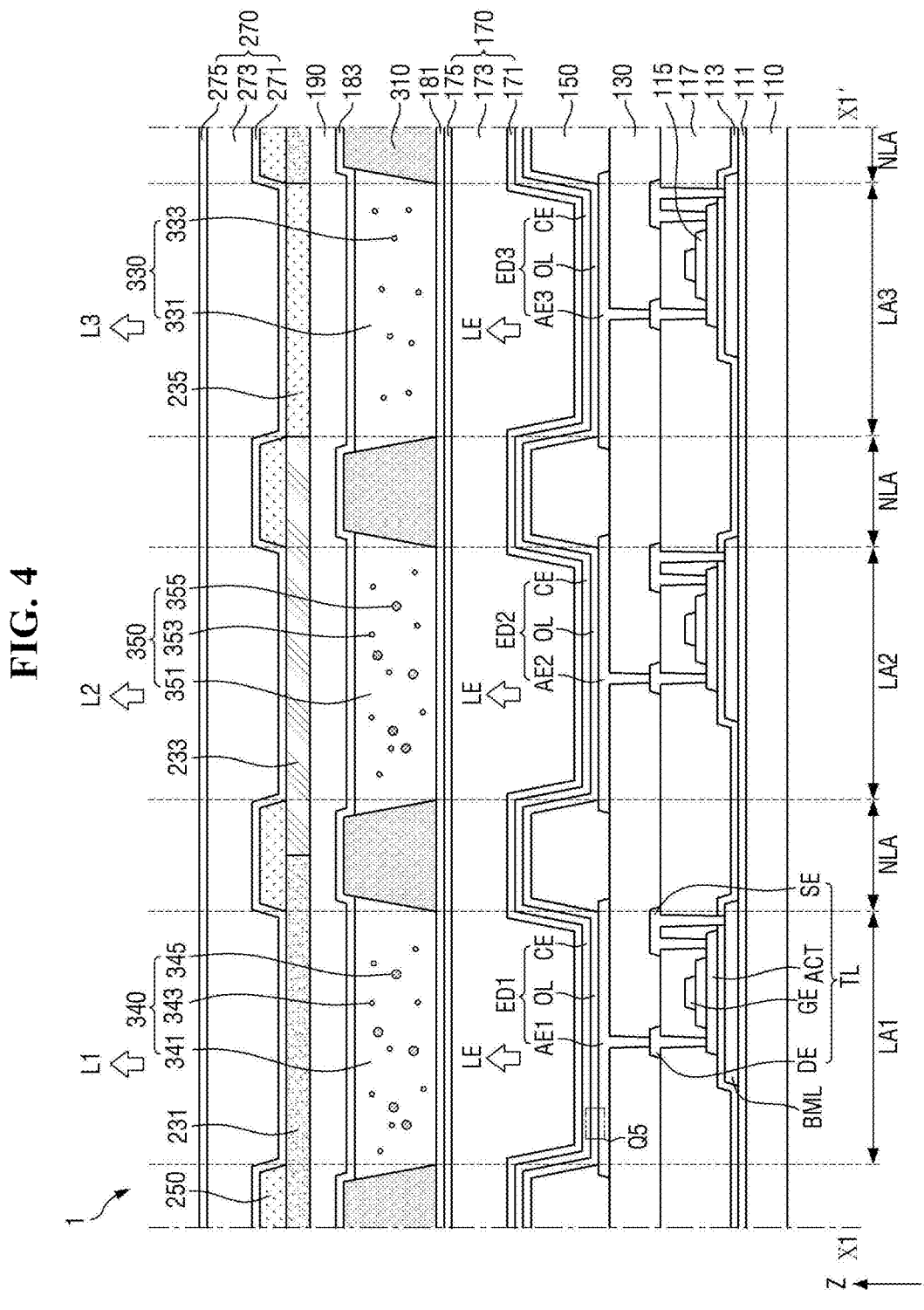
FIG. 4 is a cross-sectional view of the display device according to an embodiment taken along line X1-X1' of FIG. 2.
Figure 5:
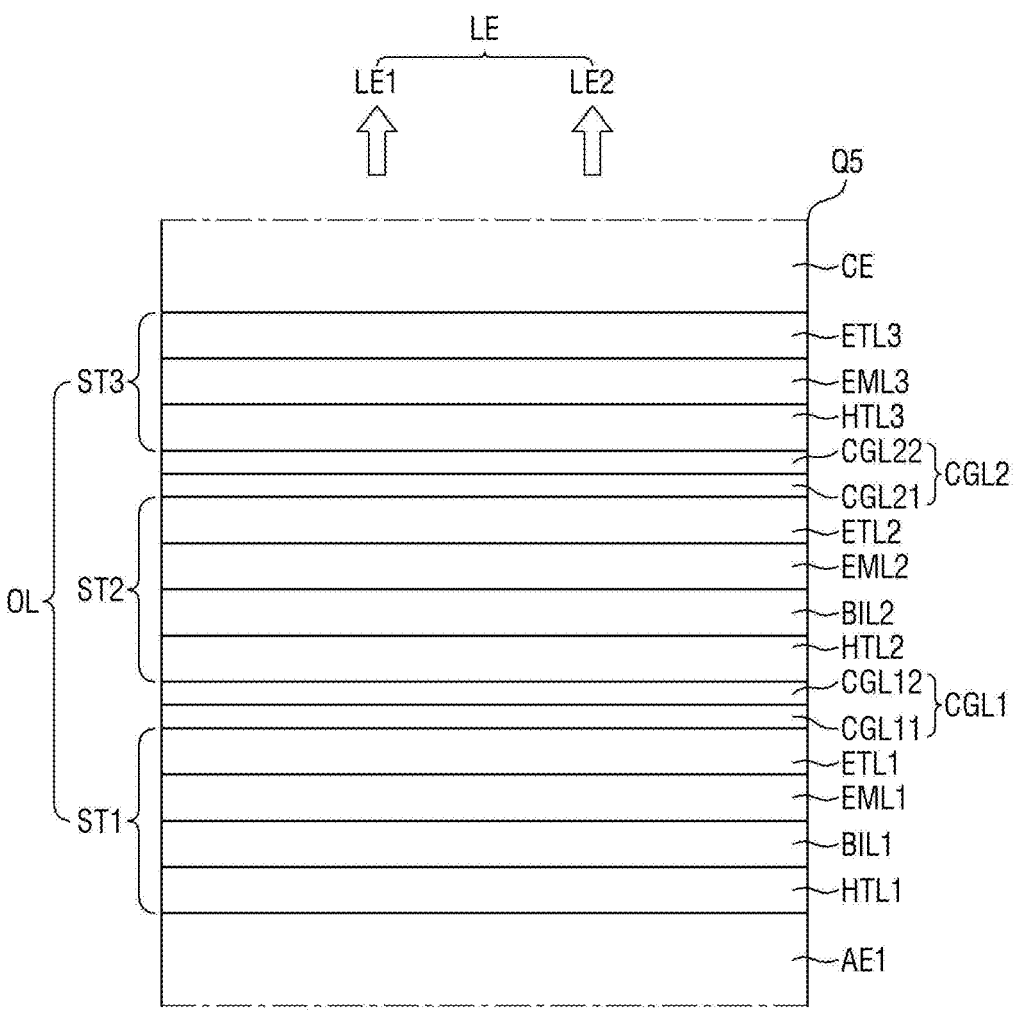
FIG. 5 is an enlarged cross-sectional view of portion Q5 of FIG. 4.
Figure 6:
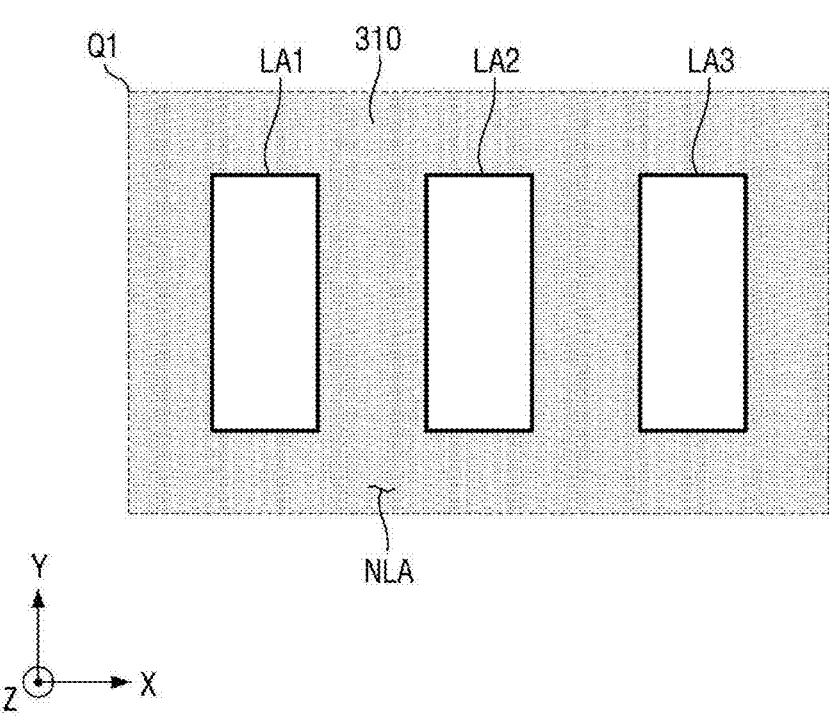
FIG. 6 is a plan view illustrating a schematic arrangement of a partition wall pattern in the display device according to an embodiment.
Figure 7:
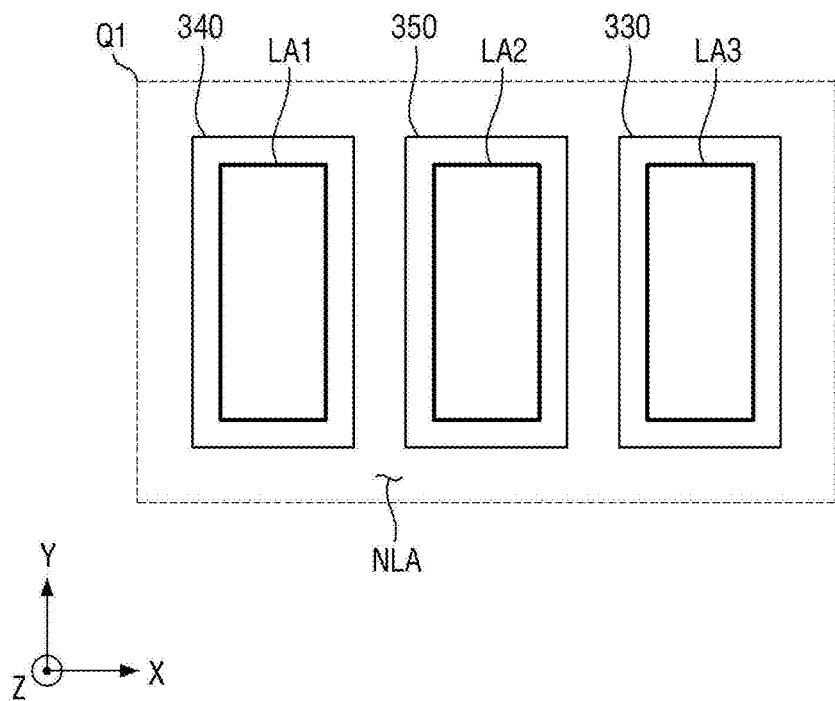
FIG. 7 is a plan view illustrating a schematic arrangement of a wavelength conversion pattern and a light-transmitting pattern in the display device according to an embodiment.
Figure 8:
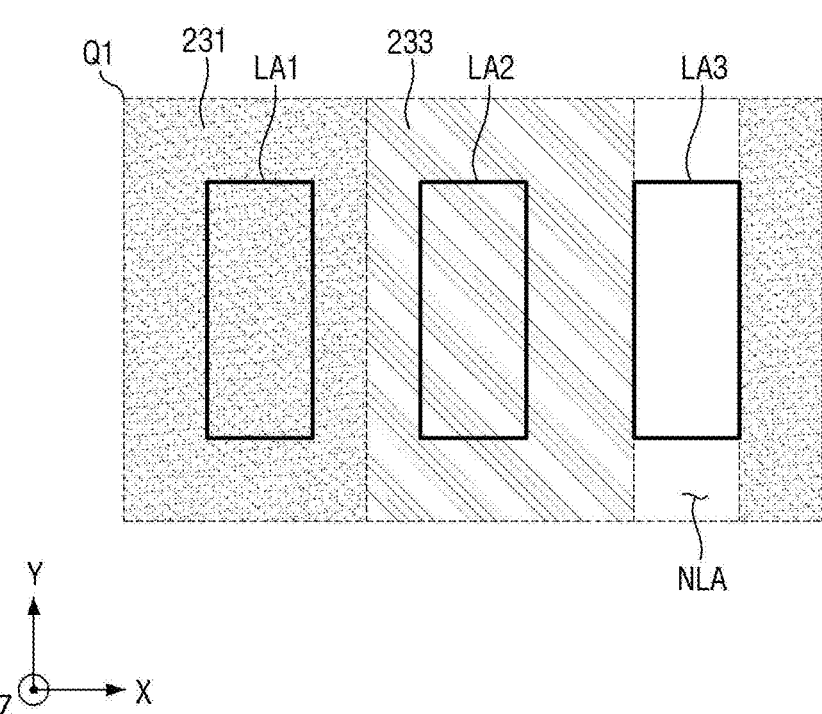
FIG. 8 is a plan view illustrating a schematic arrangement of a first color filter and a second color filter in the display device according to an embodiment.
Figure 9:
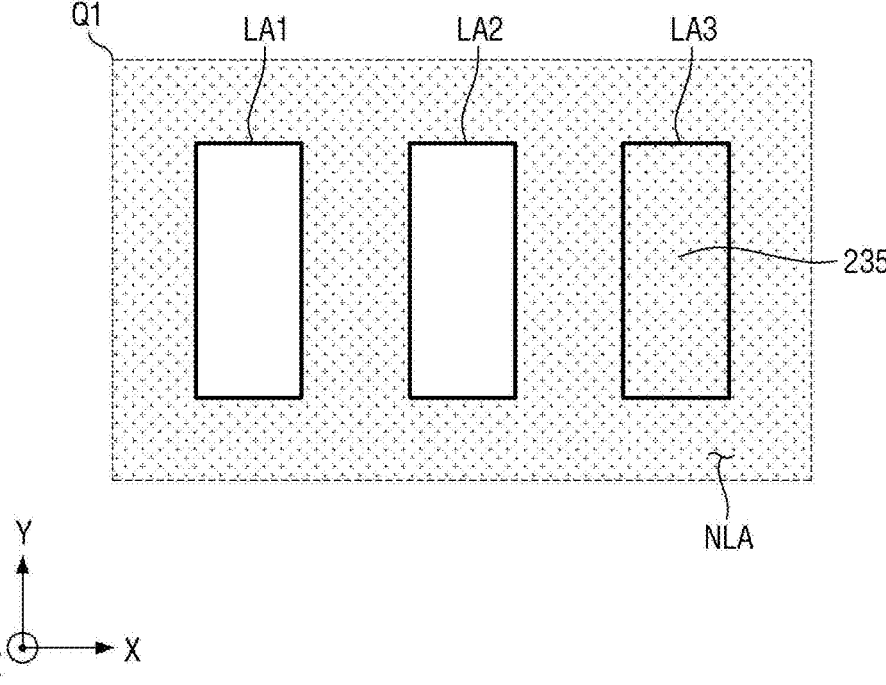
FIG. 9 is a plan view illustrating a schematic arrangement of a third color filter and a color pattern in the display device according to an embodiment.
Figure 10:
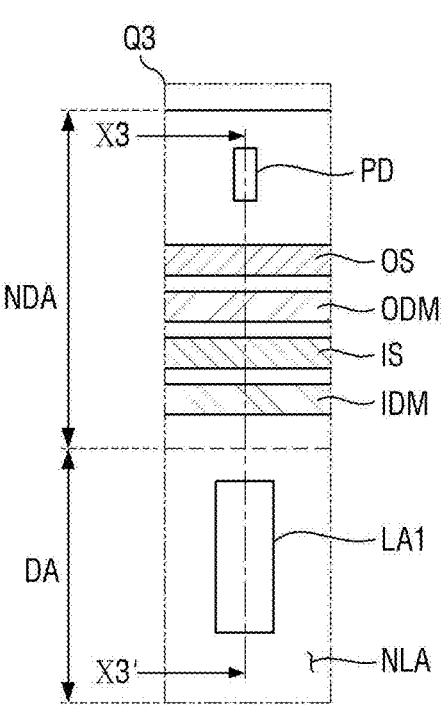
FIG. 10 is an enlarged plan view of portion Q3 of FIG. 1.
Figure 10:
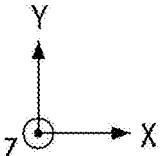
Figure 11:
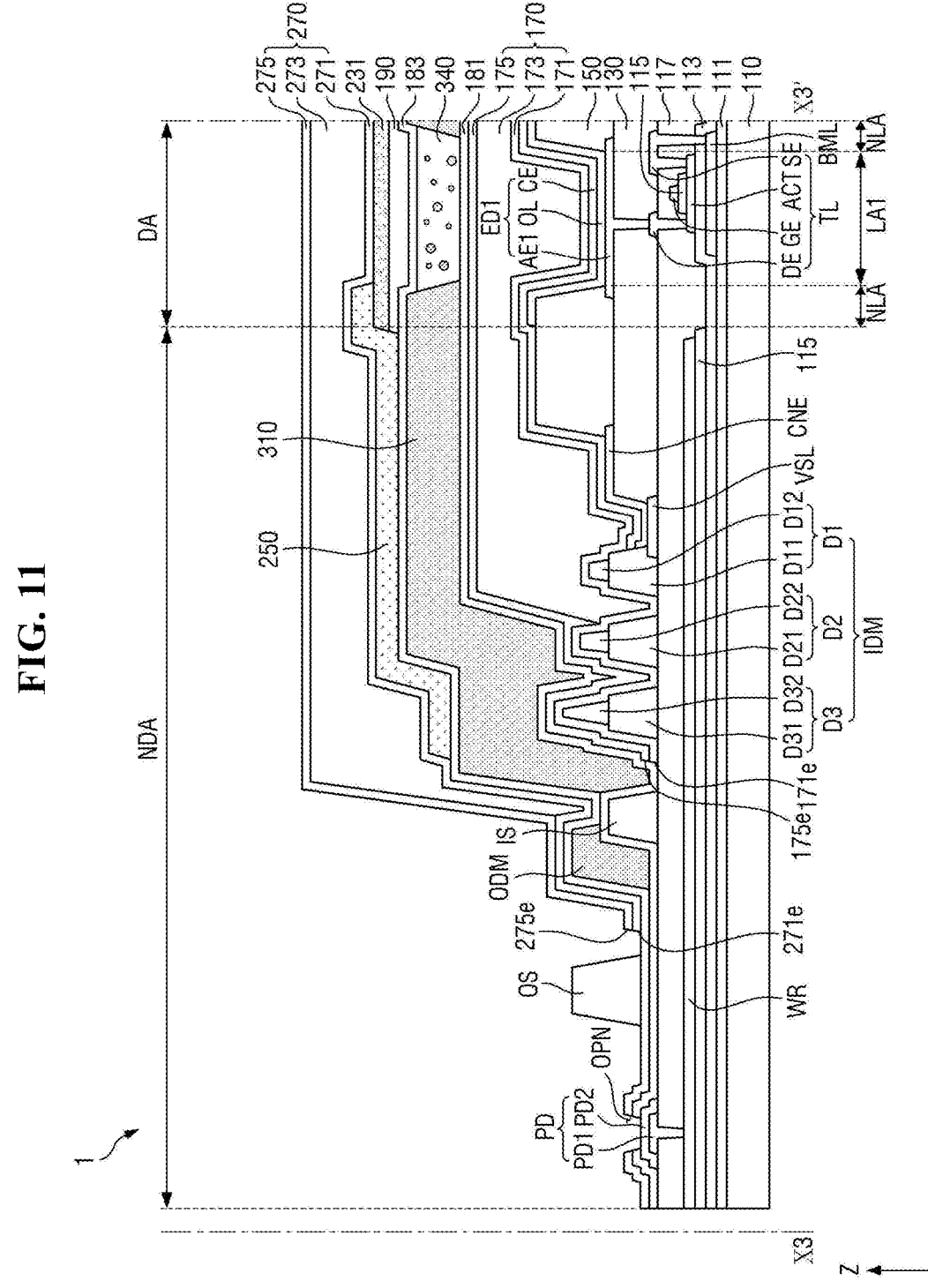
FIG. 11 is a cross-sectional view of the display device taken along line X3-X3' of FIG. 10.

FIG. 4 is a cross-sectional view of the display device according to an embodiment taken along line X1-X1' of FIG. 2, FIG. 5 is an enlarged cross-sectional view of portion Q5 of FIG. 4, FIG. 6 is a plan view illustrating a schematic arrangement of a partition wall in the display device accord-ing to an embodiment, FIG. 7 is a plan view illustrating a schematic arrangement of a wavelength conversion pattern and a light-transmitting pattern in the display device accord-ing to an embodiment, FIG. 8 is a plan view illustrating a schematic arrangement of a first color filter and a second color filter in the display device according to an embodiment, FIG. 9 is a plan view illustrating a schematic arrangement of a third color filter and a color pattern in the display device according to an embodiment, FIG. 10 is an enlarged plan view of portion Q3 of FIG. 1, and FIG. 11 is a cross-sectional view of the display device taken along line X3-X3' of FIG. 10.

Hereinafter, a stacked structure of the display device 1 will be described with reference to FIGS. 4 to 11.

A base part 110 may be made of a light-transmitting material. In some embodiments, the base part 110 may be a glass substrate or a plastic substrate. When the base part 110 is the plastic substrate, the base part 110 may have flexibility.

In some embodiments, as described above, the plurality of emission areas LA1, LA2, and LA3 and the non-emission area NLA may be defined in the base part 110.

A buffer layer 111 may be further positioned on the base part 110. The buffer layer 111 may be disposed on the base part 110 and may be disposed in the display area DA and the non-display area NDA. The buffer layer 111 may block foreign materials or moisture penetrating through the base part 110. For example, the buffer layer 111 may include an inorganic material such as $SiO_2$, $SiN_x$, or SiON, and may be formed as a single layer or multiple layers.

A light blocking pattern BML may be positioned on the buffer layer 111. The light blocking pattern BML may block light and may have conductivity. The light blocking pattern BML may block external light or light of the light emitting elements from being introduced into a semiconductor layer ACT to be described later, and accordingly, may decrease or minimize a leakage current generated by the light in a thin film transistor TL to be described later. It has been illustrated in the drawings that the light blocking pattern BML is positioned in the display area DA and is not positioned in the non-display area NDA, but the light blocking pattern BML may also be positioned in the non-display area NDA.

In some embodiments, the light blocking pattern BML may be made of a material blocking light and having conductivity, and may have a single-layer or multilayer structure. For example, the light blocking pattern BML may be a stacked structure of titanium (Ti)/copper (Cu)/indium tin oxide ("ITO") or a stacked structure of titanium (Ti)/copper (Cu)/aluminum oxide ($Al_2O_3$), but is not limited thereto.

In some embodiments, a plurality of light blocking patterns BML may be provided to correspond to respective semiconductor layers ACT, and may overlap the semiconductor layers ACT in a plan view. In some embodiments, a width of the light blocking pattern BML may be greater than a width of the semiconductor layer ACT.

In some embodiments, the light blocking pattern BML may be a portion of a data line, a power supply line, a line electrically connecting a thin film transistor (not illustrated in the drawings) and a thin film transistor TL (illustrated in the drawings) to each other, or the like. In some embodiments, the light blocking pattern BML may be made of a material having a resistance lower than a resistance of a second conductive layer or a source electrode SE and a drain electrode DE included in the second conductive layer.

A first insulating layer 113 may be positioned on the light blocking pattern BML. In some embodiments, the first insulating layer 113 may be positioned in the display area DA and the non-display area NDA. The first insulating layer 113 may cover the light blocking pattern BML. In some embodiments, the first insulating layer 113 may include an inorganic material such as $SiO_2$, $SiN_x$, SiON, $Al_2O_3$, $TiO_2$, $Ta_2O$, $HfO_2$, or $ZrO_2$.

The semiconductor layers ACT may be positioned on the first insulating layer 113. In some embodiments, the semiconductor layers ACT may be disposed to correspond to the first emission area LA1, the second emission area LA2, and the third emission area LA3 in the display area DA, respectively.

In some embodiments, the semiconductor layer ACT may include an oxide semiconductor. For example, the semiconductor layer ACT may be made of Zn oxide, In—Zn oxide, Ga—In—Zn oxide, or the like, which is a Zn oxide-based material, and may be an In—Ga—Zn—O ("IGZO") semiconductor in which a metal such as indium (In) and gallium (Ga) is contained in ZnO. However, the present disclosure is not limited thereto, and the semiconductor layer ACT may include amorphous silicon, polysilicon, or the like in another embodiment.

In some embodiments, the semiconductor layers ACT may be disposed to overlap light blocking patterns BML in a plan view, respectively, and accordingly, generation of photocurrents in the semiconductor layers ACT may be suppressed.

A first conductive layer may be disposed on the semiconductor layers ACT, and may include a gate electrode GE and a wiring layer WR. The gate electrode GE may be positioned in the display area DA, and may be disposed to overlap the semiconductor layer ACT in a plan view. The wiring layer WR may include some of lines electrically connecting the connection pads PD and elements positioned in the display area DA, for example, the thin film transistors TL, the light emitting elements, and the like, to each other.

The gate electrode GE and the wiring layer WR may include one or more of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu) in consideration of adhesion with an adjacent layer, surface flatness of a layer to be stacked, and workability, and the like, and may be formed as a single layer or multiple layers.

In the display area DA, a gate insulating layer 115 may be positioned between the semiconductor layer ACT and the first conductive layer or between the semiconductor layer ACT and the gate electrode GE. In some embodiments, the gate electrode GE and the gate insulating layer 115 may function as a mask masking a channel region of the semiconductor layer ACT, and widths of the gate electrode GE and the gate insulating layer 115 may be smaller than a width of the semiconductor layer ACT.

In some embodiments, the gate insulating layer 115 may be patterned to have substantially the same shape as the shape of the gate electrode GE or the first conductive layer. In some embodiments, a width of the gate insulating layer 115 may be greater than a width of the gate electrode GE or the first conductive layer.

In some embodiments, the gate insulating layer 115 may include an inorganic material. For example, the gate insulating layer 115 may include the inorganic material exemplified in the description of the first insulating layer 113.

In the non-display area NDA, the gate insulating layer 115 may be positioned between the wiring layer WR and the first insulating layer 113.

A second insulating layer 117 covering the semiconductor layer ACT and the gate electrode GE may be positioned on the gate insulating layer 115. The second insulating layer 117 may be positioned in the display area DA and the non-display area NDA. In some embodiments, the second insulating layer 117 may function as a planarization layer providing a flat surface.

In some embodiments, the second insulating layer 117 may include an organic material. For example, the second insulating layer 117 may include at least one of photo acryl ("PAC"), polystylene, polymethyl methacrylate ("PMMA"), polyacrylonitrile ("PAN"), polyamide, polyimide, polyary-lether, a heterocyclic polymer, parylene, a fluorine-based polymer, an epoxy resin, a benzocyclobutene series resin, a siloxane series resin, and a silane resin, but is not limited thereto.

The second conductive layer may be positioned on the second insulating layer 117, and may include the source electrode SE, the drain electrode DE, a power supply line VSL, and a first pad electrode PD1 of the connection pad PD.

The source electrode SE and the drain electrode DE may be positioned in the display area DA, and may be disposed to be spaced apart from each other.

Each of the drain electrode DE and the source electrode SE may penetrate through the second insulating layer 117 to be connected to the semiconductor layer ACT.

In some embodiments, the source electrode SE may penetrate through the first insulating layer 113 and the second insulating layer 117 to be connected to the light blocking pattern BML. When the light blocking pattern BML is a portion of a line transferring a signal, a voltage, or the like, the source electrode SE may be connected to and electrically coupled to the light blocking pattern BML to receive the voltage or the like provided to the line. Alternatively, when the light blocking pattern BML is a floating pattern rather than a separate line, a voltage provided to the source electrode SE may be transferred to the light blocking pattern BML.

The semiconductor layer ACT, the gate electrode GE, the source electrode SE, and the drain electrode DE described above may constitute the thin film transistor TL, which is a switching element. In some embodiments, the thin film transistors TL may be positioned in the first emission area LA1, the second emission area LA2, and the third emission area LA3, respectively. In some embodiments, a portion of the thin film transistor TL may also be positioned in the non-emission area NLA.

The power supply line VSL may be positioned in the non-display area NDA. A driving voltage, for example, an ELVSS voltage, provided to a cathode electrode CE may be supplied to the power supply line VSL.

The first pad electrode PD1 of the connection pad PD may be positioned in the non-display area NDA. In some embodiments, the first pad electrode PD1 may penetrate through the second insulating layer 117 to be electrically connected to or electrically coupled to the wiring layer WR.

The source electrode SE, the drain electrode DE, the power supply line VSL, and the first pad electrode PD1 of the connection pad PD may include aluminum (Al), copper (Cu), titanium (Ti), or the like, and may be formed as multiple layers or a single layer. In an embodiment, the source electrode SE, the drain electrode DE, the power supply line VSL, and the first pad electrode PD1 of the connection pad PD may have a multilayer structure of Ti/Al/Ti.

A third insulating layer 130 may be positioned on the second insulating layer 117. The third insulating layer 130 may cover the thin film transistor TL in the display area DA, and may expose a portion of the power supply line VSL in the non-display area NDA.

In some embodiments, the third insulating layer 130 may be a planarization layer. In some embodiments, the third insulating layer 130 may be formed as an organic layer. For example, the third insulating layer 130 may include an acrylic resin, an epoxy-based resin, an imide-based resin, an ester-based resin, or the like. In some embodiments, the third insulating layer 130 may include a positive photosensitive material or a negative photosensitive material.

A first anode electrode AE1, a second anode electrode AE2, and a third anode electrode AE3 may be positioned on the third insulating layer 130 in the display area DA. In addition, a connection electrode CNE and a second pad electrode PD2 of the connection pad PD may be positioned on the third insulating layer 130 in the non-display area NDA.

The first anode electrode AE1 may overlap the first emission area LA1 in a plan view, and at least a portion of the first anode electrode AE1 may extend to the non-emission area NLA. The second anode electrode AE2 may overlap the second emission area LA2 in a plan view, and at least a portion of the second anode electrode AE2 may extend to the non-emission area NLA, and the third anode electrode AE3 may overlap the third light emission area LA3 in a plan view, but at least a portion of the third anode electrode AE3 may extend to the non-emission area NLA. The first anode electrode AE1 may penetrate through the third insulating layer 130 to be connected to the drain electrode DE of the thin film transistor TL corresponding to the first anode electrode AE1, the second anode electrode AE2 may penetrate through the third insulating layer 130 to be connected to the drain electrode DE of the thin film transistor TL corresponding to the second anode electrode AE2, and the third anode electrode AE3 may penetrate through the third insulating layer 130 to be connected to the drain electrode DE of the thin film transistor TL corresponding to the third anode electrode AE3. In some embodiments, the first anode electrode AE1, the second anode electrode AE2, and the third anode electrode AE3 may be reflective electrodes. In this case, the first anode electrode AE1, the second anode electrode AE2, and the third anode electrode AE3 may be metal layers including a metal such as Ag, Mg, Al, Pt, Pd, Au, Ni, Nd, Ir, and Cr. In another embodiment, the first anode electrode AE1, the second anode electrode AE2, and the third anode electrode AE3 may further include metal oxide layers stacked on the metal layers. In an embodiment, the first anode electrode AE1, the second anode electrode AE2, and the third anode electrode AE3 may have a multilayer structure, for example, a two-layer structure such as indium tin oxide (ITO)/Ag, Ag/ITO, ITO/Mg, or ITO/MgF, or a three-layer structure such as ITO/Ag/ITO.

The connection electrode CNE may be electrically connected to the power supply line VSL in the non-display area NDA, and may be in direct contact with the power supply line VSL.

The second pad electrode PD2 may be positioned on the first pad electrode PD1 in the non-display area NDA. The second pad electrode PD2 may be in direct contact with and electrically connected to the first pad electrode PD1.

In some embodiments, the connection electrode CNE and the second pad electrode PD2 may be made of the same material as the first anode electrode AE1, the second anode electrode AE2, and the third anode electrode AE3, and may be formed together with the first anode electrode AE1, the second anode electrode AE2, and the third anode electrode AE3 in a process of manufacturing the first anode electrode AE1, the second anode electrode AE2, and the third anode electrode AE3.

A pixel defining layer 150 may be positioned on the first anode electrode AE1, the second anode electrode AE2, and the third anode electrode AE3. The pixel defining layer 150 may include an opening exposing the first anode electrode AE1, an opening exposing the second anode electrode AE2, and an opening exposing the third anode electrode AE3, and may define the first emission area LA1, the second emission area LA2, the third emission area LA3, and the non-emission area NLA. That is, an area of the first anode electrode AE1 exposed without being covered by the pixel defining layer 150 may be the first emission area LA1. Similarly, an area of the second anode electrode AE2 exposed without being covered by the pixel defining layer 150 may be the second emission area LA2, and an area of the third anode electrode AE3 exposed without being covered by the pixel defining layer 150 may be the third emission area LA3. In addition, an area in which the pixel defining layer 150 is positioned may be the non-emission area NLA.

In some examples, the pixel defining layer 150 may include an organic insulating material such as a polyacrylates resin, an epoxy resin, a phenolic resin, a polyamides resin, a polyimides resin, an unsaturated polyesters resin, a polyphenyleneethers resin, a polyphenylenesulfides resin, or benzocyclobutene ("BCB").

In some embodiments, the pixel defining layer 150 may overlap a color pattern 250 in a plan view to be described later. In addition, the pixel defining layer 150 may further overlap a first color filter 231 and a second color filter 233.

The pixel defining layer 150 may also overlap a bank pattern 310 in a plan view to be described later.

As illustrated in FIGS. 4 and 11, an emission layer OL may be positioned on the first anode electrode AE1, the second anode electrode AE2, and the third anode electrode AE3.

In some embodiments, the emission layer OL may have a shape of a continuous layer formed across the plurality of emission areas LA1, LA2, and LA3 and the non-emission area NLA. A more detailed description of the emission layer OL will be provided later.

As illustrated in FIGS. 4 and 11, a cathode electrode CE may be positioned on the emission layer OL. A portion of the cathode electrode CE may be further positioned in the non-display area NDA, as illustrated in FIG. 11. The cathode electrode CE may be electrically connected to and in contact with the connection electrode CNE in the non-display area NDA. The driving voltage (e.g., ELVSS voltage) provided to the power supply line VSL may be transmitted to the cathode electrode CE via the connection electrode CNE.

In some embodiments, the cathode electrode CE may have transflective properties or transmissive properties. When the cathode electrode CE has the transflective properties, the cathode electrode CE may include Ag, Mg, Cu, Al, Pt, Pd, Au, Ni, Nd, Ir, Cr, Li, Ca, LiF/Ca, LiF/Al, Mo, Ti or compounds or mixtures thereof, for example, a mixture of Ag and Mg. In addition, when a thickness of the cathode electrode CE is several tens to several hundreds of angstroms, the cathode electrode CE may have the transflective properties.

When the cathode electrode CE has the transmissive properties, the cathode electrode CE may include transparent conductive oxide ("TCO"). For example, the cathode electrode CE may include tungsten oxide ($W_xO_x$), titanium oxide ($TiO_2$), indium tin oxide (ITO), indium zinc oxide ("IZO"), zinc oxide (ZnO), indium tin zinc oxide ("ITZO"), magnesium oxide (MgO), or the like.

The first anode electrode AE1, the emission layer OL, and the cathode electrode CE may constitute a first light emitting element ED1, the second anode electrode AE2, the emission layer OL, and the cathode electrode CE may constitute a second light emitting element ED2, and the third anode electrode AE3, the emission layer OL, and the cathode electrode CE may constitute a third light emitting element ED3. Each of the first light emitting element ED1, the second light emitting element ED2, and the third light emitting element ED3 may emit emitted light LE.

As illustrated in FIG. 5, the emitted light LE finally emitted from the emission layer OL may be mixed light in which a first component LE1 and a second component LE2 are mixed with each other. A peak wavelength of each of the first component LE1 and the second component LE2 of the emitted light LE may be 440 nm or more and less than 480 nm. That is, the emitted light LE may be blue light.

In some embodiments, the emission layer OL may have a structure in which a plurality of emission layers are disposed to overlap each other in a plan view, for example, a tandem structure. For example, the emission layer OL may include a first stack ST1 including a first emission layer EML1, a second stack ST2 positioned on the first stack ST1 and including a second emission layer EML2, a third stack ST3 positioned on the second stack ST2 and including a third emission layer EML3, a first charge generating layer CGL1 positioned between the first stack ST1 and the second stack ST2, and a second charge generating layer CGL2 positioned between the second stack ST2 and the third stack ST3. The first stack ST1, the second stack ST2, and the third stack ST3 may be disposed to overlap each other in a plan view.

The first emission layer EML1, the second emission layer EML2, and the third emission layer EML3 may be disposed to overlap each other in a plan view.

In some embodiments, all of the first emission layer EML1, the second emission layer EML2, and the third emission layer EML3 may emit light of a first color, for example, blue light. For example, each of the first emission layer EML1, the second emission layer EML2, and the third emission layer EML3 may be a blue emission layer, and may include an organic material.

In some embodiments, at least one of the first emission layer EML1, the second emission layer EML2, and the third emission layer EML3 may emit first blue light having a first peak wavelength, and at least the other of the first emission layer EML1, the second emission layer EML2, and the third emission layer EML3 may emit second blue light having a second peak wavelength different from the first peak wavelength. For example, any one of the first emission layer EML1, the second emission layer EML2, and the third emission layer EML3 may emit the first blue light having the first peak wavelength, and the others of the first emission layer EML1, the second emission layer EML2, and the third emission layer EML3 may emit the second blue light having the second peak wavelength. That is, the emitted light LE finally emitted from the emission layer OL may be mixed light in which the first component LE1 and the second component LE2 are mixed with each other, the first component LE1 may be the first blue light having first peak wavelength, and the second component LE2 may be the second blue light having the second peak wavelength.

In some embodiments, a range of one of the first peak wavelength and the second peak wavelength may be 440 nm or more and less than 460 nm, and a range of the other of the first peak wavelength and the second peak wavelength may be 460 nm or more and 480 nm or less. However, the range of the first peak wavelength and the range of the second peak wavelength are not limited thereto. For example, both of the range of the first peak wavelength and the range of the second peak wavelength may include 460 nm in another embodiment. In some embodiments, any one of the first blue light and the second blue light may be light of a deep blue color, and the other of the first blue light and the second blue light may be light of a sky blue color.

According to some embodiments, the emitted light LE emitted from the emission layer OL is blue light and includes a long wavelength component and a short wavelength component. Accordingly, finally, the emission layer OL may emit blue light having a broader emission peak as the emitted light LE. Therefore, there is an advantage that color visibility at a side viewing angle may be improved as compared with a conventional light emitting element emitting blue light having a sharp emission peak.

In some embodiments, each of the first emission layer EML1, the second emission layer EML2, and the third emission layer EML3 may include a host and a dopant. The host is not particularly limited as long as it is a commonly used material, but may be, for example, tris(8-hydroxyquinolino)aluminum (Alq3), 4,4'-bis(N-carbazolyl)-1,1'-biphenyl ("CBP"), poly(n-vinylcabazole) ("PVK"), 9,10-di(naphthalene-2-yl)anthracene ("ADN"), 4,4',4"-Tris(carbazol-9-yl)-triphenylamine ("TCTA"), 1,3,5-tris(N-phenylbenzimidazole-2-yl)benzene ("TPBi"), 3-tert-butyl-9,10-di(naphth-2-yl)anthracene ("TBADN"), distyrylarylene ("DSA"), 4,4'-bis(9-carbazolyl)-2,2'-dimethyl-biphenyl ("CDBP"), 2-Methyl-9,10-bis(naphthalen-2-yl)anthracene ("MADN"), or the like.

Each of the first emission layer EML1, the second emission layer EML2, and the third emission layer EML3 emitting the blue light may include, for example, a fluorescent material including any one selected from the group consisting of spiro-DPVBi, spiro-6P, distyryl-benzene ("DSB"), distyryl-arylene ("DSA"), polyfluorene ("PFO")-based polymer, and poly(p-phenylene vinylene)-based polymer. As another example, each of the first emission layer EML1, the second emission layer EML2, and the third emission layer EML3 may include a phosphorescent material including an organometallic complex such as (4,6-F2ppy)2Irpic.

As described above, at least one of the first emission layer EML1, the second emission layer EML2, and the third emission layer EML3 emits blue light of a wavelength band different from light of at least the other of the first emission layer EML1, the second emission layer EML2, and the third emission layer EML3. In order to emit blue light of different wavelength bands, the first emission layer EML1, the second emission layer EML2, and the third emission layer EML3 may include the same material and a method of adjusting a resonance distance may be used. Alternatively, in order to emit blue light of different wavelength bands, at least one of the first emission layer EML1, the second emission layer EML2, and the third emission layer EML3 and at least the other of the first emission layer EML1, the second emission layer EML2, and the third emission layer EML3 may include different materials.

However, the present disclosure is not limited thereto, and the blue light emitted from each of the first emission layer EML1, the second emission layer EML2, and the third emission layer EML3 may have a peak wavelength of 440 nm to 480 nm, and the first emission layer EML1, the second emission layer EML2, and the third emission layer EML3 may be made of the same material in another embodiment.

Alternatively, in still another embodiment, at least one of the first emission layer EML1, the second emission layer EML2, and the third emission layer EML3 may emit the first blue light having the first peak wavelength described above, another of the first emission layer EML1, the second emission layer EML2, and the third emission layer EML3 may emit second blue light having a second peak wavelength different from the first peak wavelength, and the other of the first emission layer EML1, the second emission layer EML2, and the third emission layer EML3 may emit third blue light having a third peak wavelength different from the first peak wavelength and the second peak wavelength. In some other embodiments, a range of any one of the first peak wavelength, the second peak wavelength, and the third peak wavelength may be 440 nm or more and less than 460 nm. A range of another of the first peak wavelength, the second peak wavelength, and the third peak wavelength may be 460 nm or more and less than 470 nm, and a range of the other of the first peak wavelength, the second peak wavelength, and the third peak wavelength may be 470 nm or more and 480 nm or less.

According to some other embodiments, the emitted light LE emitted from the emission layer OL is blue light and includes a long wavelength component, an intermediate wavelength component, and a short wavelength component. Accordingly, finally, the emission layer OL may emit blue light having a broader emission peak as the emitted light LE, and color visibility at a side viewing angle may be improved.

According to the above-described embodiments, there is an advantage that light efficiency is increased and a lifespan of the display device may be improved as compared with a conventional light emitting element that does not adopt the tandem structure, that is, the structure in which the plurality of emission layers are stacked.

The first charge generating layer CGL1 may be positioned between the first stack ST1 and the second stack ST2. The first charge generating layer CGL1 may serve to inject charges into each emission layer. The first charge generating layer CGL1 may serve to adjust a charge balance between the first stack ST1 and the second stack ST2. The first charge generating layer CGL1 may include an n-type charge generating layer CGL11 and a p-type charge generating layer CGL12. The p-type charge generating layer CGL12 may be disposed on the n-type charge generating layer CGL11, and may be positioned between the n-type charge generating layer CGL11 and the second stack ST2.

In the first charge generating layer CGL1, the n-type charge generating layer CGL11 and the p-type charge generating layer CGL12 may have a junction structure. The n-type charge generating layer CGL11 is disposed more adjacent to the anode electrodes AE1, AE2 (see FIG. 4), and AE3 (see FIG. 4) of the anode electrodes AE1, AE2 (see FIG. 4), and AE3 (see FIG. 4) and the cathode electrode CE. The p-type charge generating layer CGL12 is disposed more adjacent to the cathode electrode CE of the anode electrodes AE1, AE2 (see FIG. 4), and AE3 (see FIG. 4) and the cathode electrode CE. The n-type charge generating layer CGL11 supplies electrons to the first emission layer EML1 adjacent to the anode electrodes AE1, AE2 (see FIG. 4), and AE3 (see FIG. 4), and the p-type charge generating layer CGL12 supplies holes to the second emission layer EML2 included in the second stack ST2. The first charge generating layer CGL1 may be disposed between the first stack ST1 and the second stack ST2 to provide charges to the respective emission layers, thereby increasing luminous efficiency and decreasing a driving voltage.

The first stack ST1 may be positioned on the first anode electrode AE1, the second anode electrode AE2 (see FIG. 4), and the third anode electrode AE3 (see FIG. 4), and may further include a first hole transport layer HTL1, a first electron block layer BIL1, and a first electron transport layer ETL1.

The first hole transport layer HTL1 may be positioned on the first anode electrode AE1, the second anode electrode AE2 (see FIG. 4), and the third anode electrode AE3 (see FIG. 4). The first hole transport layer HTL1 may serve to smoothly transport holes and may include a hole transport material. The hole transport material may include a carbazole-based derivative such as N-phenylcarbazole and polyvinylcarbazole, a fluorene-based derivative, a triphenylamine-based derivative such as N,N'-bis(3-methylphenyl)-N,N'-diphenyl-[1,1-biphenyl]-4,4'-diamine ("TPD"), 4,4',4"-tris(N-carbazolyl)triphenylamine ("TCTA"), N,N'-di(1-naphthyl)-N,N'-diphenylbenzidine ("NPB"), 4,4'-Cyclohexylidene bis[N,N-bis(4-methylphenyl) benzenamine] ("TAPC"), or the like, but is not limited thereto. In some embodiments, the first hole transport layer HTL1 may be formed as a single layer. Alternatively, in some embodiments, the first hole transport layer HTL1 may be formed as a plurality of layers. When the first hole transport layer HTL1 is formed as the plurality of layers, the respective layers may include different materials.

The first electron block layer BIL1 may be positioned on the first hole transport layer HTL1, and may be positioned between the first hole transport layer HTL1 and the first emission layer EML1. The first electron block layer BIL1 may include a hole transport material and a metal or a metal compound so as to prevent electrons generated in the first emission layer EML1 from flowing into the first hole transport layer HTL1. In some embodiments, each of the first hole transport layer HTL1 and the first electron block layer BIL1 described above may be formed as a single layer in which respective materials are mixed with each other. However, the present disclosure is not limited thereto. In some other embodiments, the first electron block layer BIL1 may be omitted.

The first electron transport layer ETL1 may be positioned on the first emission layer EML1, and may be positioned between the first charge generating layer CGL1 and the first emission layer EML1. In some embodiments, the first electron transport layer ETL1 may include an electron transport material such as Tris(8-hydroxyquinolinato)aluminum (Alq3), 1,3,5-Tri(1-phenyl-1H-benzo[d]imidazol-2-yl)phenyl (TPBi), 2,9-Dimethyl-4,7-diphenyl-1,10-phenanthroline ("BCP"), 4,7-Diphenyl-1,10-phenanthroline (Bphen), 3-(4-Biphenylyl)-4-phenyl-5-tert-butylphenyl-1,2,4-triazole ("TAZ"), 4-(Naphthalen-1-yl)-3,5-diphenyl-4H-1,2,4-triazole ("NTAZ"), 2-(4-Biphenylyl)-5-(4-tert-butylphenyl)-1,3,4-oxadiazole (tBu-PBD), Bis(2-methyl-8-quinolinolato-N1,O8)-(1,1'-Biphenyl-4-olato)aluminum (BAlq), berylliumbis (benzoquinolin-10-olate (Bebq2), 9,10-di(naphthalene-2-yl) anthracene (ADN), and mixtures thereof. However, the present disclosure is not limited to the type of the electron transport material described above. In some embodiments, the first electron transport layer ETL1 may be formed as a single layer. Alternatively, in some embodiments, the first electron transport layer ETL1 may be formed as a plurality of layers. When the first electron transport layer ETL1 is formed as the plurality of layers, the respective layers may include different materials. The second stack ST2 may be positioned on the first charge generating layer CGL1, and may further include a second hole transport layer HTL2, a second electron block layer BIL2, and a second electron transport layer ETL1.

The second hole transport layer HTL2 may be positioned on the first charge generating layer CGL1. The second hole transport layer HTL2 may be made of the same material as the first hole transport layer HTL1, or may include one or more materials selected from the materials exemplified as the material included in the first hole transport layer HTL1. The second hole transport layer HTL2 may be formed as a single layer or be formed as a plurality of layers. When the second hole transport layer HTL2 is formed as the plurality of layers, respective layers may include different materials.

The second electron block layer BIL2 may be positioned on the second hole transport layer HTL2, and may be positioned between the second hole transport layer HTL2 and the first emission layer EML2. The second electron block layer BIL2 may be made of the same material as the first electron block layer BIL1 and may have the same structure as the first electron block layer BIL1, or may include one or more materials selected from the materials exemplified as the material included in the first electron block layer BIL1. In some other embodiments, the second electron block layer BIL2 may be omitted.

The second electron transport layer ETL2 may be positioned on the second emission layer EML2, and may be positioned between the second charge generating layer CGL2 and the second emission layer EML2. The second electron transport layer ETL2 may be made of the same material as the first electron transport layer ETL1 and may have the same structure as the first electron transport layer ETL1, or may include one or more materials selected from the materials exemplified as the material included in the first electron transport layer ETL1. The second electron transport layer ETL2 may be formed as a single layer or be formed as a plurality of layers. When the second electron transport layer ETL2 is formed as the plurality of layers, respective layers may include different materials.

The second charge generating layer CGL2 may be positioned on the second stack ST2, and may be positioned between the second stack ST2 and the third stack ST3.

The second charge generating layer CGL2 may have the same structure as the first charge generating layer CGL1 described above. For example, the second charge generating layer CGL2 may include an n-type charge generating layer CGL21 disposed more adjacent to the second stack ST2 and a p-type charge generating layer CGL22 disposed more adjacent to the cathode electrode CE. The p-type charge generating layer CGL22 may be disposed on the n-type charge generating layer CGL21.

The second charge generating layer CGL2 may have a structure in which the n-type charge generating layer CGL21 and the p-type charge generating layer CGL22 are in contact with each other. The first charge generating layer CGL1 and the second charge generating layer CGL2 may be made of different materials or be made of the same material.

The second stack ST2 may be positioned on the second charge generating layer CGL2, and may further include a third hole transport layer HTL3 and a third electron transport layer ETL3.

The third hole transport layer HTL3 may be positioned on the second charge generating layer CGL2. The third hole transport layer HTL3 may be made of the same material as the first hole transport layer HTL1, or may include one or more materials selected from the materials exemplified as the material included in the first hole transport layer HTL1. The third hole transport layer HTL3 may be formed as a single layer or be formed as a plurality of layers. When the third hole transport layer HTL3 is formed as the plurality of layers, respective layers may include different materials.

The third electron transport layer ETL3 may be positioned on the third emission layer EML3, and may be positioned between the cathode electrode CE and the third emission layer EML3. The third electron transport layer ETL3 may be made of the same material as the first electron transport layer ETL1 and may have the same structure as the first electron transport layer ETL1, or may include one or more materials selected from the materials exemplified as the material included in the first electron transport layer ETL1. The third electron transport layer ETL3 may be formed as a single layer or be formed as a plurality of layers. When the third electron transport layer ETL3 is formed as the plurality of layers, respective layers may include different materials.

Although not illustrated in the drawings, a hole injection layer ("HIL") may be further positioned between the first stack ST1 and the first anode electrode AE1, the second anode electrode AE2 (see FIG. 4), and the third anode electrode AE3 (see FIG. 4), between the second stack ST2 and the first charge generating layer CGL1, or between the third stack ST3 and the second charge generating layer CGL2. The hole injection layer may serve to more smoothly inject holes into the first emission layer EML1, the second emission layer EML2, and the third emission layer EML3. In some embodiments, the hole injection layer may be made of one or more selected from the group consisting of cupper phthalocyanine (CuPc), poly(3,4)-ethylenedioxythiophene ("PEDOT"), polyaniline ("PANI"), and N, N-dinaphthyl-N, N'-diphenyl benzidine ("NPD"), but is not limited thereto. In some embodiments, the hole injection layers may also be positioned between the first stack ST1 and the first anode electrode AE1, the second anode electrode AE2 (see FIG. 4), and the third anode electrode AE3 (see FIG. 4), between the second stack ST2 and the first charge generating layer CGL1, and between the third stack ST3 and the second charge generating layer CGL2.

Although not illustrated in the drawings, an electron injection layer ("EIL") may be further positioned between the third electron transport layer ETL3 and the cathode electrode CE, between the second charge generating layer CGL2 and the second stack ST2, or between the first charge generating layer CGL1 and the first stack ST1. The electron injection layer may serve to smoothly inject electrons, and may be made of tris(8-hydroxyquinolino)aluminum (Alq3), PBD, TAZ, spiro-PBD, BAlq, or SAlq, but is not limited thereto. In addition, the electron injection layer may include a metal halide compound, for example, one or more selected from the group consisting of $MgF_2$, LiF, NaF, KF, RbF, CsF, FrF, LiI, NaI, KI, RbI, CsI, FrI, and $CaF_2$, but is not limited thereto. In addition, the electron injection layer may include a lanthanum-based material such as Yb, Sm, or Eu. Alternatively, the electron injection layer may include both a metal halide material and a lanthanum-based material such as RbI:Yb or KI:Yb. When the electron injection layer includes both the metal halide material and the lanthanum-based material, the electron injection layer may be formed by co-deposition of the metal halide material and the lanthanum-based material. In some embodiments, the electron injection layers may also be positioned between the third electron transport layer ETL3 and the cathode electrode CE, between the second charge generating layer CGL2 and the second stack ST2, and between the first charge generating layer CGL1 and the first stack ST1.

In addition to the above-described structure, a structure of the emission layer OL may be modified. For example, the emission layer OL may include only two stacks, or may include four or more stacks.

As illustrated in FIG. 11, the first dam member IDM and the first support member IS may be positioned on the second insulating layer 117 in the non-display area NDA.

The first dam member IDM may be positioned relatively outside at least a portion of the power supply line VSL. In other words, as illustrated in FIG. 11, at least a portion of the power supply line VSL may be positioned between the first dam member IDM and the display area DA.

In some embodiments, a portion of the first dam member IDM may overlap the power supply line VSL in a plan view.

In some embodiments, the first dam member IDM may include a plurality of dams. For example, the first dam member IDM may include a first dam D1, a second dam D2, and a third dam D3.

The first dam D1 may partially overlap the power supply line VSL in a plan view, and may be spaced apart from the third insulating layer 130 with the power supply line VSL interposed therebetween. In some embodiments, the first dam D1 may include a first lower dam pattern D11 positioned on the second insulating layer 117 and a first upper dam pattern D12 positioned on the first lower dam pattern D11.

The second dam D2 may be positioned outside the first dam D1 and may be spaced apart from the first dam D1. In some embodiments, the second dam D2 may include a second lower dam pattern D21 positioned on the second insulating layer 117 and a second upper dam pattern D22 positioned on the second lower dam pattern D21.

The third dam D3 may be positioned outside the second dam D2 and may be spaced apart from the second dam D2. In some embodiments, the third dam D3 may include a third lower dam pattern D31 positioned on the second insulating layer 117 and a third upper dam pattern D32 positioned on the third lower dam pattern D31.

In some embodiments, the first lower dam pattern D11, the second lower dam pattern D21, and the third lower dam pattern D31 may be made of the same material as the third insulating layer 130, and may be formed simultaneously with the third insulating layer 130.

In some embodiments, the first upper dam pattern D12, the second upper dam pattern D22, and the third upper dam pattern D32 may be made of the same material as the pixel defining layer 150, and may be formed simultaneously with the pixel defining layer 150.

In some embodiments, heights of the first dam D1, the second dam D2, and the third dam D3 may be different from each other. For example, a height of the second dam D2 may be greater than a height of the first dam D1, and a height of the third dam D3 may be greater than the height of the second dam D2. That is, as a distance from the display area DA increases, heights of the dams included in the first dam member IDM may gradually increase, and accordingly, it is possible to more effectively block an organic material from overflowing in a process of forming a first organic layer 173 included in a first encapsulation layer 170 to be described later.

The first support member IS may be positioned relatively outside the first dam member IDM. In other words, as illustrated in FIGS. 10 and 11, the first dam member IDM may be positioned between the first support member IS and the display area DA. The first support member IS may serve to support a mask in a process of manufacturing a first encapsulation layer 170.

In some embodiments, the first support member IS may be made of the same material as the third insulating layer 130, and may be formed together with the third insulating layer 130 in a process of manufacturing the third insulating layer 130. Alternatively, the first support member IS may be made of the same material as the pixel defining layer 150 and may be formed together with the pixel defining layer 150 in a process of manufacturing the pixel defining layer 150.

As illustrated in FIGS. 4 and 11, the first encapsulation layer 170 may be disposed on the cathode electrode CE. The first encapsulation layer 170 protects components positioned below the first encapsulation layer 170, for example, the light emitting elements ED1, ED2, and ED3 from external foreign materials such as moisture. The first encapsulation layer 170 is disposed in common in the first emission area LA1, the second emission area LA2, the third emission area LA3, and the non-emission area NLA. In some embodiments, the first encapsulation layer 170 may directly cover the cathode electrode CE. In some embodiments, a capping layer (not illustrated in the drawings) covering the cathode electrode CE may be further disposed between the first encapsulation layer 170 and the cathode electrode CE. In this case, the first encapsulation layer 170 may directly cover the capping layer. The first encapsulation layer 170 may be a thin film encapsulation layer.

In some embodiments, the first encapsulation layer 170 may include a first lower inorganic layer 171, a first organic layer 173, and a first upper inorganic layer 175 that are sequentially stacked on the cathode electrode CE.

In some embodiments, the first lower inorganic layer 171 may cover the first light emitting element ED1, the second light emitting element ED2, and the third light emitting element ED3 in the display area DA, and may cover the first dam member IDM in the non-display area NDA.

In some embodiments, an end 171e of the first lower inorganic layer 171 may be positioned in the non-display area NDA, and may be positioned between the first dam member IDM and the first support member IS.

The first organic layer 173 may be positioned on the first lower inorganic layer 171. The first organic layer 173 may cover the first light emitting element ED1, the second light emitting element ED2, and the third light emitting element ED3 in the display area DA. In some embodiments, a portion of the first organic layer 173 may be positioned in the non-display area NDA, but may not be positioned outside the first dam member IDM. It has been illustrated in FIG. 11 that a portion of the first organic layer 173 is accommodated in a space between the first dam D1 and the second dam D2, but the present disclosure is not limited thereto. Although not illustrated in the drawings, a portion of the first organic layer 173 may also be positioned between the second dam D2 and the third dam D3.

The first upper inorganic layer 175 may be positioned on the first organic layer 173. The first upper inorganic layer 175 may cover the first organic layer 173. In some embodiments, the first upper inorganic layer 175 may be in direct contact with the first lower inorganic layer 171 in the non-display area NDA to form an inorganic-inorganic junction, and an end 175e of the first upper inorganic layer 175 may be positioned between the first dam member IDM and the first support member IS. In some embodiments, the end 175e of the first upper inorganic layer 175 and the end 171e of the first lower inorganic layer 171 may be substantially aligned with each other.

In some embodiments, each of the first lower inorganic layer 171 and the first upper inorganic layer 175 may be made of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), lithium fluoride, or the like.

In some embodiments, each of the first lower inorganic layer 171 and the first upper inorganic layer 175 may be formed as a single layer, but is not limited thereto. At least one of the first lower inorganic layer 171 and the first upper inorganic layer 175 may have a structure in which a plurality of layers each made of an inorganic material are stacked, for example, a multilayer structure in another embodiment.

In some embodiments, the first organic layer 173 may be made of an acrylic resin, a methacrylic resin, polyisoprene, a vinyl-based resin, an epoxy-based resin, a urethane-based resin, a cellulose-based resin, a perylene-based resin, or the like.

However, a structure of the first encapsulation layer 170 is not limited to the above-described example, and a stacked structure of the first encapsulation layer 170 may be variously modified.

A first capping layer 181 may be positioned on the first encapsulation layer 170. The first capping layer 181 may seal a first wavelength conversion pattern 340, a second wavelength conversion pattern 350, and a light-transmitting pattern 330 together with a second capping layer 183 to be described later. In some embodiments, the first capping layer 181 may be disposed not only in the display area DA but also in the non-display area NDA, and may cover the first dam member IDM and the first support member IS in the non-display area NDA. In addition, the first capping layer 181 may cover a portion of the connection pad PD in the non-display area NDA.

In some embodiments, the first capping layer 181 may include an inorganic material. For example, the first capping layer 181 may include an inorganic material such as silicon oxide, silicon nitride, or silicon oxynitride.

The bank pattern 310 may be positioned on the first capping layer 181. In some embodiments, the bank pattern 310 may be positioned in the non-emission area NLA in the display area DA, and may surround the first emission area LA1, the second emission area LA2, and the third emission area LA3 in a plan view, as illustrated in FIG. 6. The bank pattern 310 may partition spaces in which the first wavelength conversion pattern 340, the second wavelength conversion pattern 350, and the light-transmitting pattern 330 are disposed. In addition, the bank pattern 310 may also be positioned in the non-display area NDA, as illustrated in FIG. 11, and may cover the first dam member IDM in the non-display area NDA. In some embodiments, the first support member IS may also function as a dam to prevent overflow of the bank pattern 310, and a portion of the bank pattern 310 may be positioned in a space between the first dam member IDM and the first support member IS.

In some embodiments, the bank pattern 310 may be formed as one pattern integrally connected as illustrated in FIG. 6, but is not limited thereto. In another embodiment, a portion of the bank pattern 310 surrounding the first emission area LA1, a portion of the bank pattern 310 surrounding the second emission area LA2, and a portion of the bank pattern 310 surrounding the third emission area LA3 may be formed as individual patterns separated from each other.

When the first wavelength conversion pattern 340, the second wavelength conversion pattern 350, and the light-transmitting pattern 330 are formed by a method of discharging an ink composition, that is, an inkjet printing method, the bank pattern 310 may serve as a guide for stably positioning the discharged ink composition at desired positions. That is, the bank pattern 310 may function as a partition wall.

In some embodiments, the bank pattern 310 may include an organic material having photocurability.

In some embodiments, the bank pattern 310 may include an organic material having light blocking properties. When the bank pattern 310 has the light blocking properties, the bank pattern 310 may prevent light from permeating between the emission areas neighboring to each other in the display area DA. For example, the bank pattern 310 may prevent the emitted light LE emitted from the second light emitting element ED2 from being incident on the first wavelength conversion pattern 340 overlapping the first emission area LA1 in a plan view. In addition, the bank pattern 310 may block or prevent external light from permeating into components positioned below the bank pattern 310 in the non-display area NDA.

The first wavelength conversion pattern 340, the second wavelength conversion pattern 350, and the light-transmitting pattern 330 may be positioned on the first capping layer 181. In some embodiments, the first wavelength conversion pattern 340, the second wavelength conversion pattern 350, and the light-transmitting pattern 330 may be positioned in the display area DA.

The light-transmitting pattern 330 may be positioned on the first capping layer 181, may be positioned in the space partitioned by the bank pattern 310, and may overlap the third emission area LA3 or the third light emitting element ED3 in a plan view.

In some embodiments, the light-transmitting pattern 330 may be formed as an island shape pattern, as illustrated in FIG. 7. In some embodiments, a portion of the light-transmitting pattern 330 may overlap the non-emission area NLA in a plan view.

The light-transmitting pattern 330 may transmit incident light. The emitted light LE provided from the third light emitting element ED3 may be the blue light, as described above. The emitted light LE, which is the blue light, is transmitted through the light-transmitting pattern 330 and a third color filter 235 and is then emitted to the outside of the display device 1. That is, third light L3 emitted from the third emission area LA3 to the outside of the display device 1 may be the blue light.

In some embodiments, the light-transmitting pattern 330 may include a first base resin 331, and may further include first scatterers 333 dispersed in the first base resin 331.

The first base resin 331 may be made of a material having high light transmissivity. In some embodiments, the first base resin 331 may be made of an organic material. For example, the first base resin 331 may include an organic material such as an epoxy-based resin, an acrylic resin, a cardo-based resin, or an imide-based resin.

The first scatterer 333 may have a refractive index different from a refractive index of the first base resin 331, and may form an optical interface with the first base resin 331. For example, the first scatterers 333 may be light scattering particles. The first scatterer 333 is not particularly limited as long as it is a material capable of scattering at least a portion of transmitted light, but may be, for example, a metal oxide particle or an organic particle. Examples of a metal oxide of the metal oxide particle may include titanium oxide ($TiO_2$), zirconium oxide ($ZrO_2$), aluminum oxide ($Al_2O_3$), indium oxide ($In_2O_3$), zinc oxide ($ZnO$), tin oxide ($SnO_2$), or the like, and examples of a material of the organic particle may include an acrylic resin, a urethane-based resin, or the like. The first scatterer 333 may scatter light in a random direction regardless of an incident direction of incident light without substantially converting a wavelength of the light transmitted through the light-transmitting pattern 330.

In some embodiments, the light-transmitting pattern 330 may be in direct contact with the first capping layer 181 and the bank pattern 310.

The first wavelength conversion pattern 340 may be positioned on the first capping layer 181, may be positioned in the space partitioned by the bank pattern 310, and may overlap the first emission area LA1 or the first light emitting element ED1 in a plan view.

In some embodiments, the first wavelength conversion pattern 340 may be formed in the form of an island pattern, as illustrated in FIG. 7. In some embodiments, a portion of the first wavelength conversion pattern 340 may overlap the non-emission area NLA in a plan view.

The first wavelength conversion pattern 340 may convert or shift a peak wavelength of incident light to light having another specific peak wavelength and emit the light having another specific peak wavelength. In some embodiments, the first wavelength conversion pattern 340 may convert the emitted light LE provided from the first light emitting element ED1 into red light having a peak wavelength in the range of 610 nm to 650 nm and emit the red light. A more detailed description of an emission spectrum and a light absorption spectrum of the first wavelength conversion pattern 340 will be provided later.

In some embodiments, the first wavelength conversion pattern 340 may include a second base resin 341 and first wavelength shifters 345 dispersed in the second base resin 341, and may further include second scatterers 343 dispersed in the second base resin 341.

The second base resin 341 may be made of a material having high light transmissivity. In some embodiments, the second base resin 341 may be made of an organic material. In some embodiments, the second base resin 341 may be made of the same material as the first base resin 331, or may include at least one of the materials exemplified as the material of the first base resin 331.

The first wavelength shifter 345 may convert or shift the peak wavelength of the incident light to another specific peak wavelength. In some embodiments, the first wavelength shifter 345 may convert the emitted light LE of the third color, which is the blue light provided from the first light emitting element ED1, into red light having a single peak wavelength in the range of 610 nm to 650 nm and emit the red light.

Examples of the first wavelength shifter 345 may include a quantum dot, a quantum rod, a phosphor, or the like. For example, the quantum dot may be a particulate matter emitting a specific color while electrons are transitioning from a conduction band to a valence band.

The quantum dot may be a semiconductor nanocrystal material. The quantum dot may have a specific bandgap according to its composition and size to absorb light and then emit light having a unique wavelength. Examples of semiconductor nanocrystals of the quantum dot may include group IV nanocrystal, group II-VI compound nanocrystals, group III-V compound nanocrystals, group IV-VI nanocrystals, or combinations thereof.

A group II-VI compound may be selected from the group consisting of a binary compound selected from the group consisting of CdSe, CdTe, ZnS, ZnSe, ZnTe, ZnO, HgS, HgSe, HgTe, MgSe, MgS, and mixtures thereof: a ternary compound selected from the group consisting of InZnP, AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof; and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and mixtures thereof.

A group III-V compound may be selected from the group consisting of a binary compound selected from the group consisting of GaN, GaP, GaAs, GaSb, AlN, AlP, AlAs, AlSb, InN, InP, InAs, InSb, and mixtures thereof: a ternary compound selected from the group consisting of GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP, and mixtures thereof; and a quaternary compound selected from the group consisting of GaAlNAs, GaAlNSb, GaAlPAs, GaAlPSb, GaInNP, GaInNAs, GaInNSb, GaIn-PAs, GaInPSb, InAlNP, InAlNAs, InAlNSb, InAlPAs, InAlPSb, and mixtures thereof.

A group IV-VI compound may be selected from the group consisting of a binary compound selected from the group consisting of SnS, SnSe, SnTe, PbS, PbSe, PbTe, and mixtures thereof: a ternary compound selected from the group consisting of SnSeS, SnSeTe, SnSTe, PbSeS, PbSeTe, PbSTe, SnPbS, SnPbSe, SnPbTe, and mixtures thereof; and a quaternary compound selected from the group consisting of SnPbSSe, SnPbSeTe, SnPbSTe, and mixtures thereof. A group IV element may be selected from the group consisting of Si, Ge, and mixtures thereof. A group IV compound may be a binary compound selected from the group consisting of SiC, SiGe, and mixtures thereof.

In this case, the binary compound, the ternary compound, or the quaternary compound may be present in a particle at a uniform concentration or may be present in the same particle in a state of partially different concentration distributions. In addition, the quantum dot may have a core/shell structure in which one quantum dot surrounds another quantum dot. An interface between a core and a shell may have a concentration gradient in which a concentration of element present in the shell decreases toward the center.

In some embodiments, the quantum dot may have a core-shell structure including a core including the above-described nanocrystals and a shell surrounding the core. The shell of the quantum dot may serve as a passivation layer for maintaining semiconductor characteristics by preventing chemical modification of the core and/or serve as a charging layer for imparting electrophoretic characteristics to the quantum dot. The shell may be a single layer or multiple layers. An interface between a core and a shell may have a concentration gradient in which a concentration of element present in the shell decreases toward the center. Examples of the shell of the quantum dot may include metal or non-metal oxide, a semiconductor compound, a combination thereof, or the like.

Examples of the metal or non-metal oxide may include a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO, or a ternary compound such as $MgAl_2O_4$, $CoFe_2O_4$, $NiFe_2O_4$, or $CoMn_2O_4$, but the present disclosure is not limited thereto.

In addition, examples of the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or the like, but the present disclosure is not limited thereto.

The light emitted by the first wavelength shifter 345 may have a full width of half maximum ("FWHM") of an emission wavelength spectrum of about 45 nm or less, about 40 nm or less, or about 30 nm or less, and therefore, color purity and color reproducibility of colors displayed by the display device 1 may be further improved. In addition, the light emitted by the first wavelength shifter 345 may be emitted toward several directions regardless of an incident direction of the incident light. Therefore, side visibility of the first color displayed in the first emission area LA1 may be improved.

A portion of the emitted light LE provided from the first light emitting element ED1 and may be transmitted through the first wavelength conversion pattern 340 without being converted into the red light by the first wavelength shifter 345, and be then emitted. A component of the emitted light LE incident on the first color filter 231 without being converted by the first wavelength conversion pattern 340 may be blocked by the first color filter 231. On the other hand, the red light converted by the first wavelength conversion pattern 340 among the emitted light LE is transmitted through the first color filter 231 and then emitted to the outside. That is, first light L1 emitted from the first emission area LA1 to the outside may be the red light.

The second scatterer 343 may have a refractive index different from a refractive index of the second base resin 341, and may form an optical interface with the second base resin 341. For example, the second scatterers 343 may be light scattering particles. A detailed description of the second scatterer 343 other than that described above is substantially the same as or similar to that of the first scatterer 333, and will thus be omitted.

The second wavelength conversion pattern 350 may be positioned on the first capping layer 181, may be positioned in the space partitioned by the bank pattern 310, and may overlap the second emission area LA2 or the second light emitting element ED1 in a plan view.

In some embodiments, the second wavelength conversion pattern 350 may be formed in the form of an island pattern, as illustrated in FIG. 7. In some embodiments, a portion of the second wavelength conversion pattern 350 may overlap the non-emission area NLA in a plan view.

The second wavelength conversion pattern 350 may convert or shift a peak wavelength of incident light to light having another specific peak wavelength and emit the light having another specific peak wavelength. In some embodiments, the second wavelength conversion pattern 350 may convert the emitted light LE provided from the second light emitting element ED2 into green light in the range of about 510 nm to about 550 nm and emit the green light.

In some embodiments, the second wavelength conversion pattern 350 may include a third base resin 351 and second wavelength shifters 355 dispersed in the third base resin 351, and may further include third scatterers 353 dispersed in the third base resin 351.

The third base resin 351 may be made of a material having high light transmissivity In some embodiments, the third base resin 351 may be made of an organic material. In some embodiments, the third base resin 351 may be made of the same material as the first base resin 331, or may include at least one of the materials exemplified as the material of the first base resin 331.

The second wavelength shifter 355 may convert or shift the peak wavelength of the incident light to another specific peak wavelength. In some embodiments, the second wavelength shifter 355 may convert the blue light having a peak wavelength in the range of 440 nm to 480 nm into green light having a peak wavelength in the range of 510 nm to 550 nm.

Examples of the second wavelength shifter 355 may include a quantum dot, a quantum rod, a phosphor, or the like. A more detailed description of the second wavelength shifter 355 is substantially the same as or similar to that described above in the description of the first wavelength shifter 345, and will thus be omitted.

In some embodiments, both the first wavelength shifter 345 and the second wavelength shifter 355 may be constituted of quantum dots. In this case, a particle size of the quantum dot constituting the second wavelength shifter 355 may be smaller than a particle size of the quantum dot constituting the first wavelength shifter 345.

The third scatterer 353 may have a refractive index different from a refractive index of the third base resin 351, and may form an optical interface with the third base resin 351. For example, the third scatterers 353 may be light scattering particles. A detailed description of the third scatterer 353 other than that described above is substantially the same as or similar to that of the second scatterer 343, and will thus be omitted.

The emitted light LE emitted from the second light emitting element ED2 may be provided to the second wavelength conversion pattern 350, and the second wavelength shifter 355 may convert the emitted light LE provided from the second light emitting element ED2 into green light having a peak wavelength in the range of about 510 nm to about 550 nm and emit the green light.

A portion of the emitted light LE, which is the blue light, may be transmitted through the second wavelength conversion pattern 350 without being converted into the green light by the second wavelength shifter 355, and may be blocked by the second color filter 233. On the other hand, the green light converted by the second wavelength conversion pattern 350 among the emitted light LE is transmitted through the second color filter 233 and then emitted to the outside. Accordingly, second light LE emitted from the third emission area LA2 to the outside of the display device 1 may be the green light.

The second capping layer 183 may be positioned on the light-transmitting pattern 330, the first wavelength conversion pattern 340, and the second wavelength conversion pattern 350. The second capping layer 183 may cover the light-transmitting pattern 330, the first wavelength conversion pattern 340, and the second wavelength conversion pattern 350. The second capping layer 183 may also be positioned in the non-display area NDA. In the non-display area NDA, the second capping layer 183 may be in contact with the first capping layer 181, and may seal the light-transmitting pattern 330, the first wavelength conversion pattern 340, and the second wavelength conversion pattern 350. Accordingly, it is possible to prevent damage to or contamination of the light-transmitting pattern 330, the first wavelength conversion pattern 340, and the second wavelength conversion pattern 350 due to permeation of impurities such as moisture or air from the outside. In some embodiments, the second capping layer 183 may be made of an inorganic material.

In some embodiments, the second capping layer 183 may be made of the same material as the first capping layer 181 or may include at least one of the materials mentioned in the description of the first capping layer 181. When both the first capping layer 181 and the second capping layer 183 are made of the inorganic material, a portion where the first capping layer 181 and the second capping layer 183 are in direct contact with each other may form an inorganic-inorganic junction, and may effectively block introduction of moisture, air, or the like, from the outside.

In some embodiments, the first capping layer 181 and the second capping layer 183 may be in direct contact with each other in the non-display area NDA.

In some embodiments, the second capping layer 183 may cover a portion of the connection pad PD, and an opening OPN exposing a portion of the connection pad PD may be defined in the first capping layer 181 and the second capping layer 183. A portion of the connection pad PD exposed by the opening OPN may be electrically connected to a terminal of the above-described flexible circuit board FPC.

In some embodiments, the opening OPN may be formed after an overcoat layer 190 is formed in a process of manufacturing a display device to be described later. That is, in the process of manufacturing a display device, the connection pad PD may be covered by the first capping layer 181 and the second capping layer 183, and may be partially removed after the overcoat layer 190 is formed. That is, in the process of manufacturing a display device, the connection pad PD may be protected by the first capping layer 181 and the second capping layer 183, and accordingly, damage to the connection pad PD that may occur in the process of manufacturing a display device may be prevented.

The overcoat layer 190 may be positioned on the second capping layer 183. The overcoat layer 190 may planarize upper portions of the light-transmitting pattern 330, the first wavelength conversion pattern 340, and the second wavelength conversion pattern 350.

In some embodiments, the overcoat layer 190 may include an organic material, which may be an organic material having photocurability.

In some embodiments, a refractive index of the overcoat layer 190 may be lower than refractive indices of the first wavelength conversion pattern 340 and the second wavelength conversion pattern 350. For example, the refractive index of the overcoat layer 190 may be 1.1 or more and 1.3 or less, and the refractive index of the first wavelength conversion pattern 340 and the refractive index of the second wavelength conversion pattern 350 may be greater than the refractive index of the overcoat layer 190 by 0.3 or more. For example, the refractive index of the first wavelength conversion pattern 340 and the refractive index of the second wavelength conversion pattern 350 may be 1.7 to 1.9.

In some embodiments, the refractive index of the overcoat layer 190 may be lower than a reflective index of the light-transmitting pattern 330. In some embodiments, the refractive index of the light-transmitting pattern 330 may be greater than the refractive index of the overcoat layer 190 by 0.3 or more.

The overcoat layer 190 having a relatively low refractive index may reflect a portion of light emitted from the first wavelength conversion pattern 340 and the second wavelength conversion pattern 350 in a direction toward the upper side of the display device 1 toward the first wavelength conversion pattern 340 and the second wavelength conversion pattern 350. That is, the overcoat layer 190 may recycle at least a portion of light transmitted through the first wavelength conversion pattern 340 and the second wavelength conversion pattern 350 and then incident thereon to increase an amount of light converted by the first wavelength conversion pattern 340 and the second wavelength conversion pattern 350, and as a result, may improve light efficiency of the display device 1.

In some embodiments, the overcoat layer 190 may be positioned only in the display area DA and may not be positioned in the non-display area NDA. However, the present disclosure is not limited thereto, and in another embodiment, a portion of the overcoat layer 190 may also be positioned in the non-display area NDA.

The first color filter 231, the second color filter 233, the third color filter 235, and the color pattern 250 may be positioned on the overcoat layer 190 in the display area DA.

The first color filter 231 may be disposed to overlap the first emission area LA1, the second color filter 233 may be disposed to overlap the second emission area LA2, and the third color filter 235 may be disposed to overlap the third emission area LA3 in a plan view.

In some embodiments, the first color filter 231 may block or absorb the light of the third color (e.g., the blue light). That is, the first color filter 231 may function as a blue light blocking filter blocking the blue light. In some embodiments, the first color filter 231 may selectively transmit the light of the first color (e.g., the red light) and block or absorb the light of the third color (e.g., the blue light) and the light of the second color (e.g., the green light). For example, the first color filter 231 may be a red color filter, and may include a red colorant.

The second color filter 233 may block or absorb the light of the third color (e.g., the blue light). That is, the second color filter 233 may also function as a blue light blocking filter. In some embodiments, the second color filter 233 may selectively transmit the light of the second color (e.g., the green light) and block or absorb the light of the third color (e.g., the blue light) and the light of the first color (e.g., the red light). For example, the second color filter 233 may be a green color filter, and may include a green colorant.

As illustrated in FIGS. 4 and 8, in some embodiments, a portion of the first color filter 231 may be further positioned within the non-emission area NLA, and a portion of the second color filter 233 may also be further positioned within the non-emission area NLA.

In some embodiments, portions of the first color filter 231 may be further positioned in an area between the first emission area LA1 and the second emission area LA2 and an area between the first emission area LA1 and the third emission area LA3 in the non-emission area NLA.

In some embodiments, portions of the second color filter 233 may be further positioned in the area between the first emission area LA1 and the second emission area LA2 and an area between the second emission area LA2 and the third emission area LA3 in the non-emission area NLA.

It has been illustrated in the drawings that that the first color filter 231 and the second color filter 233 do not overlap each other, but the first color filter 231 and the second color filter 233 may also overlap each other in the area between the first emission area LA1 and the second emission area LA2 in the non-emission area NLA in a plan view. A portion where the first color filter 231 and the second color filter 233 overlap each other in the non-emission area NLA may function as a light blocking member blocking transmission of the light.

Alternatively, in another embodiment, unlike illustrated in the drawings, the first color filter 231 and the second color filter 233 may be positioned over the entire non-emission area NLA, and in an embodiment, the first color filter 231 and the second color filter 233 may overlap each other in the entire non-emission area NLA in a plan view.

The third color filter 235 may selectively transmit the light of the third color (e.g., the blue light) and block or absorb the light of the first color (e.g., the red light) and the light of the first color (e.g., the green light). In some embodiments, the third color filter 235 may be a blue color filter, and may include a blue colorant such as a blue dye or a blue pigment.

The color pattern 250 may be disposed to overlap the non-emission area NLA in the display area DA in a plan view. The color pattern 250 may also be positioned in the non-display area NDA, and may be disposed to overlap the bank pattern 310 in the non-display area NDA in a plan view.

The color pattern 250 may absorb a portion of light from the outside of the display device 1 into the display device 1 to reduce reflected light due to external light. The external light is reflected to a large extent to cause distortion of a color gamut of the display device 1. However, according to the present embodiment, when the color pattern 250 is positioned in the non-emission area NLA and the non-display area NDA, distortion of colors due to external light reflection may be reduced.

In some embodiments, the color pattern 250 may include a blue colorant such as a blue dye or a blue pigment. In some embodiments, the color pattern 250 may be made of the same material as the third color filter 235, and may be formed simultaneously with the third color filter 235 in a process of forming the third color filter 235. When the color pattern 250 includes the blue colorant, external light or reflected light transmitted through the color pattern 250 has a blue wavelength band. Eye color sensibility of a user differs according to a color of light. More specifically, light of a blue wavelength band may be perceived less sensitively by the user than light of a green wavelength band and light of a red wavelength band. Accordingly, the color pattern 250 includes the blue colorant, and thus, the user may relatively less sensitively perceive the reflected light.

In some embodiments, the color pattern 250 may overlap the first color filter 231 and the second color filter 233 in the non-emission area NLA in a plan view. For example, the color pattern 250 may overlap the first color filter 231 and the second color filter 233 in the area between the first emission area LA1 and the second emission area LA2 in the non-emission area NLA. In addition, the color pattern 250 may overlap the second color filter 233 in the area between the second emission area LA2 and the third emission area LA3 in the non-emission area NLA. In addition, the color pattern 250 may overlap the first color filter 231 in a plan view in an area between the third emission area LA3 and the first emission area LA1 in the non-emission area NLA.

Portions where the first color filter 231 and the color pattern 250 overlap each other in a plan view and portions where the second color filter 233 and the color pattern 250 overlap each other in the non-emission area NLA may function as a light blocking member blocking transmission of the light. The portions where the first color filter 231 and the color pattern 250 overlap each other in a plan view and the portions where the second color filter 233 and the color pattern 250 overlap each other in the non-emission area NLA may reduce the distortion of the colors due to the external light reflection by absorbing at least a portion of the external light. In addition, these portions may prevent a phenomenon in which the light emitted to the outside permeates between adjacent emission areas, such that color mixing occurs, and accordingly, may further improve a color gamut of the display device 1.

In some embodiments, in the non-emission area NLA, the color pattern 250 may be positioned on the first color filter 231 and the second color filter 233. That is, the color pattern 250 may be positioned relatively farther from the base part 110 than the first color filter 231 and the second color filter 233 are.

The second dam member ODM may be positioned between the first capping layer 181 and the second capping layer 183 in the non-display area NDA.

The second dam member ODM may block an organic material from overflowing in a process of forming a second organic layer 273 included in a second encapsulation layer 270.

The second dam member ODM may be positioned relatively outside the first dam member IDM. In other words, as illustrated in FIGS. 10 and 11, the first dam member IDM may be positioned between the second dam member ODM and the display area DA.

In some embodiments, the second dam member ODM may be made of the same material as the bank pattern 310, and may be formed simultaneously with the bank pattern 310 in a process of forming the bank pattern 310.

The second support member OS may be positioned on the second capping layer 183 in the non-display area NDA. The second support member OS may support a mask used in a process of forming the second encapsulation layer 270.

In some embodiments, the second support member OS may be positioned relatively outside the second dam member ODM. In other words, as illustrated in FIGS. 10 and 11, the second dam member ODM may be positioned between the second support member OS and the display area DA.

In some embodiments, the second support member OS may be made of the same material as the overcoat layer 190, and may be formed together with the overcoat layer 190 in a process of forming the overcoat layer 190. Alternatively, the second support member OS may include the same material as at least one of the first color filter 231, the second color filter 233, and the third color filter 235. For example, when the second support member OS includes the same material as the third color filter 235, the second support member OS may be formed together with the third color filter 235 in a process of forming the third color filter 235.

The second encapsulation layer 270 may be positioned on the first color filter 231, the second color filter 233, the third color filter 235, and the color pattern 250. The second encapsulation layer 270 protects components positioned below the second encapsulation layer 270 from external foreign materials such as moisture.

The second encapsulation layer 270 is disposed in common in the first emission area LA1, the second emission area LA2, the third emission area LA3, and the non-emission area NLA in the display area DA. In some embodiments, the second encapsulation layer 270 may directly cover the first color filter 231, the second color filter 233, the third color filter 235, and the color pattern 250 in the display area DA.

The second encapsulation layer 270 may cover the bank pattern 310 and the color pattern 250 in the non-display area NDA.

In some embodiments, the second encapsulation layer 270 may include a second lower inorganic layer 271, a second organic layer 273, and a second upper inorganic layer 275 that are sequentially stacked.

In some embodiments, the second lower inorganic layer 271 may directly cover the first color filter 231, the second color filter 233, the third color filter 235, and the color pattern 250 in the display area DA, and may cover the bank pattern 310 and the color pattern 250 in the non-display area NDA.

In some embodiments, an end 271*e* of the second lower inorganic layer 271 may be positioned in the non-display area NDA, and may be positioned between the second dam member ODM and the second support member OS.

The second organic layer 273 may be positioned on the second lower inorganic layer 271. The second organic layer 273 may be positioned over the entire display area DA, and a portion of the second organic layer 273 may be positioned in the non-display area NDA. In some embodiments, a portion of the second organic layer 273 may be positioned in the non-display area NDA, but may not be positioned outside the second dam member ODM. In some embodiments, a portion of the second organic layer 273 may be positioned in a space between the second dam member ODM and the first support member IS.

The second upper inorganic layer 275 may be positioned on the second organic layer 273. The second upper inorganic layer 275 may cover the second organic layer 273. In some embodiments, the second upper inorganic layer 275 may be in direct contact with the second lower inorganic layer 271 in the non-display area NDA to form an inorganic-inorganic junction, and an end 275*e* of the second upper inorganic layer 275 may be positioned between the second dam member ODM and the second support member OS. Both the end 275*e* of the second upper inorganic layer 275 and the end 275*e* of the second lower inorganic layer 271 may be positioned between the second dam member ODM and the second support member OS, and thus, both the second upper inorganic layer 275 and the second lower inorganic layer 271 may not overlap the connection pad PD in a plan view.

In some embodiments, the end 275*e* of the second upper inorganic layer 275 and the end 271*e* of the second lower inorganic layer 271 may be substantially aligned with each other.

In some embodiments, the second lower inorganic layer 271 and the second upper inorganic layer 275 may be made of an inorganic insulating material. In some embodiments, the second lower inorganic layer 271 and the second upper inorganic layer 275 may be made of the same material as the first lower inorganic layer 171 or may include at least one of the materials exemplified as the material of the first lower inorganic layer 171.

The second organic layer 273 may be positioned between the second lower inorganic layer 271 and the second upper inorganic layer 275. The second organic layer 273 may be made of an organic insulating material. In some embodiments, the second organic layer 273 may be made of the same material as the first organic layer 173 or may include at least one of the materials exemplified as the material of the first organic layer 173.

Figure 12:
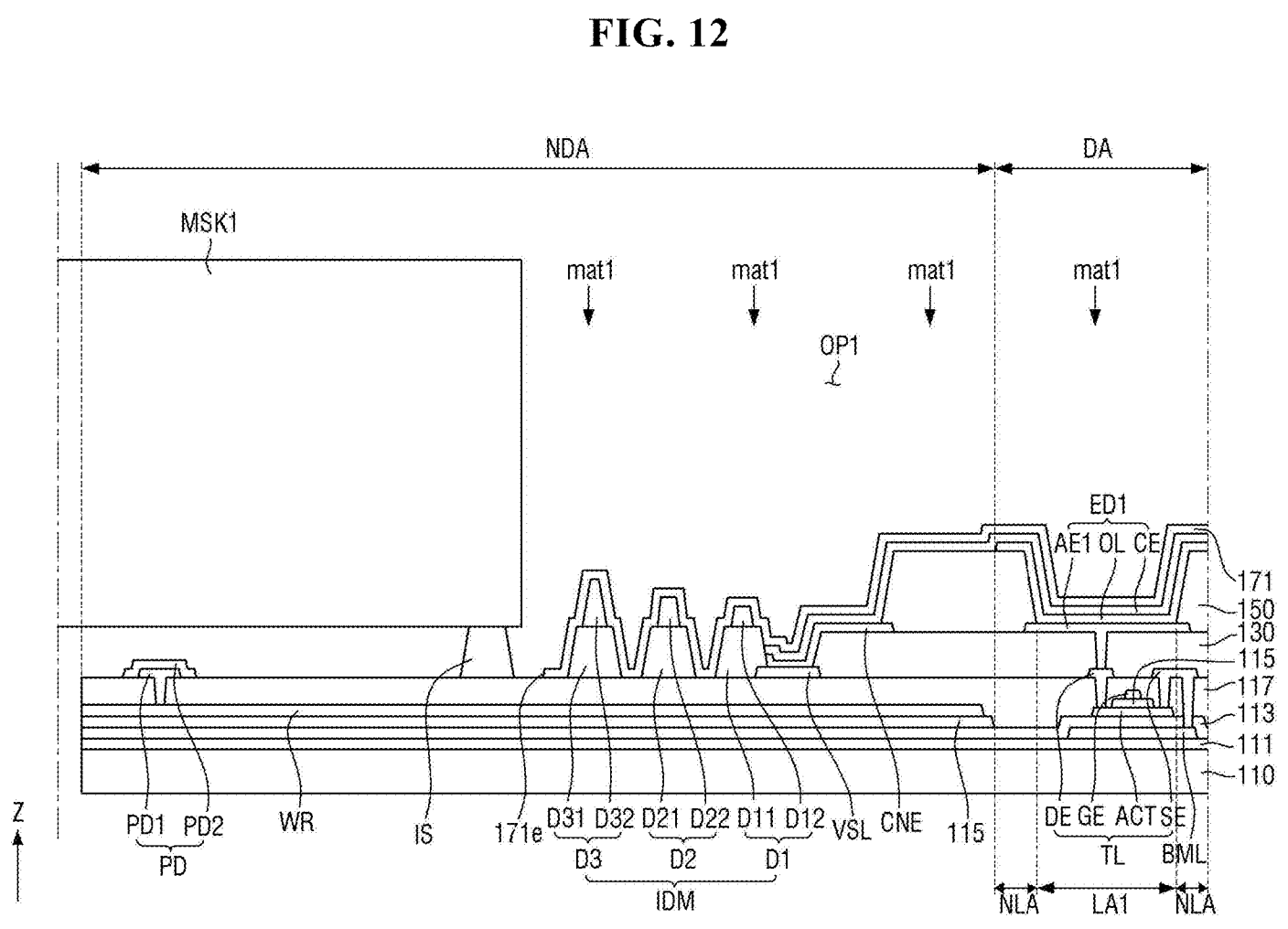
Figure 13:
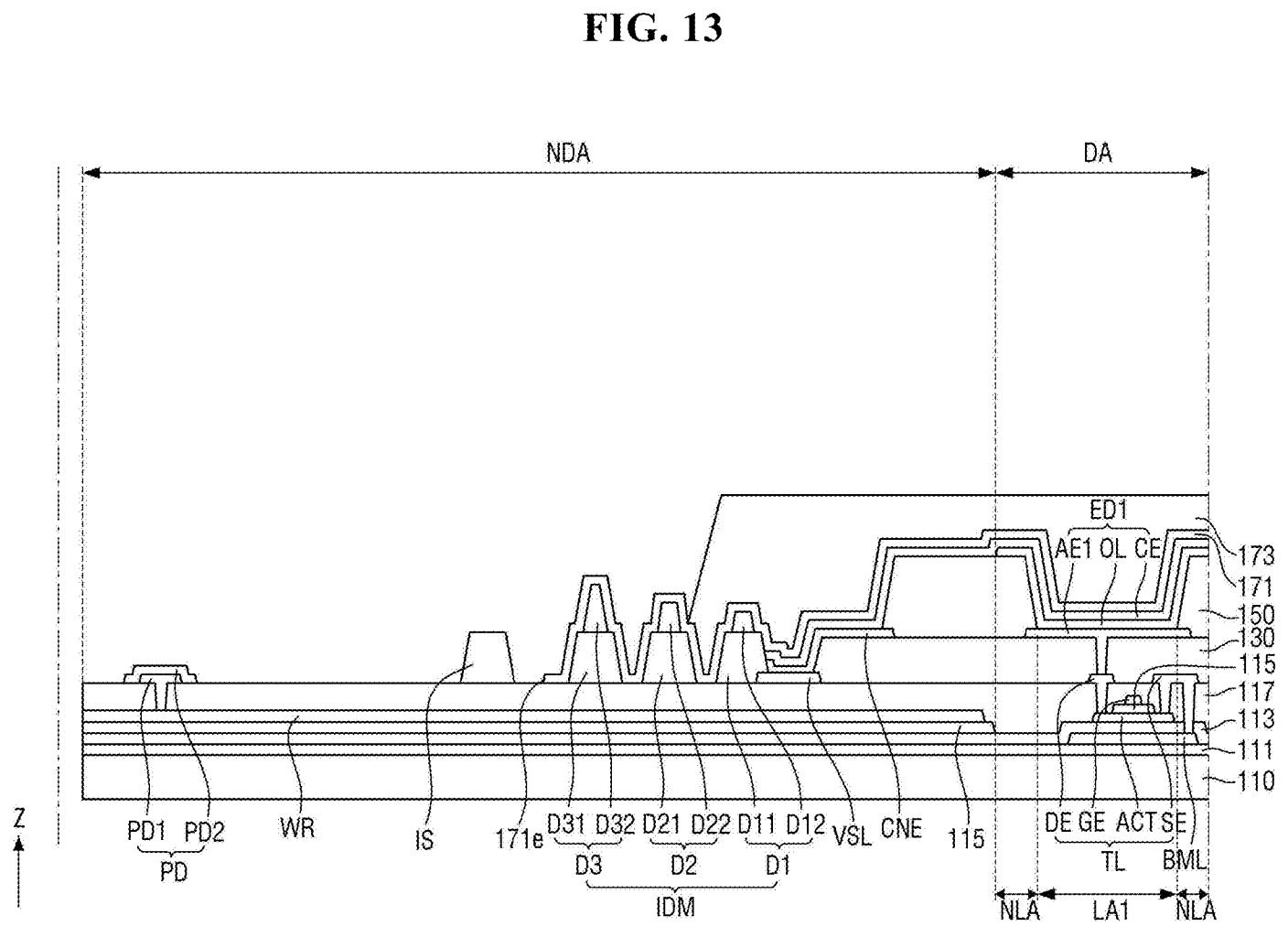
Figure 14:
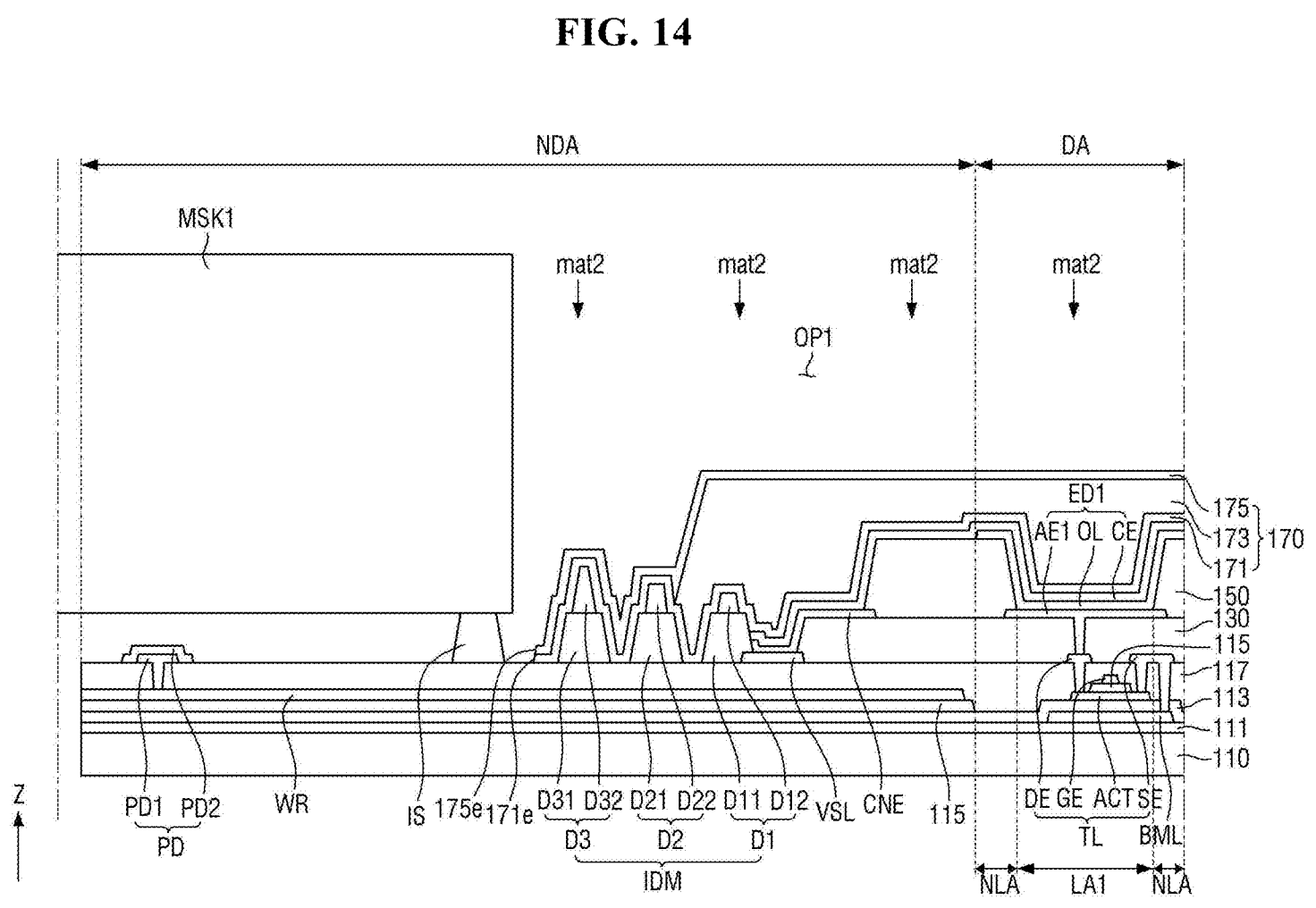

FIGS. 12 to 14 are views for describing a process of manufacturing a first encapsulation layer illustrated in FIG. 11, respectively.

Referring to FIGS. 12 to 14 in addition to FIG. 11, first, as illustrated in FIG. 12, after the cathode electrode CE is formed, a first mask MSK1 is disposed on the base part 110. The first mask MSK1 may be supported by the first support member IS, and may include an opening area OP1 corresponding to an area in which the first encapsulation layer 170 (see FIG. 11) is to be formed later. In some embodiments, in the first mask MSK1, one opening area OP1 may overlap the entirety of the display area DA and overlap a portion of the non-display area NDA in a plan view. For example, the first mask MSK1 may be an open mask.

Thereafter, when a first inorganic material mat1 for forming the first lower inorganic layer is deposited on the base part 110, the first lower inorganic layer 171 may be formed. In an area other than the opening area OP1, the first inorganic material mat1 is masked by the first mask MSK1 and thus, does not reach the base part 110. Therefore, the end 171*e* of the first lower inorganic layer 171 is positioned between the first support member IS and the first dam member IDM.

Thereafter, as illustrated in FIG. 13, an organic material is applied onto the first lower inorganic layer 171 by an inkjet method or the like and is photocured to form the first organic layer 173. In a process of forming the first organic layer 173, the organic material in a state before being cured has fluidity. Movement of the organic material having the fluidity may be blocked by the first dam member IDM, and accordingly, overflow of the organic material may be prevented.

Meanwhile, it has been illustrated in FIG. 13 that the first mask is not disposed, but this is only an example. The first organic layer 173 may also be formed in a state in which the first mask MSK1 illustrated in FIG. 12 is disposed on the first support member IS.

Thereafter, as illustrated in FIG. 14, when the first mask MSK1 is disposed on the first support member IS and a second inorganic material mat2 for forming the first upper inorganic layer is deposited on the first organic layer 173, the first upper inorganic layer 175 may be formed.

In the area other than the opening area OP1, the second inorganic material mat2 is masked by the first mask MSK1 and thus, does not reach the base part 110. Therefore, the end 175*e* of the first upper inorganic layer 175 is positioned between the first support member IS and the first dam member IDM. In addition, the first lower inorganic layer 171 and the first upper inorganic layer 175 may be formed using the same first mask MSK1, and thus, the end 171*e* of the first lower inorganic layer 171 and the end 175*e* of the first upper inorganic layer 175 may be substantially aligned with each other.

Figure 15:
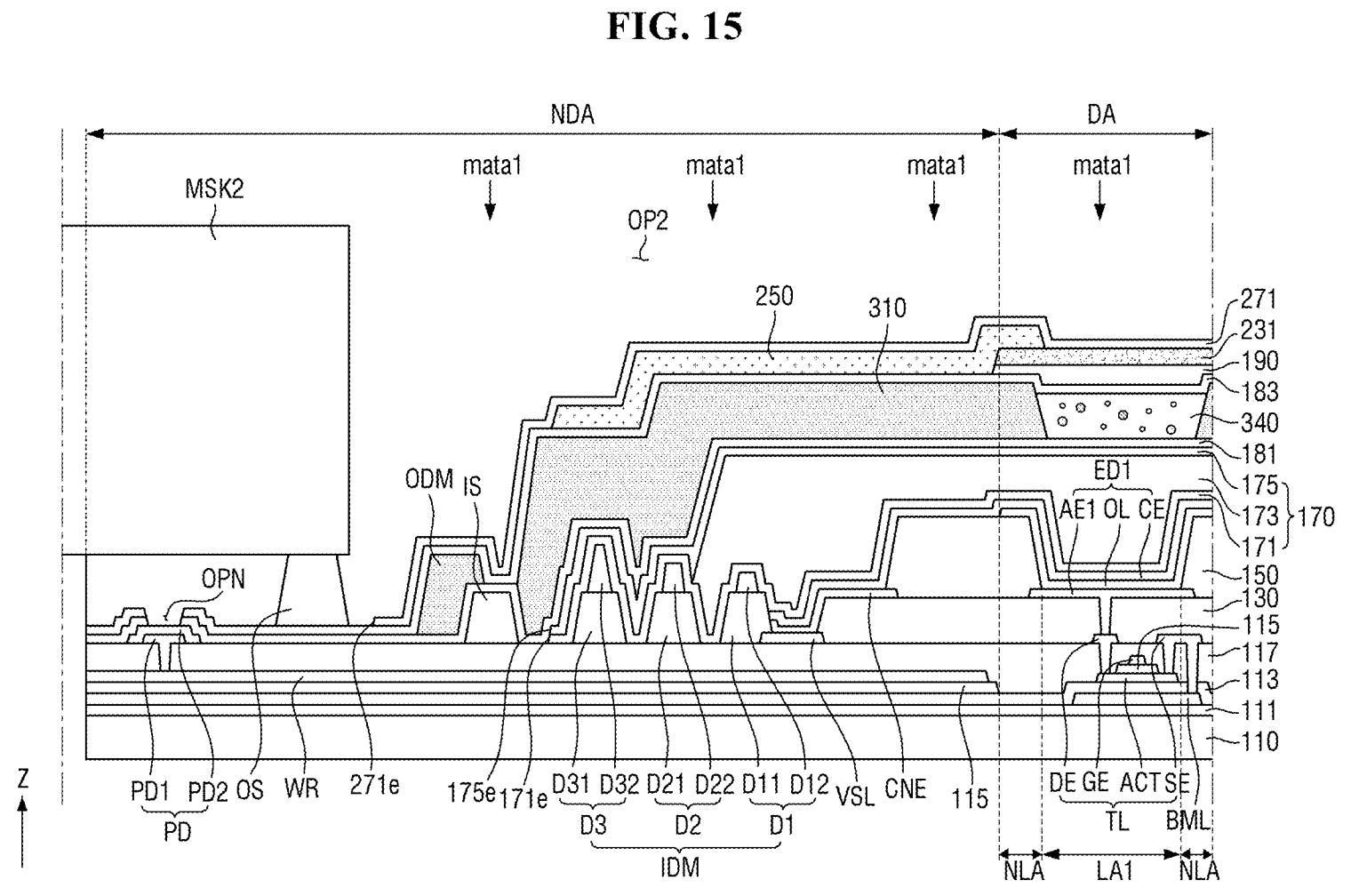
Figure 16:
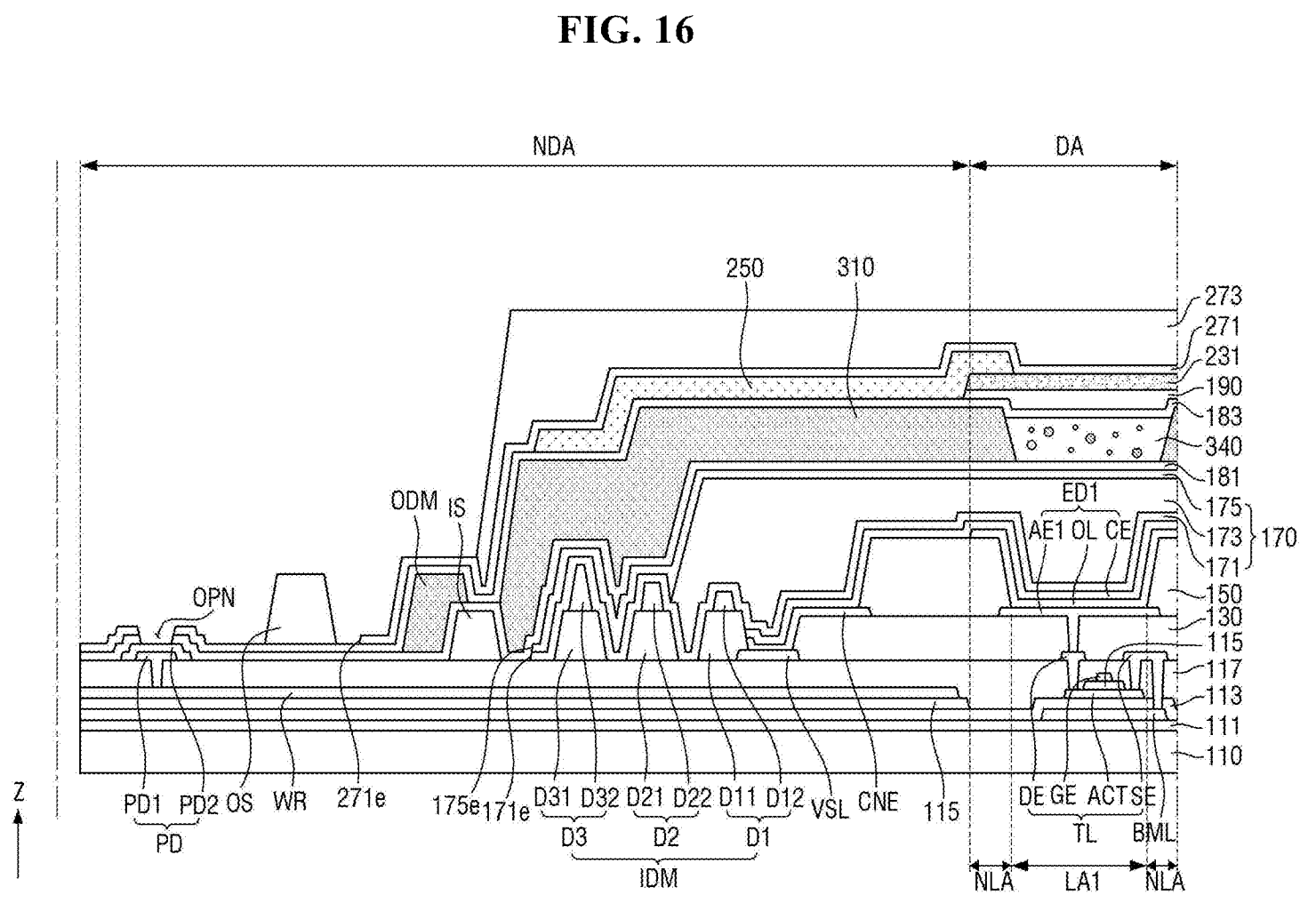
Figure 17:
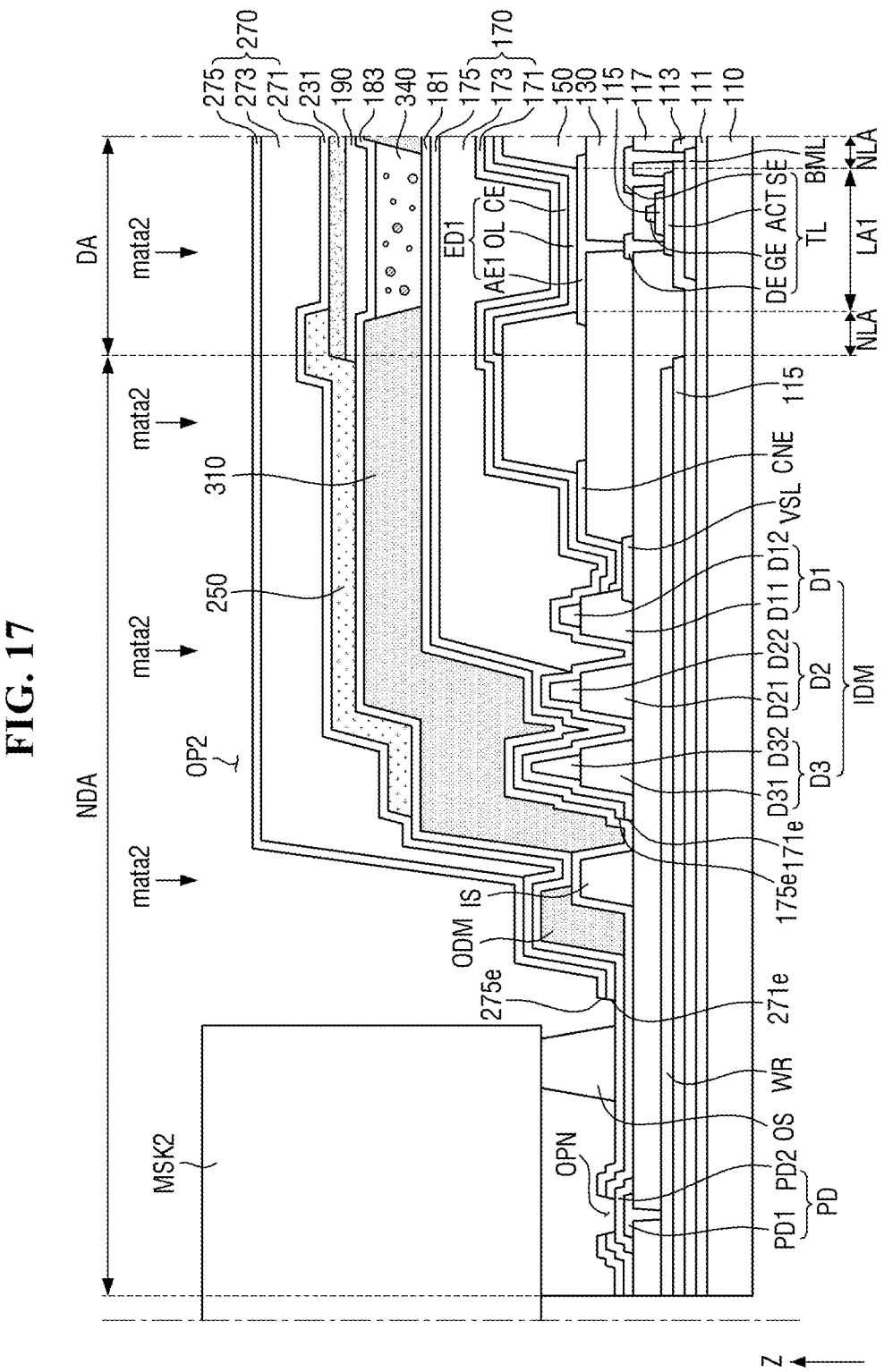

FIGS. 15 to 17 are views for describing a process of manufacturing a second encapsulation layer illustrated in FIG. 11, respectively.

Referring to FIGS. 15 to 17 in addition to FIG. 11, first, after the first color filter 231, the second color filter 233, the third color filter 235 and the color pattern 250 are formed, a second mask MSK2 is disposed on the base part 110, as illustrated in FIG. 15. The second mask MSK2 may be supported by the second support member OS, and may include an opening area OP2 corresponding to an area in which the second encapsulation layer 270 (see FIG. 11) is to be formed later.

In some embodiments, the opening area OP2 of the second mask MSK2 may be wider than the opening area OP1 of the first mask MSK1.

In some embodiments, in the second mask MSK2, one opening area OP2 may overlap the entirety of the display area DA and overlap a portion of the non-display area NDA in a plan view. For example, the second mask MSK2 may be an open mask.

Thereafter, when a third inorganic material mata1 for forming the second lower inorganic layer is deposited on the base part 110, the second lower inorganic layer 271 may be formed. In an area other than the opening area OP2, the third inorganic material mata1 is masked by the second mask MSK2 and thus, does not reach the base part 110. Therefore, the end 271*e* of the second lower inorganic layer 271 is positioned between the second support member OS and the second dam member ODM.

Thereafter, as illustrated in FIG. 16, an organic material is applied onto the second lower inorganic layer 271 by an inkjet method or the like and is photocured to form the second organic layer 273. Movement of the organic material for forming the second organic layer 273 in a state before being cued may be blocked by the second dam member ODM, and accordingly, overflow of the organic material may be prevented.

Meanwhile, it has been illustrated in FIG. 16 that the first mask is not disposed, but this is only an example. The second organic layer 273 may also be formed in a state in which the second mask MSK2 illustrated in FIG. 15 is disposed on the second support member OS.

Thereafter, as illustrated in FIG. 17, when the second mask MSK2 is disposed on the second support member OS and a fourth inorganic material mata2 for forming the second upper inorganic layer is deposited on the second organic layer 273, the second upper inorganic layer 275 may be formed.

A portion of the fourth inorganic material mata2 is masked by the second mask MSK2 in a deposition process and thus, does not reach the base part 110. Therefore, the end 275*e* of the second upper inorganic layer 275 is positioned between the second support member OS and the second dam member ODM. In addition, the second lower inorganic layer 271 and the second upper inorganic layer 275 may be formed using the same second mask MSK2, and thus, the end 271*e* of the second lower inorganic layer 271 and the end 275*e* of the second upper inorganic layer 275 may be substantially aligned with each other.

In the display device 1 according to the above-described embodiment, the first wavelength conversion pattern 340, the second wavelength conversion pattern 350, the light-transmitting pattern 330, the first color filter 231, the second color filter 233, and the third color filter 235 are sequentially positioned on the first encapsulation layer 170, and thus, the occurrence of misalignment between components may be prevented. In addition, the display device 1 does not include a separate substrate, and thus, a thickness of the display device 1 may be decreased. In addition, a distance between the light emitting element and the wavelength conversion pattern may be decreased, and thus, light efficiency may be increased.

In addition, in the display device 1, the first dam member IDM, the second dam member ODM, the first support member IS, and the second support member OS may be formed in a process of manufacturing components positioned in the display area DA, and thus, the corresponding components may be formed without adding a separate process.

Figure 18:
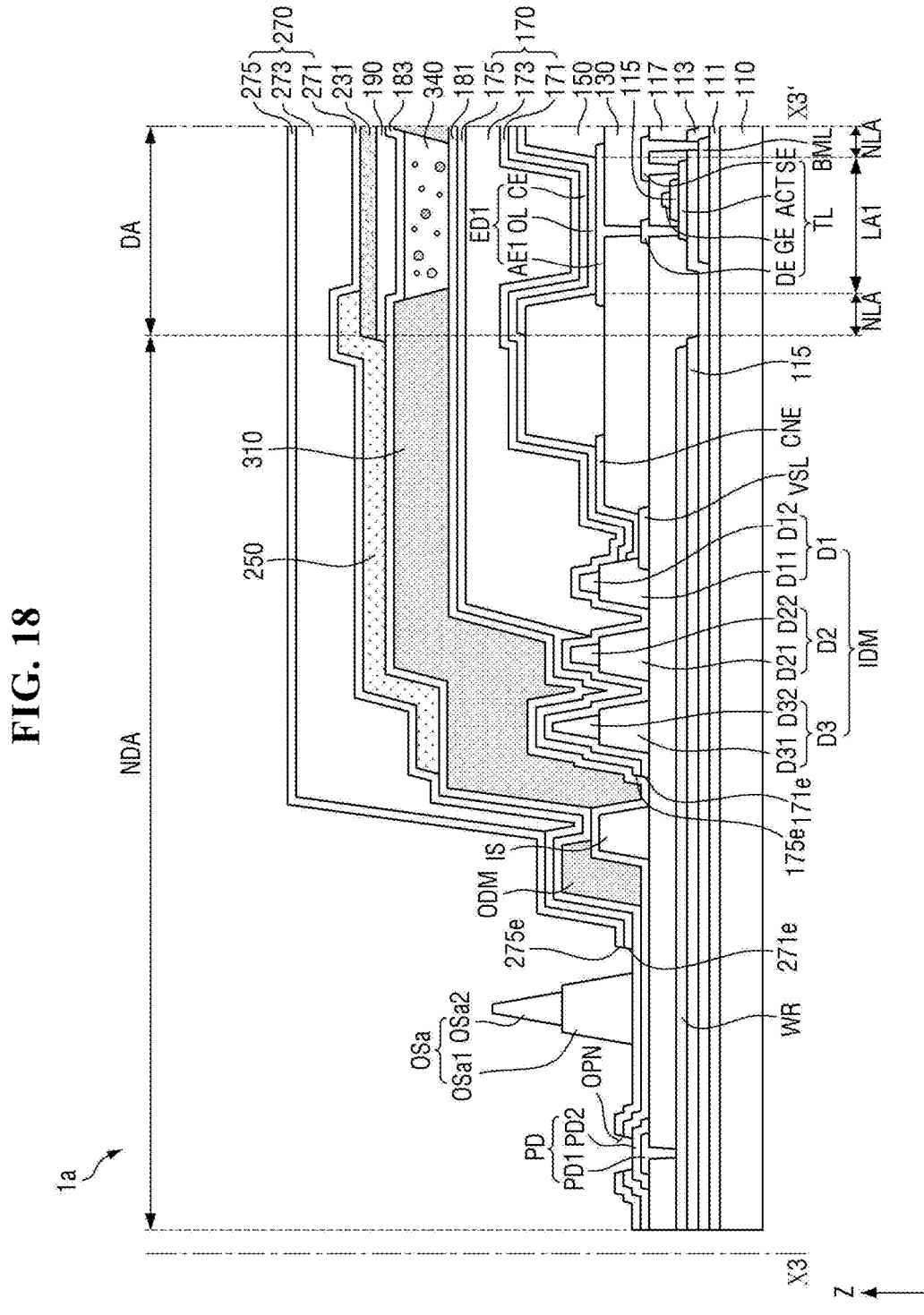
FIG. 18 is a cross-sectional view illustrating a modified example of the display device illustrated in FIG. 11.

FIG. 18 is a cross-sectional view illustrating a modified example of the display device illustrated in FIG. 11.

Referring to FIG. 18, a display device 1*a* according to the present embodiment is different from the display device according to an embodiment illustrated in FIGS. 4 to 11 in that it includes a second support member OSa, and is substantially the same as or similar to from the display device according to an embodiment illustrated in FIGS. 4 to 11 in other configurations. Accordingly, a description of overlapping contents will be omitted, and contents different from those described above will be mainly described.

The second support member OSa may include a lower support member OSa1 positioned on the second capping layer 183 and an upper support member OSa2 positioned on the lower support member OSa1.

In some embodiments, the lower support member OSa1 may be made of the same material as the overcoat layer 190, and may be formed together with the overcoat layer 190 in a process of forming the overcoat layer 190. In addition, the upper support member OSa2 may be made of the same material as any one of the first color filter 231, the second color filter 233, and the third color filter 235, and may be formed together with any one of the first color filter 231, the second color filter 233, and the third color filter 235 in a process of manufacturing any one of the first color filter 231, the second color filter 233, and the third color filter 235.

Alternatively, the lower support member OSa1 may be made of the same material as any one of the first color filter 231, the second color filter 233, and the third color filter 235, and may be formed together with any one of the first color filter 231, the second color filter 233, and the third color filter 235 in a process of manufacturing any one of the first color filter 231, the second color filter 233, and the third color filter 235. In addition, the upper support member OSa2 may be made of the same material as another of the first color filter 231, the second color filter 233, and the third color filter 235, and may be formed together with another of the first color filter 231, the second color filter 233, and the third color filter 235 in a process of manufacturing another of the first color filter 231, the second color filter 233, and the third color filter 235. For example, when the color filters are formed in the order of the first color filter 231, the second color filter 233, and the third color filter 235, the lower support member OSa1 may be made of the same material as the first color filter 231, and may be formed simultaneously with the first color filter 231 in a process of manufacturing the first color filter 231. In addition, the upper support member OSa2 may be made of the same material as the third color filter 235, and may be formed together with the third color filter 235 in a process of manufacturing the third color filter 235.

Figure 19:
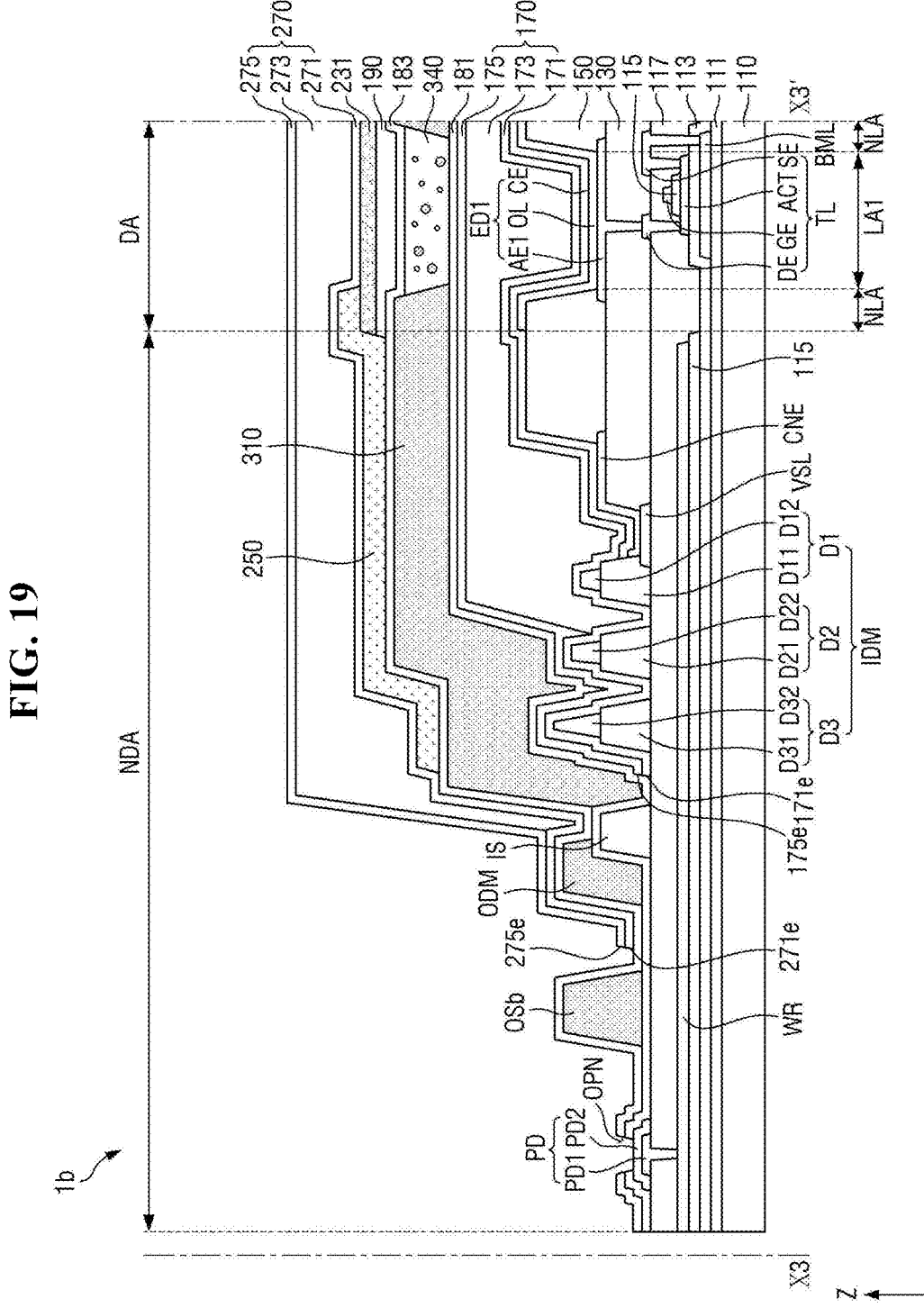
FIG. 19 is a cross-sectional view illustrating another modified example of the display device illustrated in FIG. 11.

FIG. 19 is a cross-sectional view illustrating another modified example of the display device illustrated in FIG. 11.

Referring to FIG. 18, a display device 1*a* according to the present embodiment is different from the display device according to an embodiment illustrated in FIGS. 4 to 11 in that it includes a second support member OSb, and is substantially the same as or similar to from the display device according to an embodiment illustrated in FIGS. 4 to 11 in other configurations. Accordingly, a description of overlapping contents will be omitted, and contents different from those described above will be mainly described.

The second support member OSb may be positioned between the first capping layer 181 and the second capping layer 183. In some embodiments, the second support member OSb may be made of the same material as the bank pattern 310 and may be formed together with the bank pattern 310 in a process of forming the bank pattern 310, similar to the second dam member ODM.

Figure 20:
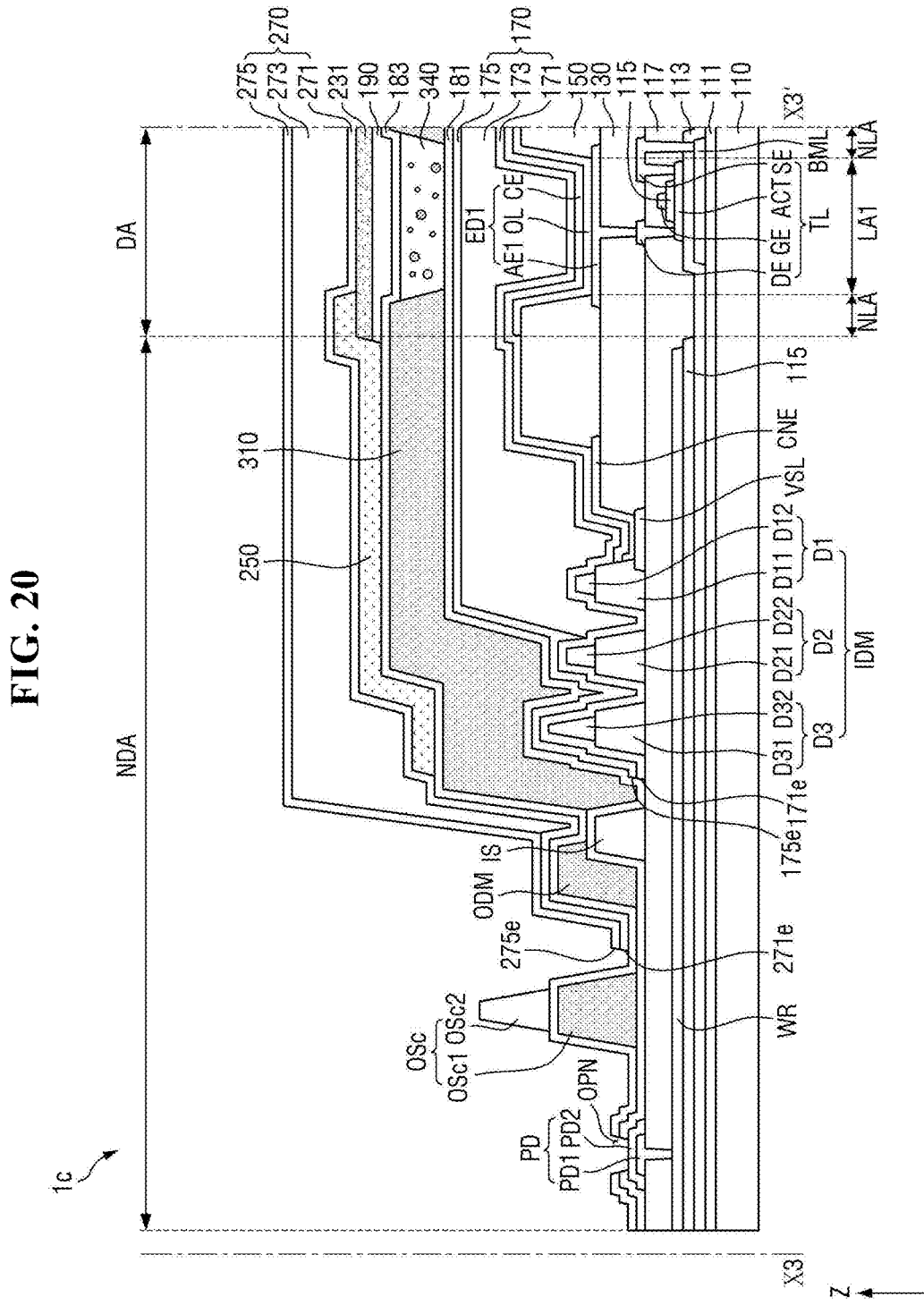
FIGS. 20 to 24 are cross-sectional views each illustrating other modified examples of the display device illustrated in FIG. 11.

FIG. 20 is a cross-sectional view illustrating still another modified example of the display device illustrated in FIG. 11.

Referring to FIG. 20, a display device 1*c* according to the present embodiment is different from the display device according to an embodiment illustrated in FIGS. 4 to 11 in that it includes a second support member OSc, and is substantially the same as or similar to from the display device according to an embodiment illustrated in FIGS. 4 to 11 in other configurations. Accordingly, a description of overlapping contents will be omitted, and contents different from those described above will be mainly described.

The second support member OSc may include a lower support member OSc1 positioned between the first capping layer 181 and the second capping layer 183 and an upper support member OSc2 positioned on the second capping layer 183 and overlapping the lower support member OSc1 in a plan view.

In some embodiments, the lower support member OSc1 may be made of the same material as the bank pattern 310 and may be formed together with the bank pattern 310 in a process of forming the bank pattern 310, similar to the second dam member ODM.

The upper support member OSc2 may include the same material as at least one of the overcoat layer 190, the first color filter 231, the second color filter 233, and the third color filter 235, and may be formed together with at least one of the overcoat layer 190, the first color filter 231, the second color filter 233, and the third color filter 235 in the same manufacturing process.

Figure 21:
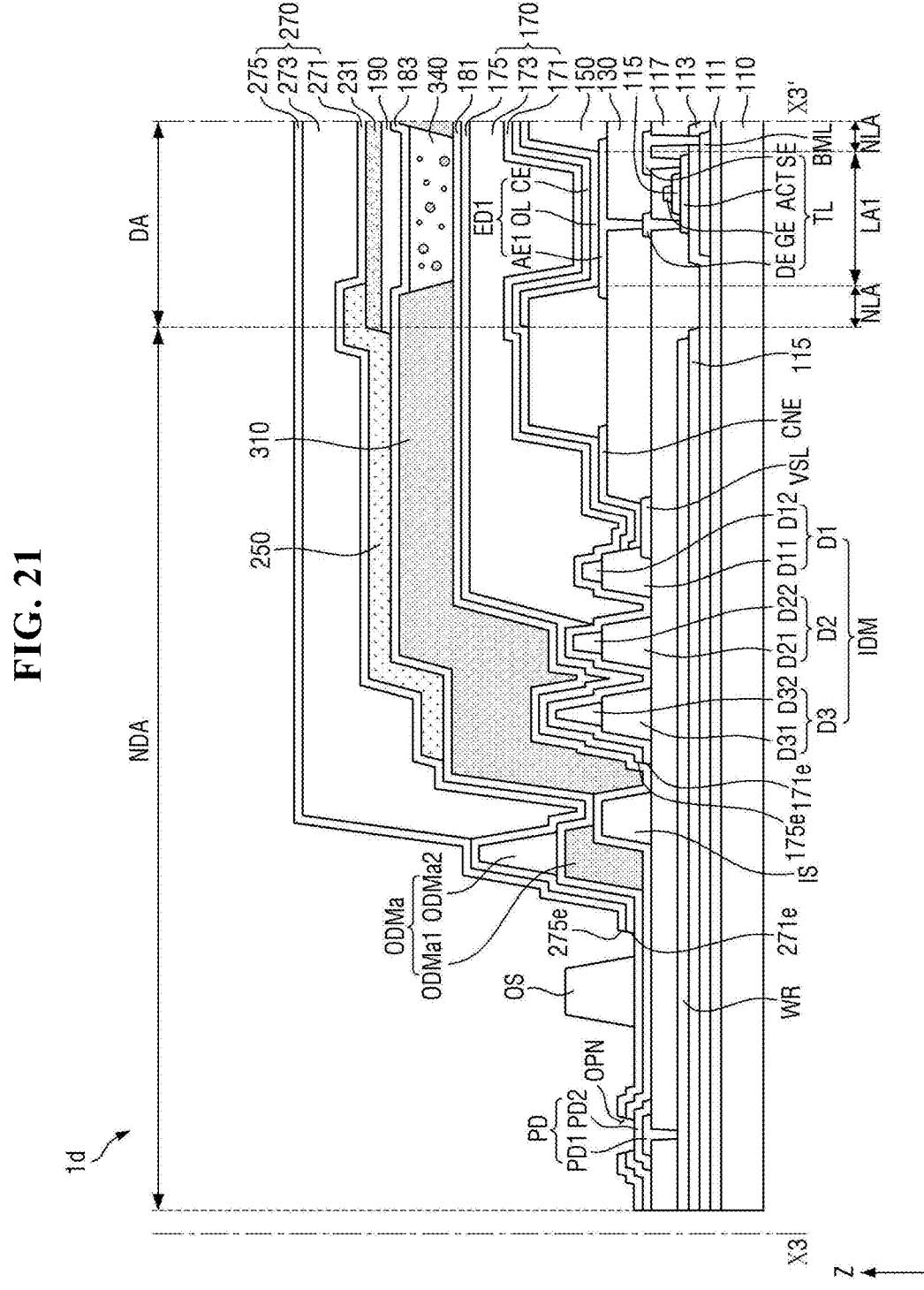

FIG. 21 is a cross-sectional view illustrating still another modified example of the display device illustrated in FIG. 11.

Referring to FIG. 21, a display device 1*d* according to the present embodiment is different from the display device according to an embodiment illustrated in FIGS. 4 to 11 in that it includes a second dam member ODMa, and is substantially the same as or similar to from the display device according to an embodiment illustrated in FIGS. 4 to 11 in other configurations. Accordingly, a description of overlapping contents will be omitted, and contents different from those described above will be mainly described.

The second dam member ODMa may include a lower dam pattern ODMa1 positioned on the first capping layer 181 and an upper dam pattern ODMa2 positioned on the lower dam pattern ODMa1. In some embodiments, the upper dam pattern ODMa2 may be positioned directly above the lower dam pattern ODMa1.

In some embodiments, the lower dam pattern ODMa1 may be made of the same material as the bank pattern 310, and may be formed simultaneously with the bank pattern 310 in the same process as the bank pattern 310.

In some embodiments, the upper dam pattern ODMa2 may include the same material as at least one of the overcoat layer 190, the first color filter 231, the second color filter 233, and the third color filter 235, and may be formed together with at least one of the overcoat layer 190, the first color filter 231, the second color filter 233, and the third color filter 235 in the same manufacturing process.

Figure 22:
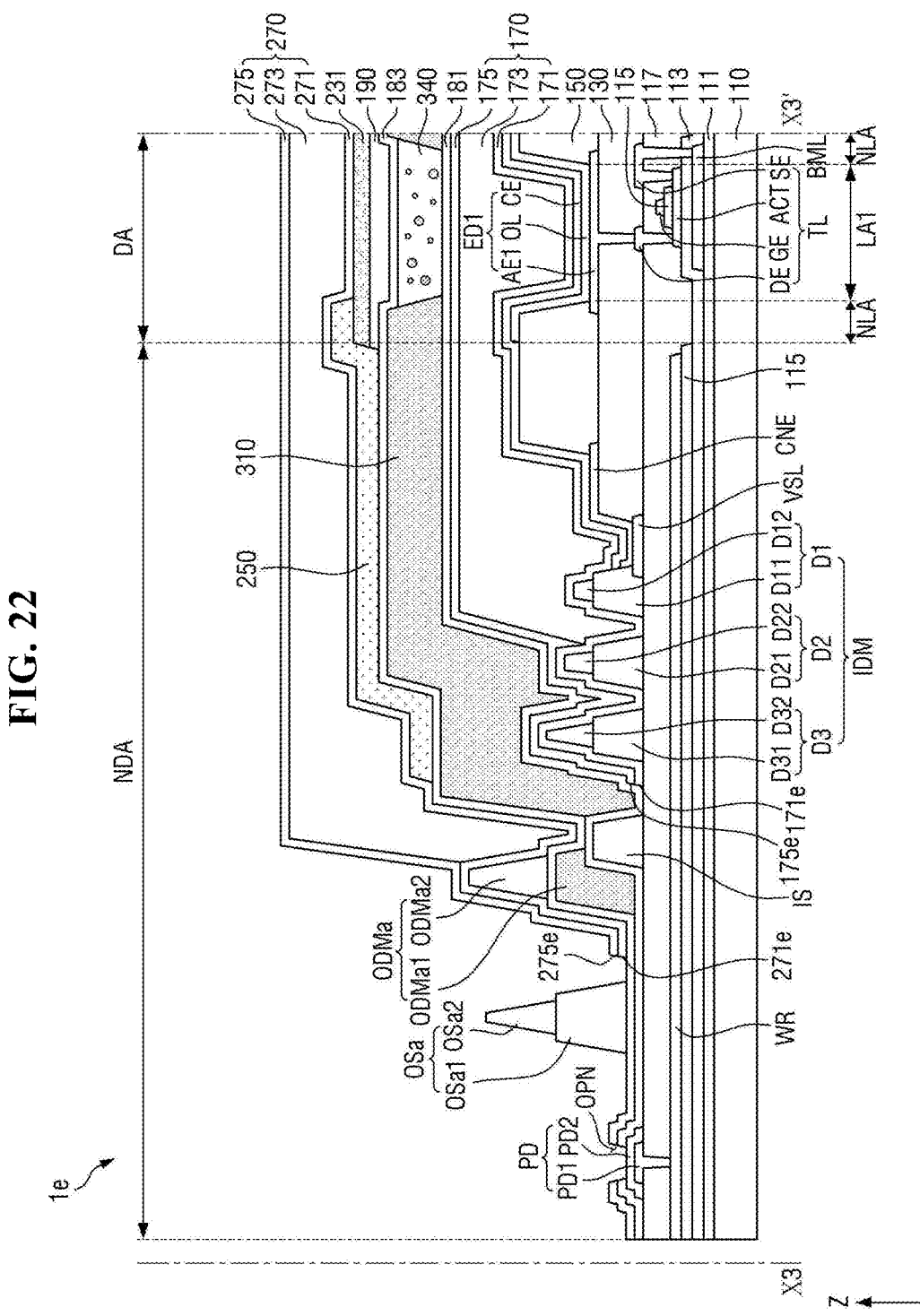

FIG. 22 is a cross-sectional view illustrating still another modified example of the display device illustrated in FIG. 11.

Referring to FIG. 22, a display device 1*e* according to the present embodiment is different from the display device according to an embodiment illustrated in FIGS. 4 to 11 in that it includes a second support member OSa and a second dam member ODMa, and is substantially the same as or similar to from the display device according to an embodiment illustrated in FIGS. 4 to 11 in other configurations. A more detailed description of the second support member OSa is the same as that described above in the description of FIG. 18 and a more detailed description of the second dam member ODMa is the same as that described above in the description of FIG. 21, and will thus be omitted.

Figure 23:
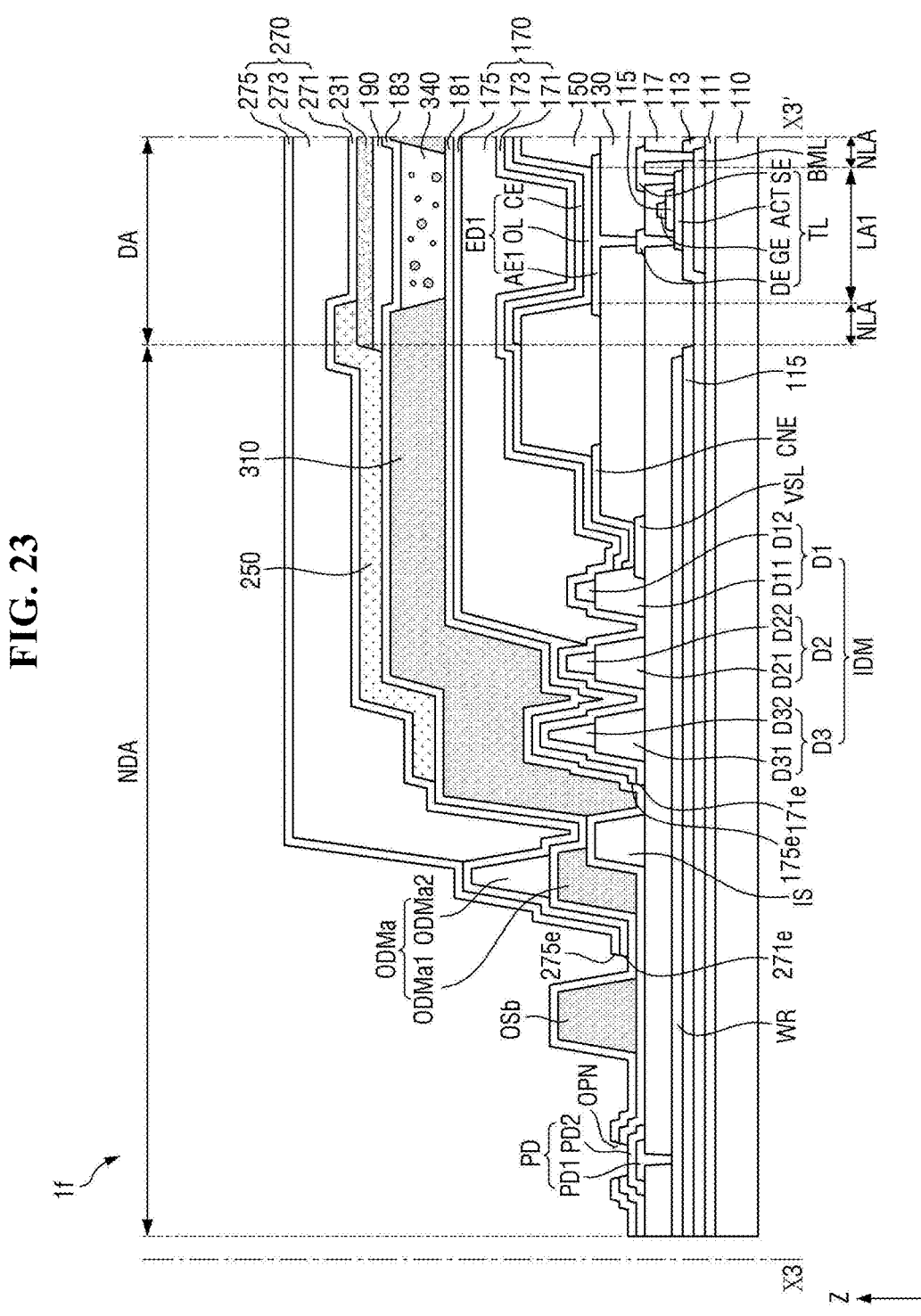

FIG. 23 is a cross-sectional view illustrating still another modified example of the display device illustrated in FIG. 11.

Referring to FIG. 23, a display device 1*f* according to the present embodiment is different from the display device according to an embodiment illustrated in FIGS. 4 to 11 in that it includes a second support member OSb and a second dam member ODMa, and is substantially the same as or similar to from the display device according to an embodiment illustrated in FIGS. 4 to 11 in other configurations. A more detailed description of the second support member OSb is the same as that described above in the description of FIG. 19 and a more detailed description of the second dam member ODMa is the same as that described above in the description of FIG. 21, and will thus be omitted.

Figure 24:
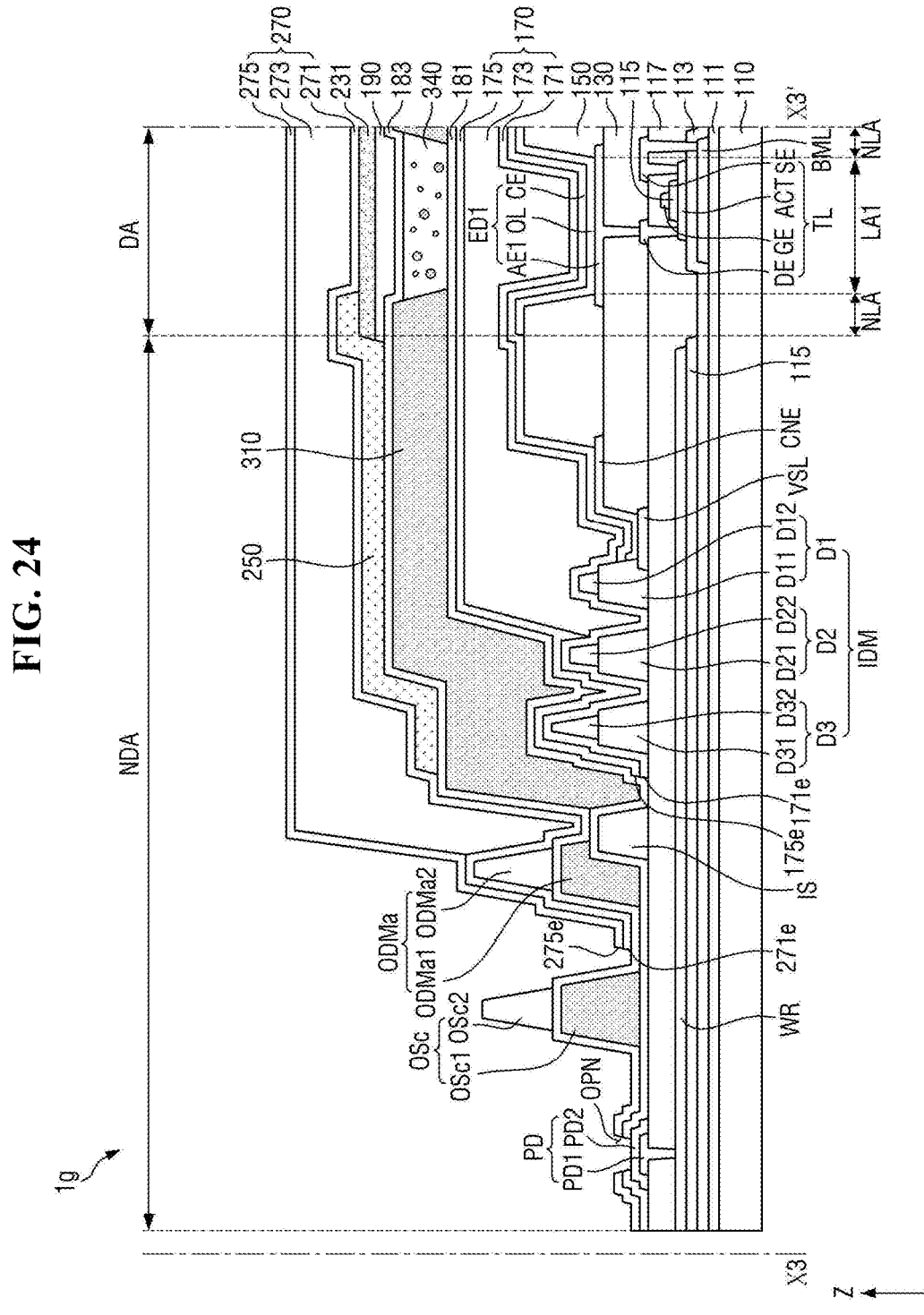

FIG. 24 is a cross-sectional view illustrating still another modified example of the display device illustrated in FIG. 11.

Referring to FIG. 24, a display device 1*g* according to the present embodiment is different from the display device according to an embodiment illustrated in FIGS. 4 to 11 in that it includes a second support member OSc and a second dam member ODMa, and is substantially the same as or similar to from the display device according to an embodiment illustrated in FIGS. 4 to 11 in other configurations. A more detailed description of the second support member OSc is the same as that described above in the description of FIG. 20 and a more detailed description of the second dam member ODMa is the same as that described above in the description of FIG. 21, and will thus be omitted.

Figure 25:
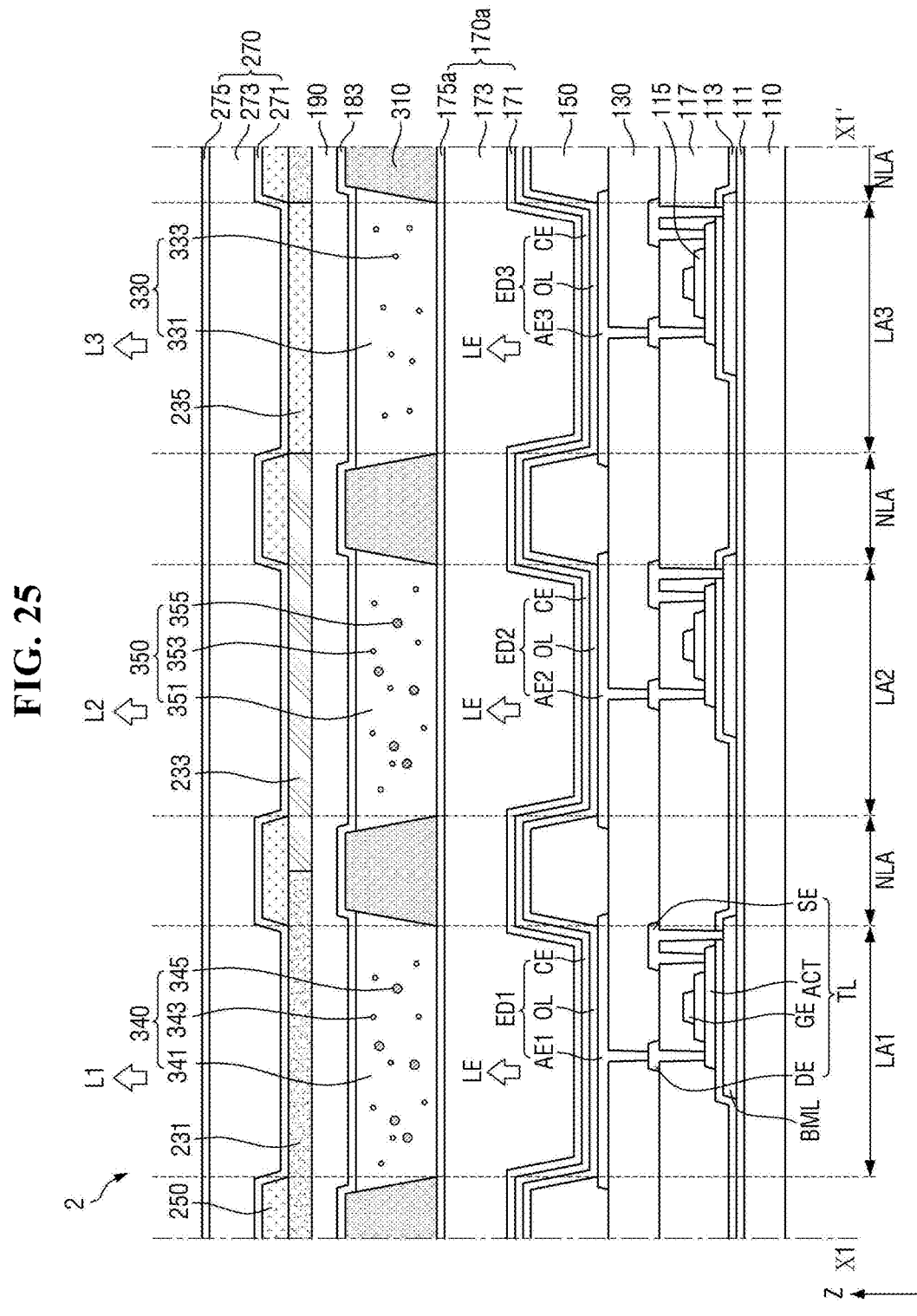
FIG. 25 is a cross-sectional view of a display device according to another embodiment taken along line X1-X1' of FIG. 2.
Figure 26:
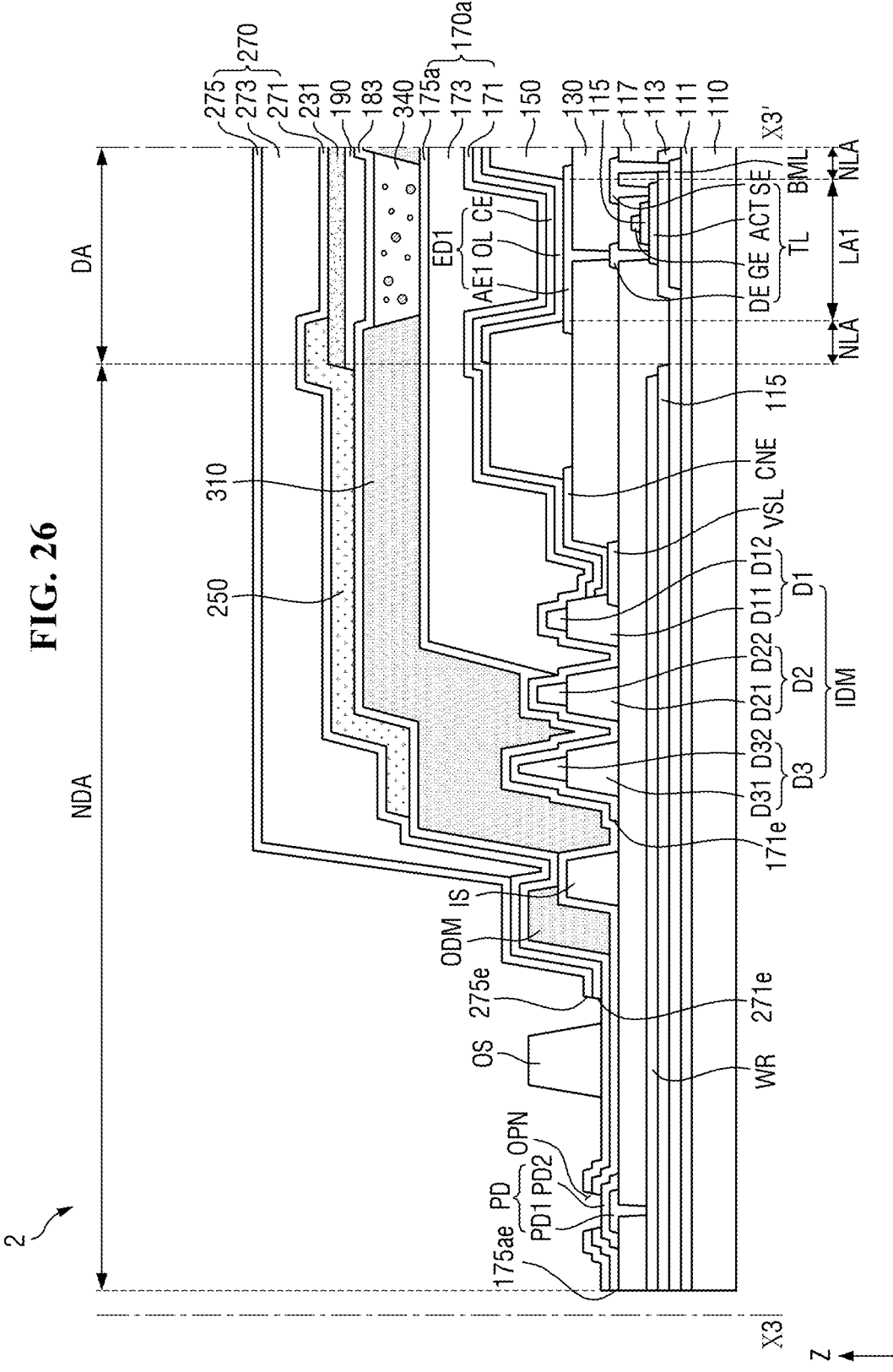
FIG. 26 is a cross-sectional view of the display device according to another embodiment taken along line X3-X3' of FIG. 10.

FIG. 25 is a cross-sectional view of a display device according to another embodiment taken along line X1-X1' of FIG. 2, and FIG. 26 is a cross-sectional view of the display device according to another embodiment taken along line X3-X3' of FIG. 10.

Referring to FIGS. 25 and 26, a display device 2 according to the present embodiment is different from the display device according to an embodiment of FIGS. 4 to 11 in that the first capping layer 181 (see FIGS. 4 and 11) is omitted and the display device 2 includes a first encapsulation layer 170a, and is substantially the same as or similar to from the display device according to an embodiment of FIGS. 4 to 11 in other configurations. Accordingly, a description of over-lapping contents will be omitted.

The first encapsulation layer 170a includes a first lower inorganic layer 171, a first organic layer 173 positioned on the first lower inorganic layer 171, and a first upper inorganic layer 175a positioned on the first organic layer 173.

A description of the first lower inorganic layer 171 and the first organic layer 173 are the same as that described above in the description of FIGS. 4 to 11.

The first upper inorganic layer 175a may be positioned over the display area DA and the non-display area NDA, may cover not only the first dam member IDM but also the first support member IS, and may also cover a portion of the connection pad PD.

In some embodiments, the first upper inorganic layer 175a may be positioned over the entire surface of the base part 110. Accordingly, an end 175ae of the first upper inorganic layer 175a may be positioned on an edge side of the base part 110, and may be positioned relatively outside the second support member OS. In other words, the second support member OS may be positioned between the end 175ae of the first upper inorganic layer 175a and the display area DA.

The end 171e of the first lower inorganic layer 171 is positioned between the first support member IS and the first dam member IDM and the end 175ae of the first upper inorganic layer 175a is positioned outside the second support member OS, and thus, the end 171e of the first lower inorganic layer 171 and the end 175ae of the first upper inorganic layer 175a may not be aligned with each other.

All of the first wavelength conversion pattern 340, the second wavelength conversion pattern 350, the light-transmitting pattern 330, the bank pattern 310, and the second dam member ODM may be positioned between the first upper inorganic layer 175a and the second capping layer 183.

The first upper inorganic layer 175a may be in direct contact with the second capping layer 183 in the non-display area NDA to form an inorganic-inorganic junction, and accordingly, may seal the first wavelength conversion pattern 340, the second wavelength conversion pattern 350, and the light-transmitting pattern 330.

In some embodiments, an opening OPN exposing the connection pad PD may be defined in the first upper inorganic layer 175a and the second capping layer 183.

Figure 27:
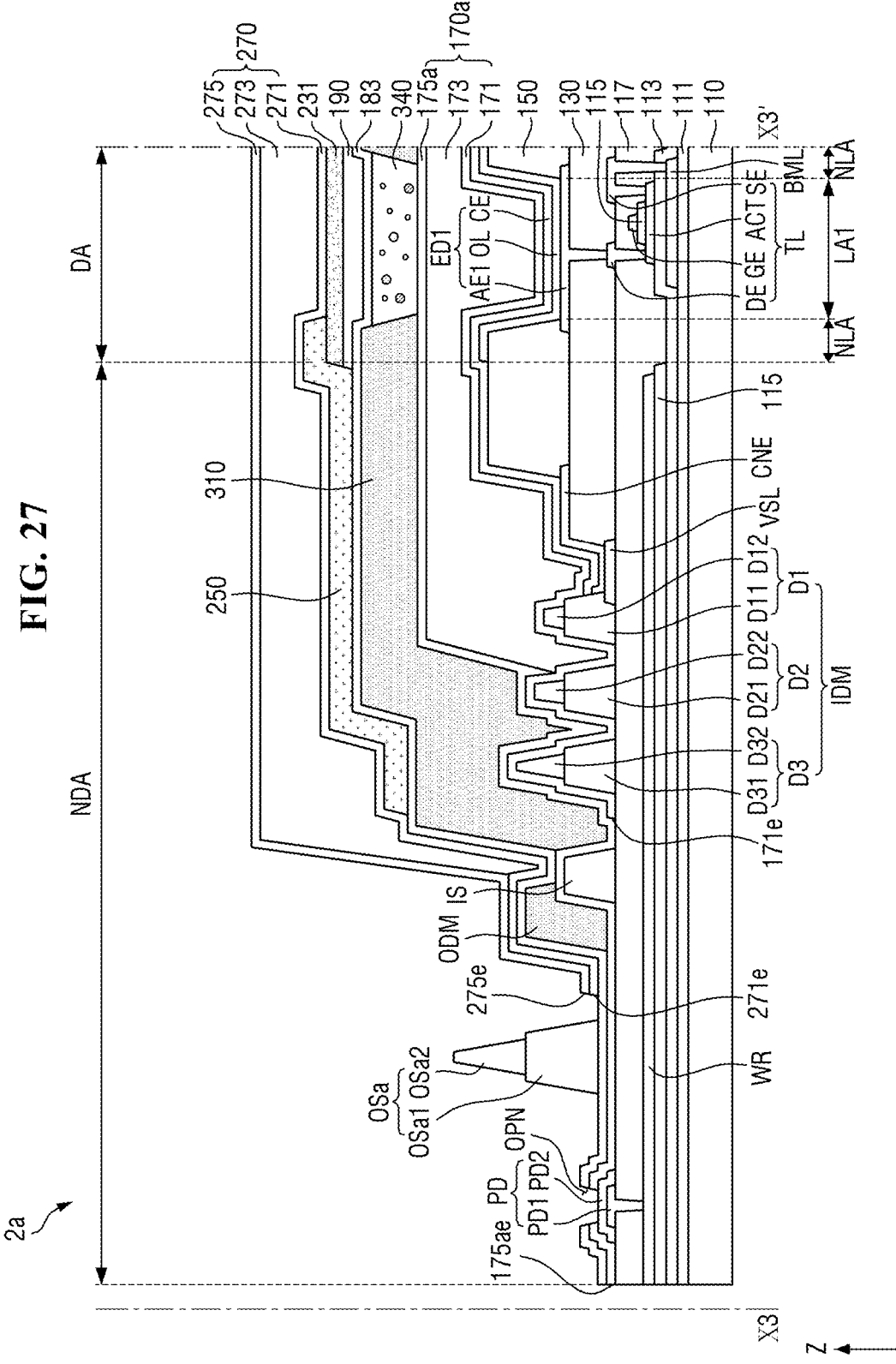
FIG. 27 is a cross-sectional view illustrating a modified example of the display device illustrated in FIG. 26.

FIG. 27 is a cross-sectional view illustrating a modified example of the display device illustrated in FIG. 26.

Referring to FIG. 27, a display device 2a according to the present embodiment is different from the display device according to an embodiment of FIG. 26 in that it includes a second support member OSa, and is substantially the same as or similar to from the display device according to an embodiment of FIG. 26 in other configurations. A more detailed description of the second support member OSa is the same as that described above in an embodiment of FIG. 18, and will thus be omitted.

Figure 28:
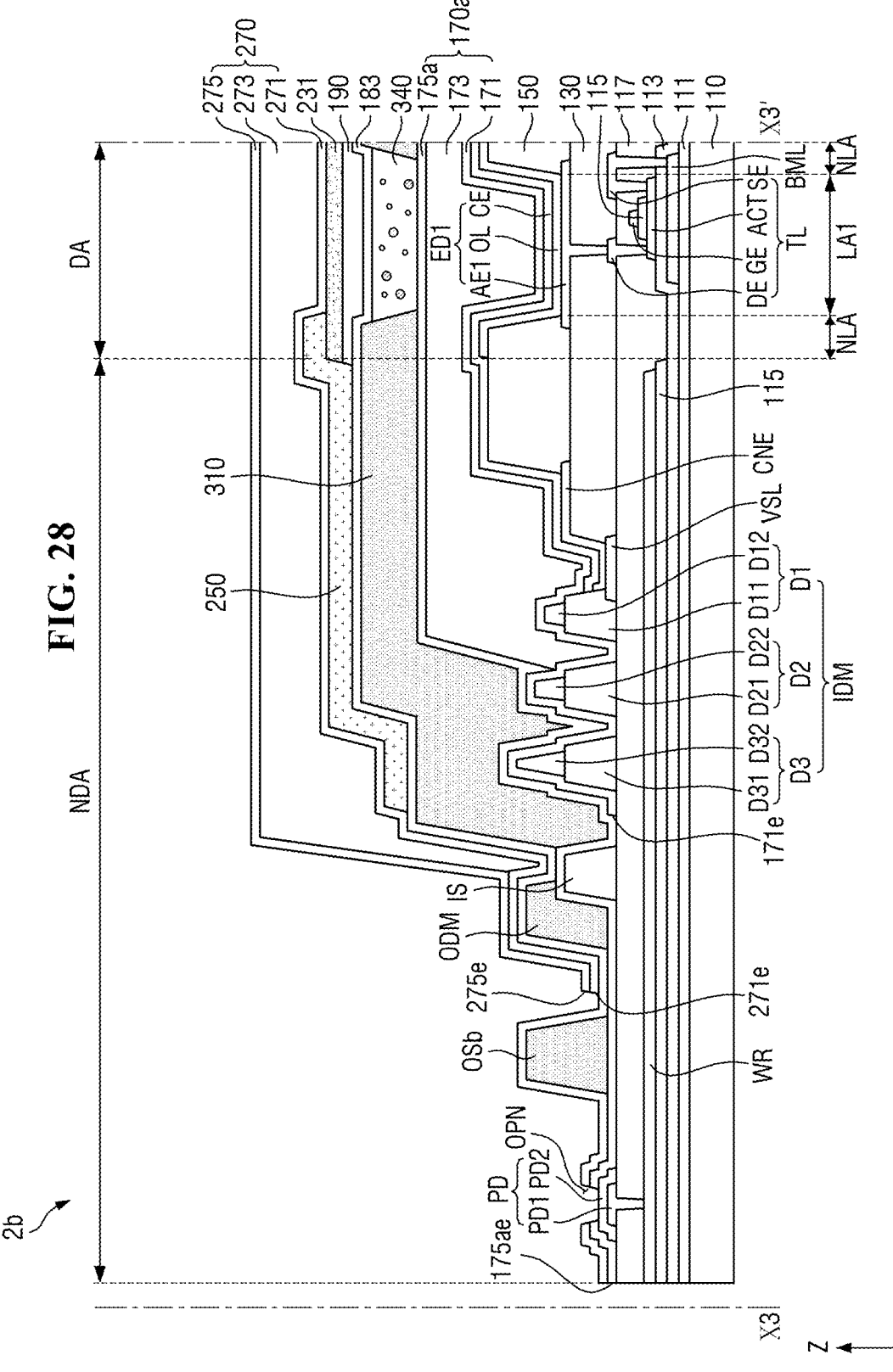
FIG. 28 is a cross-sectional view illustrating another modified example of the display device illustrated in FIG. 26.

FIG. 28 is a cross-sectional view illustrating another modified example of the display device illustrated in FIG. 26.

Referring to FIG. 28, a display device 2b according to the present embodiment is different from the display device according to an embodiment of FIG. 26 in that it includes a second support member OSb, and is substantially the same as or similar to from the display device according to an embodiment of FIG. 26 in other configurations. A more detailed description of the second support member OSb is the same as or similar to that described above in an embodiment of FIG. 19, and will thus be omitted.

Figure 29:
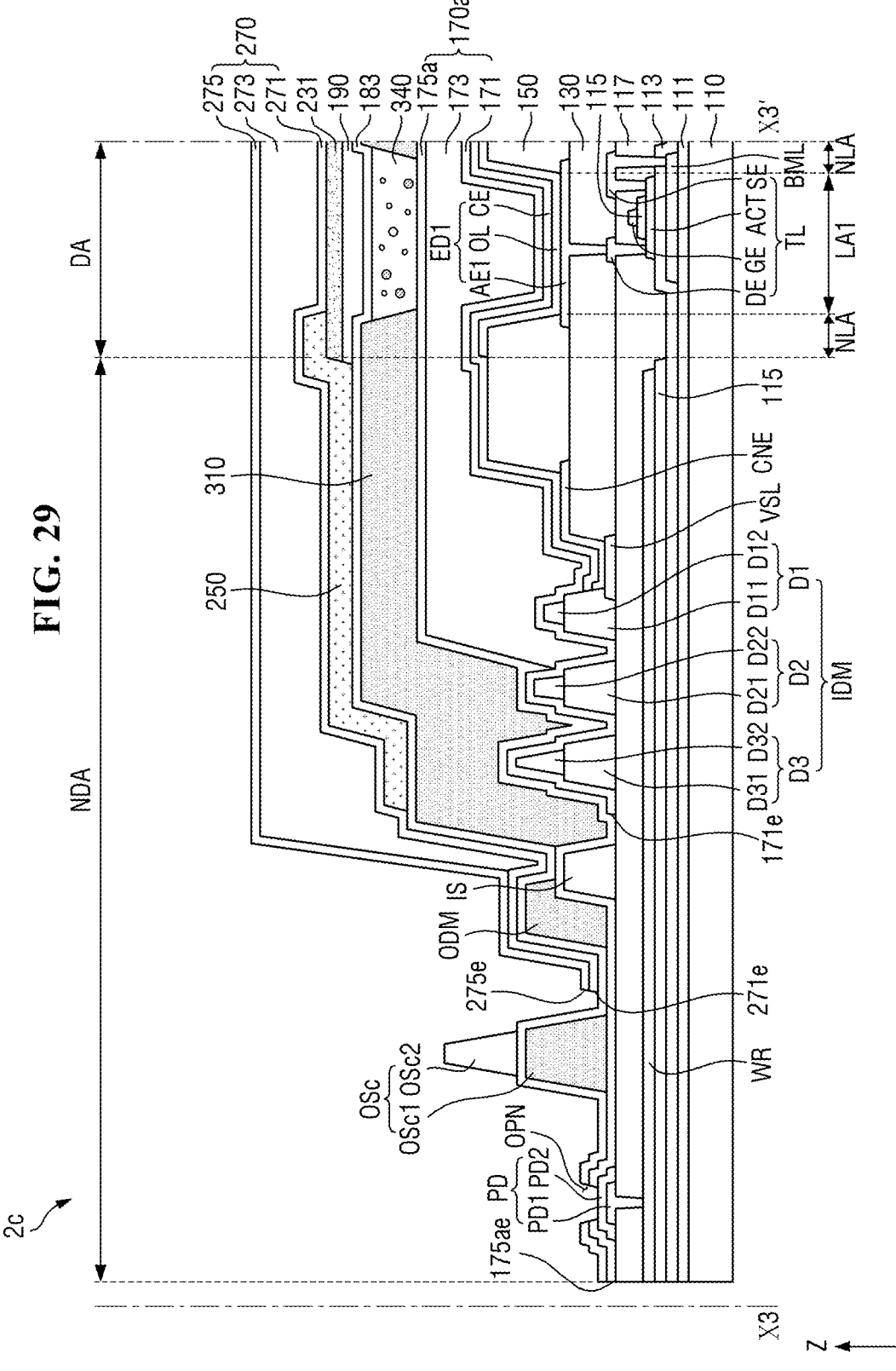
FIGS. 29 to 33 are cross-sectional views each illustrating other modified examples of the display device illustrated in FIG. 26.

FIG. 29 is a cross-sectional view illustrating a modified example of the display device illustrated in FIG. 26.

Referring to FIG. 29, a display device 2c according to the present embodiment is different from the display device according to an embodiment of FIG. 26 in that it includes a second support member OSc, and is substantially the same as or similar to from the display device according to an embodiment of FIG. 26 in other configurations. A more detailed description of the second support member OSc is the same as or similar to that described above in an embodiment of FIG. 20, and will thus be omitted.

Figure 30:
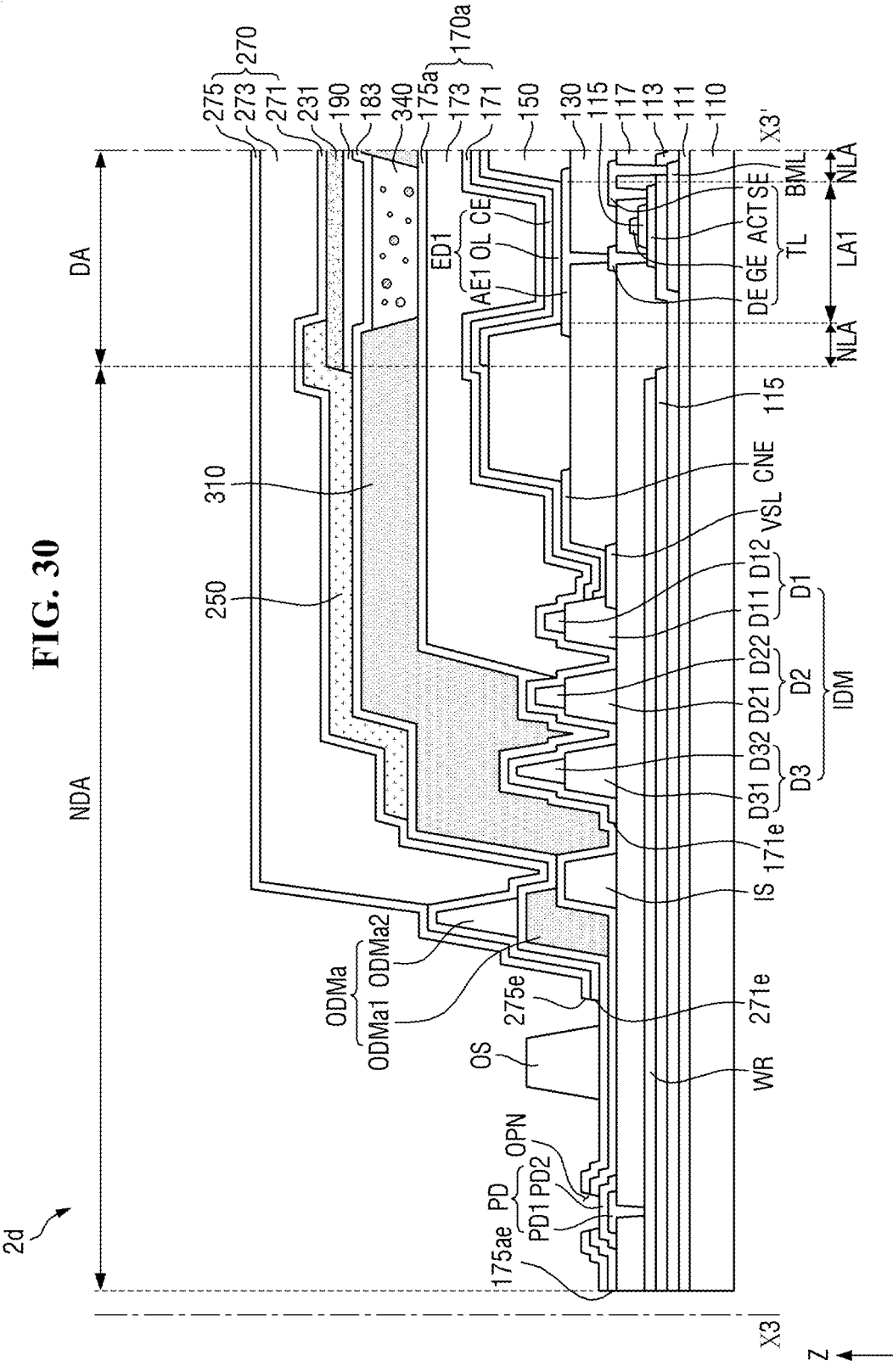

FIG. 30 is a cross-sectional view illustrating still another modified example of the display device illustrated in FIG. 26.

Referring to FIG. 30, a display device 2d according to the present embodiment is different from the display device according to an embodiment of FIG. 26 in that it includes a second dam member ODMa, and is substantially the same as or similar to from the display device according to an embodiment of FIG. 26 in other configurations. A more detailed description of the second dam member ODMa is the same as or similar to that described above in an embodiment of FIG. 21, and will thus be omitted.

Figure 31:
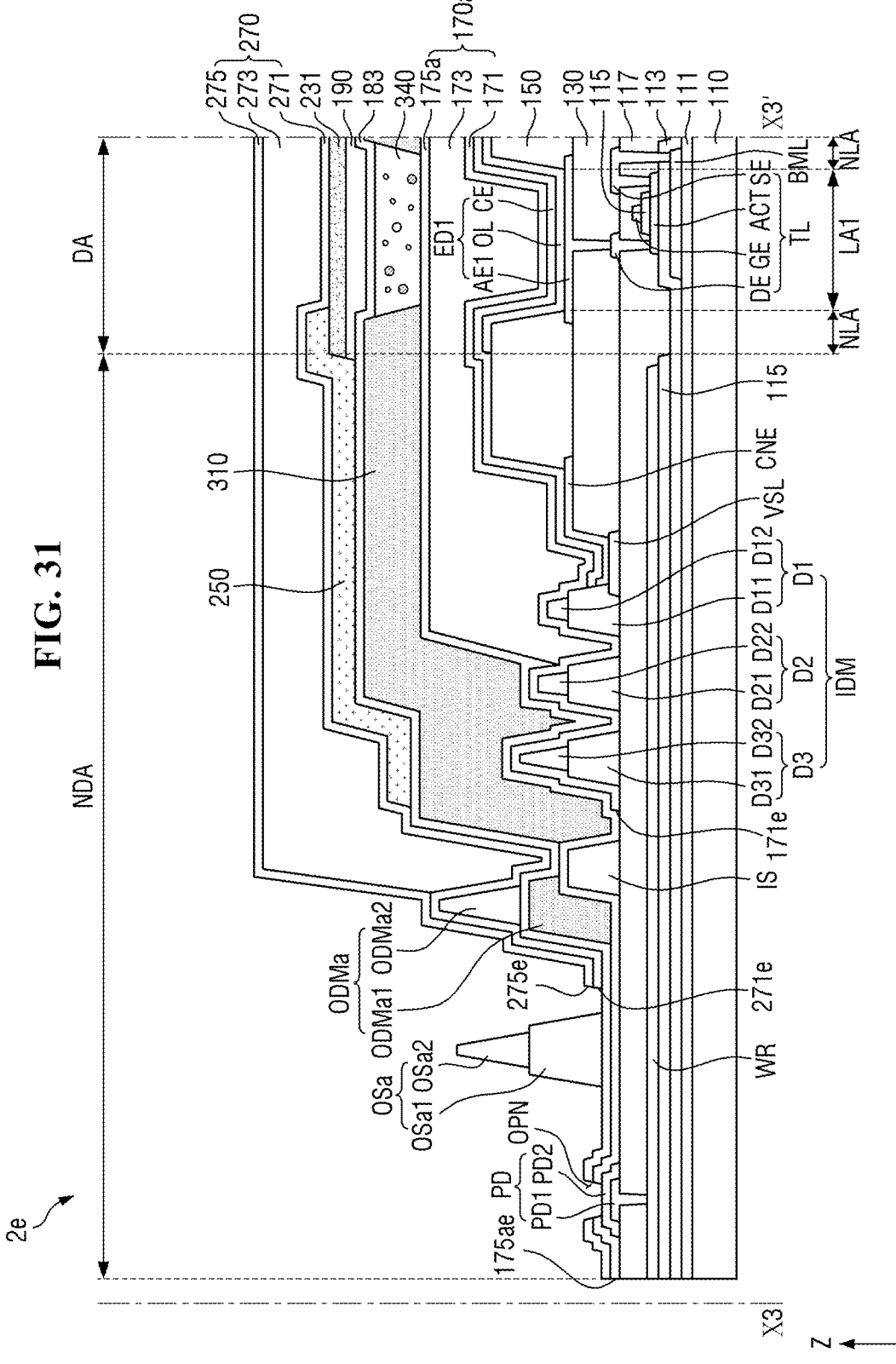

FIG. 31 is a cross-sectional view illustrating still another modified example of the display device illustrated in FIG. 26.

Referring to FIG. 31, a display device 2e according to the present embodiment is different from the display device according to an embodiment of FIG. 26 in that it includes a second dam member ODMa and a second support member OSa, and is substantially the same as or similar to from the display device according to an embodiment of FIG. 26 in other configurations. A more detailed description of the second dam member ODMa is the same as or similar to that described above in an embodiment of FIG. 21 and a more detailed description of the second support member OSa is the same as or similar to that described above in an embodiment of FIG. 18, and will thus be omitted.

Figure 32:
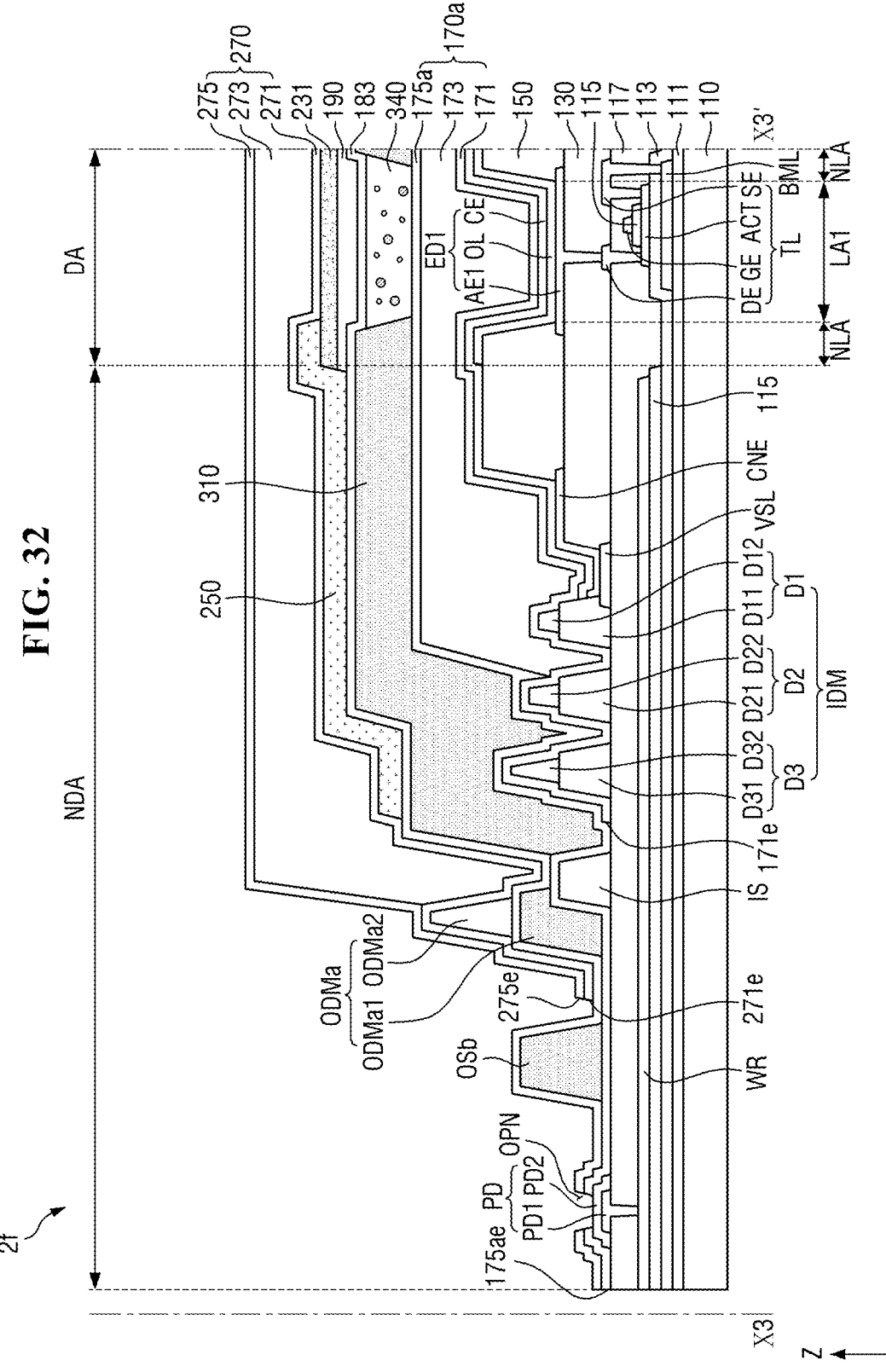

FIG. 32 is a cross-sectional view illustrating still another modified example of the display device illustrated in FIG. 26.

Referring to FIG. 32, a display device 2f according to the present embodiment is different from the display device according to an embodiment of FIG. 26 in that it includes a second dam member ODMa and a second support member OSb, and is substantially the same as or similar to from the display device according to an embodiment of FIG. 26 in other configurations. A more detailed description of the second dam member ODMa is the same as or similar to that described above in an embodiment of FIG. 21 and a more detailed description of the second support member OSb is the same as or similar to that described above in an embodiment of FIG. 19, and will thus be omitted.

Figure 33:
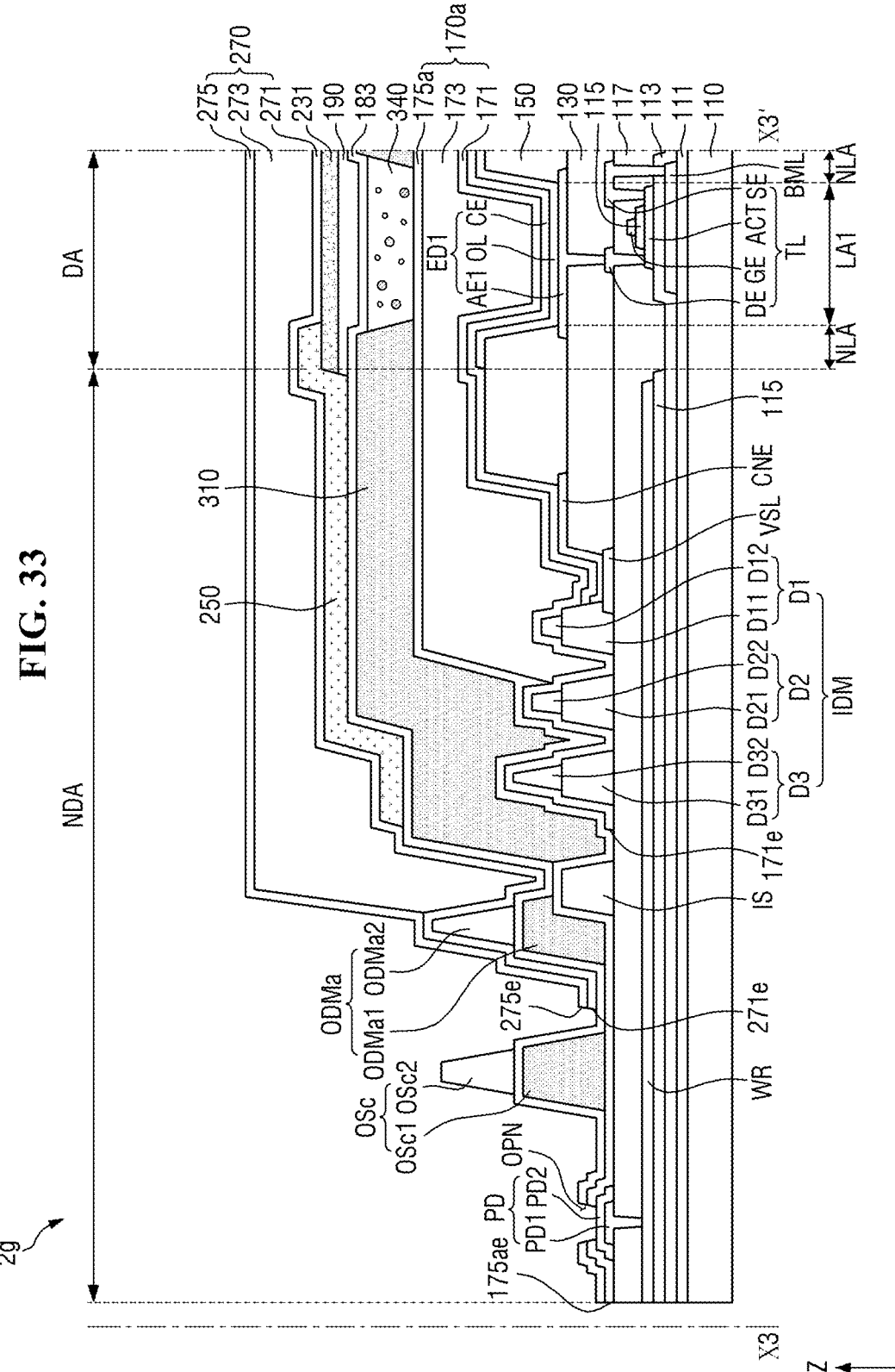

FIG. 33 is a cross-sectional view illustrating still another modified example of the display device illustrated in FIG. 26.

Referring to FIG. 33, a display device 2g according to the present embodiment is different from the display device according to an embodiment of FIG. 26 in that it includes a second dam member ODMa and a second support member OSc, and is substantially the same as or similar to from the display device according to an embodiment of FIG. 26 in other configurations. A more detailed description of the second dam member ODMa is the same as or similar to that described above in an embodiment of FIG. 21 and a more detailed description of the second support member OSc is the same as or similar to that described above in an embodiment of FIG. 20, and will thus be omitted.

Meanwhile, although not illustrated in the drawings, the structure of the display device may be variously modified in addition to the above-described embodiments. For example, structures exemplified as the structures of the second support member may be applied as the structures of the second dam member. For example, the second dam member may include the same material as the overcoat layer or the color filter.

The embodiments of the present disclosure have been described hereinabove with reference to the accompanying drawings, but it will be understood by one of ordinary skill in the art to which the present disclosure pertains that various modifications and alterations may be made without departing from the technical spirit or essential feature of the present disclosure. Therefore, it is to be understood that the embodiments described above are illustrative rather than being restrictive in all aspects.

The invention claimed is:

1. A display device comprising:
a base part in which a display area and a non-display area around the display area are defined;
a first dam member, a first support member, a second dam member, and a second support member positioned on the base part and positioned in the non-display area;
a light emitting element positioned on the base part and positioned in the display area,
a first encapsulation layer positioned on the light emitting element;
a wavelength conversion pattern positioned on the first encapsulation layer and overlapping the light emitting element;
a color filter positioned on the wavelength conversion pattern and overlapping the wavelength conversion pattern; and
a second encapsulation layer positioned on the color filter,
wherein the first dam member is positioned between the first support member and the display area,
the first support member is positioned between the second dam member and the first dam member,
the second dam member is positioned between the second support member and the first support member,
a first end of an inorganic layer included in the first encapsulation layer is positioned between the first support member and the first dam member, a second end of an inorganic layer included in the second encapsulation layer is positioned between the second support member and the second dam member,
the second support member protrudes upward and is disposed to surround the second dam member,
the first encapsulation layer is directly attached to the first dam member, not directly attached to the second support member, and
the second encapsulation layer is directly attached to the second dam member, not directly attached to the second support member.

2. The display device of claim 1, wherein the first dam member is disposed to surround the display area,
the first support member is disposed to surround the first dam member,
the second dam member is disposed to surround the first support member.

3. The display device of claim 2, wherein the second encapsulation layer includes a lower inorganic layer positioned on the color filter, an organic layer positioned on the lower inorganic layer, and an upper inorganic layer positioned on the organic layer, and
the second end includes an end of the lower inorganic layer and an end of the upper inorganic layer, which are positioned between the second support member and the second dam member.

4. The display device of claim 3, wherein a portion of the organic layer is positioned between the second dam member and the first dam member.

5. The display device of claim 3, further comprising a bank pattern positioned on the first encapsulation layer and surrounding the wavelength conversion pattern,
wherein at least one of the second support member and the second dam member includes a same material as the bank pattern.

6. The display device of claim 3, further comprising an overcoat layer positioned between the color filter and the wavelength conversion pattern,
wherein the second support member includes a same material as the color filter or the overcoat layer.

7. The display device of claim 6, further comprising a bank pattern positioned on the first encapsulation layer and surrounding the wavelength conversion pattern,
wherein the second dam member includes a same material as at least one of the color filter, the overcoat layer, and the bank pattern.

8. The display device of claim 1, wherein the first encapsulation layer includes a lower inorganic layer positioned on the light emitting element, an organic layer positioned on the lower inorganic layer, and an upper inorganic layer positioned on the organic layer,
the lower inorganic layer and the upper inorganic layer cover the first dam member, and
the first end includes an end of the lower inorganic layer, which is positioned between the first dam member and the first support member.

9. The display device of claim 8, wherein the first dam member includes a first dam and a second dam spaced apart from each other, and
a portion of the organic layer is positioned between the first dam and the second dam.

10. The display device of claim 9, wherein the first end further includes an end of the upper inorganic layer, which is positioned between the first dam member and the first support member.

11. The display device of claim 9, wherein an end of the upper inorganic layer is positioned outside the second support member, and the second support member is positioned between the end of the upper inorganic layer and the display area.

12. The display device of claim 1, further comprising a connection pad positioned on the base part and positioned in the non-display area, wherein the second support member is positioned between the connection pad and the display area, and the connection pad does not overlap the second encapsulation layer in a plan view.

13. The display device of claim 12, further comprising:

a first capping layer positioned between the first encapsulation layer and the wavelength conversion pattern; and a second capping layer positioned between the wavelength conversion pattern and the color filter, wherein the first capping layer and the second capping layer are in contact with each other in the non-display area, and the first capping layer and the second capping layer overlap the connection pad.

14. The display device of claim 12, further comprising a capping layer positioned between the wavelength conversion pattern and the color filter, wherein the first encapsulation layer includes an inorganic layer, the inorganic layer and the capping layer are in contact with each other in the non-display area, and the inorganic layer and the capping layer overlap the connection pad.

15. An electronic device comprising:

a base part in which a display area and a non-display area around the display area are defined;

a dam member and a support member positioned on the base part and positioned in the non-display area;

a connection pad positioned on the base part and positioned in the non-display area;

a light emitting element positioned on the base part and positioned in the display area;

an inorganic layer positioned on the light emitting element;

a wavelength conversion pattern positioned on the inorganic layer and overlapping the light emitting element;

a capping layer positioned on the wavelength conversion pattern;

a color filter positioned on the capping layer and overlapping the wavelength conversion pattern; and an encapsulation layer positioned on the color filter, wherein the dam member is positioned between the support member and the display area, the support member is positioned between the connection pad and the dam member, the inorganic layer and the capping layer are in contact with each other in the non-display area, the inorganic layer and the capping layer overlap the connection pad, the support member protrudes upward and is disposed to surround the dam member, and the encapsulation layer is directly attached to the dam member, not directly attached to the support member.

16. The electronic device of claim 15, wherein an opening exposing the connection pad is defined in the inorganic layer and the capping layer.

17. The electronic device of claim 16, further comprising a bank pattern positioned between the inorganic layer and the capping layer and in contact with the wavelength conversion pattern, wherein the dam member and the bank pattern include a same material.

18. The electronic device of claim 17, further comprising an overcoat layer positioned between the color filter and the wavelength conversion pattern, wherein the support member includes a same material as at least one of the bank pattern, the color filter, and the overcoat layer.

19. The display electronic of claim 18, wherein a refractive index of the overcoat layer is lower than a refractive index of the wavelength conversion pattern.

20. The electronic device of claim 15, wherein the encapsulation layer includes a lower inorganic layer, an upper inorganic layer, and an organic layer positioned between the lower inorganic layer and the upper inorganic layer, wherein the dam member overlaps the lower inorganic layer and the upper inorganic layer, and the connection pad and the support member do not overlap the lower inorganic layer and the upper inorganic layer in a plan view.

* * * * *